United States Patent
Minotani et al.

(10) Patent No.: US 11,984,903 B2
(45) Date of Patent: May 14, 2024

(54) VARIABLE REFERENCE VOLTAGE SOURCE

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 440 days.

(21) Appl. No.: 17/294,652

(22) PCT Filed: Nov. 5, 2019

(86) PCT No.: PCT/JP2019/043288
§ 371 (c)(1),
(2) Date: May 17, 2021

(87) PCT Pub. No.: WO2020/105417
PCT Pub. Date: May 28, 2020

(65) Prior Publication Data
US 2022/0014094 A1    Jan. 13, 2022

(30) Foreign Application Priority Data
Nov. 19, 2018 (JP) .................. 2018-216630

(51) Int. Cl.
*H03M 1/10* (2006.01)
*H03F 3/45* (2006.01)

(52) U.S. Cl.
CPC ...... *H03M 1/1009* (2013.01); *H03F 3/45475* (2013.01)

(58) Field of Classification Search
CPC .... H03M 1/1009; H03M 1/66; H03M 1/1014; H03M 1/1023; H03M 1/46; H03M 1/10;
(Continued)

(56) References Cited

U.S. PATENT DOCUMENTS 5,805,091 A * 9/1998 Sherry ................ H03M 1/1076
340/662
8,390,493 B1 * 3/2013 Raghavan ............... H03M 1/00
341/142

(Continued)

OTHER PUBLICATIONS

EDN Japan, *Trimming to Improve DAC Accuracy (1/3)*, Literature, Nov. 10, 2016, http://ednjapn.com/edn/articles/1611/08/news012.html, pp. 1-11.

(Continued)

*Primary Examiner* — Linh V Nguyen
(74) *Attorney, Agent, or Firm* — Workman Nydegger

(57) ABSTRACT

To provide a variable reference voltage source for which a measuring instrument is unnecessary for calibration on the outside. A variable reference voltage source that generates a variable reference voltage corresponding to setting data set from outside includes a control unit including a calibration control unit that controls operation for calibrating an offset and a predetermined unit voltage inside the variable reference voltage source and an output control unit that controls operation for outputting the variable reference voltage, a reference voltage unit that outputs a reference voltage Vref, and an integrated-voltage generating unit that repeats, when the calibration control unit controls the operation, an integrating operation until an integrated voltage obtained by integrating the predetermined unit voltage becomes equal to the reference voltage Vref and outputs, when the output control unit controls the operation, the variable reference voltage corresponding to the setting data.

6 Claims, 10 Drawing Sheets

(58) Field of Classification Search
CPC .... H03M 1/1019; H03M 1/1033; H03M 1/12; H03M 1/365; H03M 1/38; H03M 1/468; H03M 1/70; H03M 1/06; H03M 1/1061; H03M 1/1245; H03M 1/362; H03M 1/785; H03M 1/808; H03M 3/38; H03M 3/382
USPC .................................. 341/118–120, 155, 144
See application file for complete search history.

(56) References Cited

U.S. PATENT DOCUMENTS

| | | | | |
|---|---|---|---|---|
| 8,400,337 | B1* | 3/2013 | Xu | H03F 3/45766 |
| | | | | 327/307 |
| 8,766,833 | B1* | 7/2014 | Bogner | H03M 1/1014 |
| | | | | 341/120 |
| 9,711,189 | B1* | 7/2017 | Wang | G11C 29/028 |
| 9,729,163 | B1* | 8/2017 | Song | H03M 1/12 |
| 9,774,811 | B1* | 9/2017 | Ebihara | H03K 4/502 |
| 9,977,442 | B1* | 5/2018 | Tan | G05F 1/468 |
| 2006/0190746 | A1* | 8/2006 | Boerstler | G06F 1/26 |
| | | | | 713/300 |
| 2022/0206520 | A1* | 6/2022 | Jiang | G05F 1/56 |
| 2022/0270664 | A1* | 8/2022 | Jeter | G11C 29/021 |

OTHER PUBLICATIONS

*Back Trick! Realize a Pseudo D/A Converter Using PWM*, Literature, May 23, 2018 (reading day), https://service.macnica.co.jp/library/107577, pp. 1-2.

* cited by examiner

Fig. 2(a) EQUIVALENT CIRCUIT AT CHARGE ACCUMULATION TIME
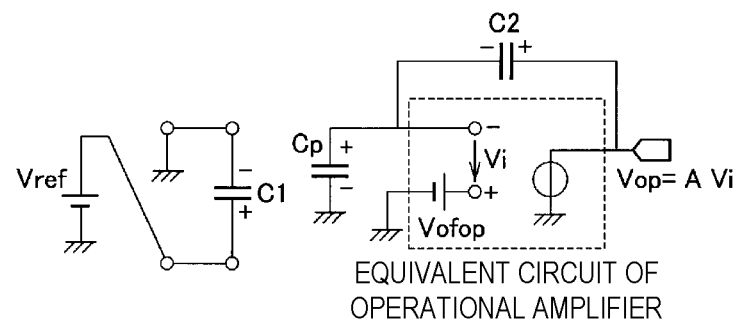
Fig. 2(b) EQUIVALENT CIRCUIT AT CHARGE TRANSFER TIME
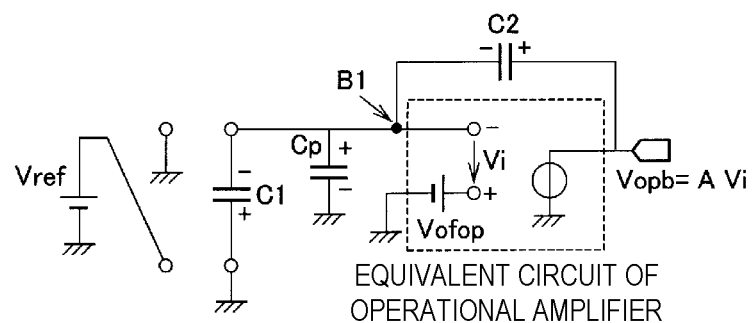

VARIABLE REFERENCE VOLTAGE SOURCE

TECHNICAL FIELD

The present invention relates to a variable reference voltage source that does not require a measuring instrument for calibration.

BACKGROUND ART

A voltage source for calibration that outputs a known voltage is used for, for example, a sensor circuit that detects something. A correspondence relation between a digital value and a sensing target signal changes because of changes with time of an offset and a gain of an amplifier, an offset, linearity, and the like of an AD converter of the sensor circuit. In order to suppress the change without increasing maintenance operation, calibration of the amplifier and the AD converter is necessary. In the calibration of the offset and the gain of the amplifier and the offset of the AD converter, the known voltage is input to the amplifier and the calibration is performed according to a correlation between the known voltage and outputs of the amplifier and the AD converter.

Examples of a variable signal source that outputs a known voltage include an R-2R ladder circuit, a resistance string circuit (Non-Patent Literature 1), and a PWM circuit (Non-Patent Literature 2). The R-2R ladder circuit can configure a high-resolution and high-accuracy variable signal source with a relatively small number of resistance elements. The resistance string circuit has low power consumption and monotonicity. The PWM circuit has an advantage that performance is stable because the PWM circuit is configured by only a digital circuit.

CITATION LIST

Non-Patent Literature

Non-Patent Literature 1: Trimming for improving accuracy of a DAC (1/3) EDN Japan [searched on May 22, 2018], Internet (URL: http://ednjapn.com/edn/articles/1611/08/news012.html)

Non-Patent Literature 2: Secret trick! Realize a pseudo D/A converter using PWM [searched on Nov. 13, 2018], Internet (URL: https://service.macnica.co.jp/library/107577)

SUMMARY OF THE INVENTION

Technical Problem

However, in order to improve the accuracy of these signal sources, it is necessary to prepare, on the outside of the signal sources, a measuring instrument serving as a reference and adjusting the signal sources. The R-2R circuit and the resistance string circuit need to finely adjust a value of the resistance element using the measuring instrument on the outside. In the PWM circuit, high accuracy is requested for frequency accuracy of a high-order low-pass filter for removing ripple noise appearing in an output. Therefore, adjustment using the measuring instrument on the outside is necessary.

In order to use the conventional signal source as a reference in this way, there is a problem in that work for preparing the measuring instrument on the outside of the reference signal source and adjusting the reference signal source is essential.

The present invention has been devised in view of this problem and an object of the present invention is to provide a variable reference voltage source for which a measuring instrument for calibration is unnecessary.

Means for Solving the Problem

A variable reference voltage source according to an aspect of the present invention is a variable reference voltage source that generates a variable reference voltage corresponding to setting data set from outside, the variable reference voltage source including: a control unit including a calibration control unit that controls operation for calibrating an offset and a predetermined unit voltage inside the variable reference voltage source and an output control unit that controls operation for outputting the variable reference voltage; a reference voltage unit that outputs a reference voltage; and an integrated-voltage generating unit that repeats, when the calibration control unit controls the operation, an integrating operation until an integrated voltage obtained by integrating the predetermined unit voltage becomes equal to the reference voltage and outputs, when the output control unit controls the operation, the variable reference voltage corresponding to the setting data.

Effects of the Invention

According to the present invention, it is possible to provide a variable reference voltage source for which a measuring instrument for calibration on the outside is unnecessary.

BRIEF DESCRIPTION OF DRAWINGS

FIGS. 2(a) and 2(b) are diagrams showing an equivalent circuit of an integrating unit shown in FIG. 1.

DESCRIPTION OF EMBODIMENTS

Figure 1:
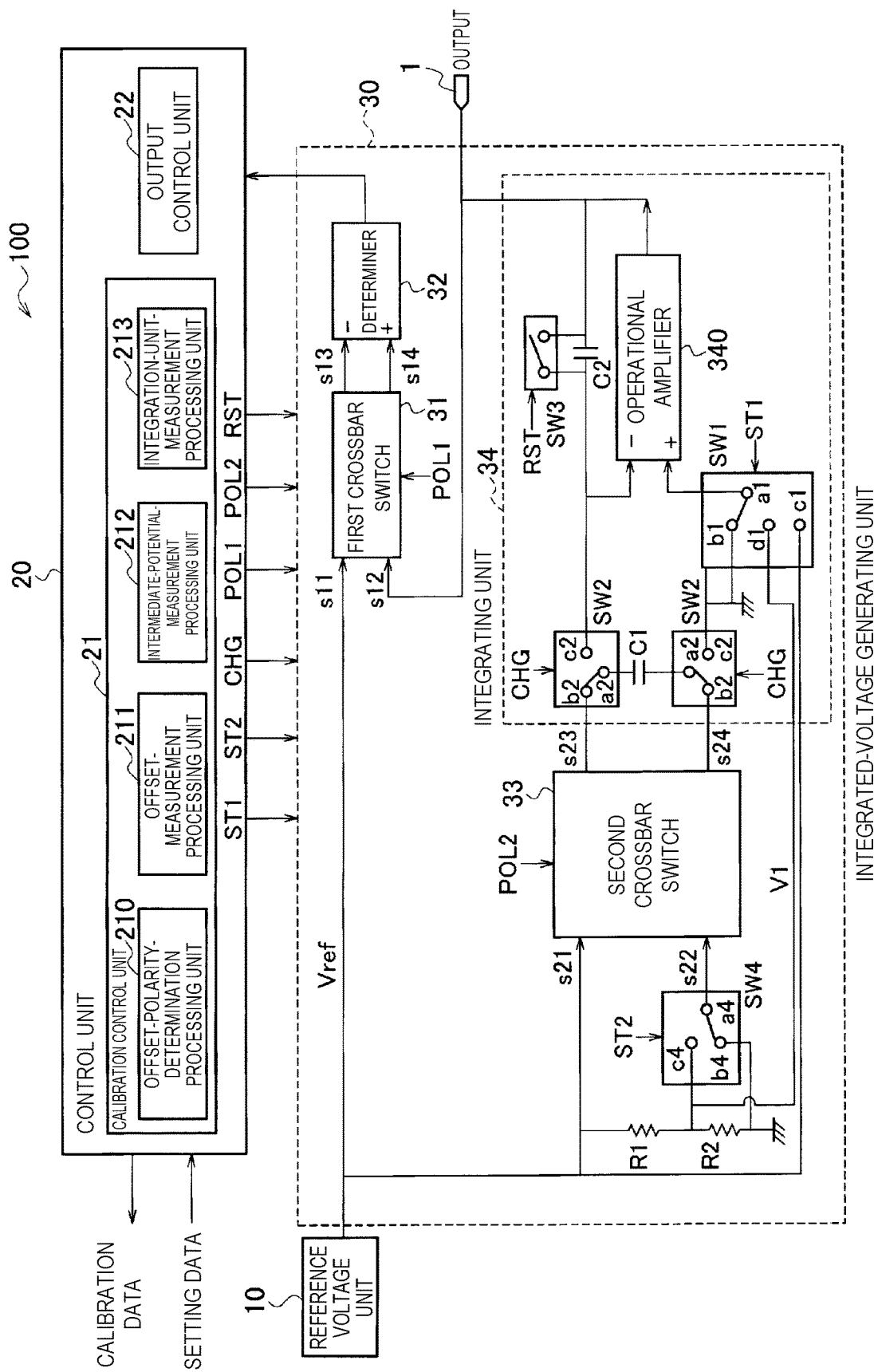
FIG. 1 is a functional block diagram showing a configuration example of a variable reference voltage source according to a first embodiment of the present invention.

Embodiments of the present invention are explained below with reference to the drawings. The same components in a plurality of drawings are denoted by the same reference numerals and signs. Explanation of the components is not repeated.

First Embodiment

FIG. 1 is a functional block diagram showing a functional configuration example of a variable reference voltage source according to a first embodiment of the present invention. A variable reference voltage source 100 shown in FIG. 1 generates a variable reference voltage corresponding to setting data set from the outside and outputs the variable reference voltage to an output 1. The variable reference voltage source 100 includes a reference voltage unit 10, a control unit 20, and an integrated-voltage generating unit 30. The reference voltage unit 10 outputs a reference voltage Vref.

An offset and a predetermined unit voltage are included in the integrated-voltage generating unit 30 on the inside of the variable reference voltage source 100 and change with time because of a drift. Therefore, in order to keep accuracy, it is necessary to calibrate the offset and the unit voltage as explained below. The control unit 20 includes a calibration control unit 21 that controls operation for acquiring calibration data including calibration value of the offset and the predetermined unit voltage of the integrated-voltage generating unit 30 and an output control unit 22 that controls operation for generating a variable reference voltage corresponding to setting data set from the outside based on the calibration data.

The integrated-voltage generating unit 30 repeats, when the calibration control unit 210 controls the operation, an integrating operation until an integrated voltage obtained by integrating the predetermined unit voltage becomes equal to the reference voltage Vref and outputs, when the output control unit controls the operation, a variable reference voltage corresponding to the setting data.

The integrated-voltage generating unit 30 includes a fourth switch (hereinafter, SW4) that changes the magnitude of the unit voltage to the same voltage as the reference voltage Vref or intermediate potential smaller than the reference voltage Vref, a second crossbar switch 33 that determines the polarity of the unit voltage, an integrating unit 34 that generates an integrated voltage obtained by integrating the unit voltage, a determiner 32 that determines which of the reference voltage Vref and the integrated voltage is larger, and a first crossbar switch 31 that switches connection between when the reference voltage Vref is input to one input of the determiner 32 and the integrated voltage is input to the other input of the determiner 32 and when the integrated voltage is input to one input of the determiner 32 and the reference voltage Vref is input to the other input of the determiner 32.

The integrating unit 34 includes an operational amplifier 340, a first capacitor (hereinafter, C1) charged by the unit voltage, a second capacitor (hereinafter, C2) that holds the integrated voltage obtained by integrating the unit voltage, a first switch (hereinafter SW1) that switches a voltage of a positive input of the operational amplifier 340, C2 that connects the other terminal of C1 to ground potential when one terminal of C1 is connected to a negative input of the operational amplifier 340, and a third switch (hereinafter, SW3) that short-circuits both ends of C2.

An integrating operation for integrating the unit voltage is explained. Integration is carried out by repetition of operations of charge accumulation and charge transfer. First, a charge and a voltage integrated in one integrating operation are calculated. Portions surrounded by wavy lines in FIG. 2 are equivalent circuits of the operational amplifier 340. In the equivalent circuits, parasitic capacitance Cp connected to the negative input of the operational amplifier 340 is taken into account. It is conceived that Cp is configured by parasitic capacitance between an electrode connected to the negative input of the operational amplifier 340 of the capacitor C2 and the ground, parasitic capacitance between the negative input of the operational amplifier 340 including a wire and the ground, and the like. Parasitic capacitances are also present in the positive input of the operational amplifier 340, the input of the determiner 32, and the first crossbar switch 31. However, since parasitic capacitance affecting an equation of charge conservation of the integration operation is Cp, only Cp is taken into account in this explanation.

During the integrating operation, SW3 in FIG. 1 is opened. A bias voltage of the integrating unit 34 is set to the ground, V1, or Vref by SW1 in advance and the polarity of an integration unit voltage is set by the second crossbar switch 33. In the following explanation, a case is explained in which the bias voltage of the integrating unit 34 is set to the ground, and s21 and s24, and s22 and s23 of the second crossbar switch 33 are connected.

During the charge accumulation, a2 and b2 of SW2 in FIG. 1 are connected. During the charge transfer, a2 and c2 of SW2 are connected. Equivalent circuits of the integrating unit 34 during the charge accumulation and the charge transfer are shown in FIG. 2 based on this connection. In the equivalent circuits in FIG. 2, it is assumed that signs of charges accumulated in C1 are minus (−) on the ground side and plus (+) on the opposite side. In C2, it is assumed that a side connected to an output of the operational amplifier 340 is plus (+) and a side connected to an input of the operational amplifier 340 is minus (−). In Cp, it is assumed that a negative input side of the operational amplifier 340 is plus (+). For example, in C2, if the output of the operational amplifier 340 is positive, a sign of charges accumulated in C2 is positive. If the output of the operational amplifier 340 is negative, a sign of charges accumulated in C2 is negative.

The following equation holds during the charge accumulation.

Formula 1

$$Q1,0 = C1 \, Vref \tag{1}$$

$$Q2,0 = C2(Vop,0 - Vofop + Vi) \tag{2}$$

$$Qp,0 = Cp(-Vi + Vofop) \tag{3}$$

Here, Q1,0, Q2,0, and Qp,0 are respectively charges accumulated in the capacitors C1, C2, and Cp. Vofop represents an offset voltage present in the input of the operational amplifier 340. Vop,0 is an output voltage of the operational amplifier 340 and an initial value before the integrating operation is carried out. Vi is a potential difference between positive and negative inputs on the inside of the operational amplifier 340 and has a relation of Vop,0=A Vi with the output voltage Vop,0 (A represents a gain of the operational amplifier 340). Expressions (2) and (3) are represented by the following expressions according to the relational expression between Vop,0=A Vi.

Formula 2

$$Q2,0 = C2\left(Vop,0 - Vofop + \frac{Vop,0}{A}\right) \quad (4)$$

$$Qp,0 = Cp\left(-\frac{Vop,0}{A} + Vofop\right) \quad (5)$$

During the charge transfer, when a transient phenomenon caused by the resistance of SW2 and the capacitors C1, C2, and Cp sufficiently converges, charges Q1,1, Q2,1, and Qp,1 accumulated in the capacitors C1, C2, and Cp are represented by the following expressions.

Formula 3

$$Q1,1 = -C1\left(Vofop - \frac{Vop,1}{A}\right) \quad (6)$$

$$Q2,1 = C2\left(Vop,1 - Vofop + \frac{Vop,1}{A}\right) \quad (7)$$

$$Qp,1 = Cp\left(-\frac{Vop,1}{A} + Vofop\right) \quad (8)$$

Charges accumulated in the capacitors C1, C2, and Cp immediately after SW2 is connected as during the charge transfer are charge amounts represented by Expression (1), Expression (4), and Expression (5). Charges accumulated in C1, C2, and Cp are charge amounts represented by Expression (6), Expression (7), and Expression (8) when time sufficiently elapses after SW2 is connected as during the charge transfer. At a nodal point B1 of the circuit in FIG. 2(b), since a path through which charges leak is absent in a power supply and the ground, the charge conservation holds and the following expression holds.

Formula 4

$$Q1,0+Qp,0-Q2,0=Q1,1+Qp,1-Q2,1 \quad (9)$$

When Expression (1), Expression (4), Expression (5), Expression (6), Expression (7), and Expression (8) are substituted in Expression (9), a relational expression between Vop,0 and Vop,1 can be derived as follows.

Formula 5

$$-C1Vref + Cp\left(-\frac{Vop,0}{A} + Vofop\right) - C2\left(Vop,0 - Vofop + \frac{Vop,0}{A}\right) = \quad (10)$$

$$C1\left(Vofop - \frac{Vop,1}{A}\right) + Cp\left(-\frac{Vop,1}{A} + Vofop\right) -$$

$$C2\left(Vop,1 - Vofop + \frac{Vop,1}{A}\right)$$

$$\left(\frac{C1}{A} + \frac{Cp}{A} + \frac{A+1}{A}C2\right)Vop,1 = C1(Vref + Vofop) + \left(\frac{Cp}{A} + C2\frac{A+1}{A}\right)Vop,0$$

$$Vop,1 = \frac{AC1}{C1 + Cp + (A+1)C2}(Vref + Vofop) + \frac{Cp + (A+1)C2}{C1 + Cp + (A+1)C2}Vop,0$$

The relational expression between Vop,0 and Vop,1 is defined by a form of the following geometrical series.

Formula 6

$$Vop,1+B0=B1(Vop,0+B0)$$

$$Vop,1=B1Vop,0+(B1-1)B0 \quad (11)$$

B1 is represented by the following expression according to comparison of Expression (10) and Expression (11).

Formula 7

$$B1 = \frac{Cp + (A+1)C2}{C1 + Cp + (A+1)C2} = 1 - \frac{C1}{C1 + Cp + (A+1)C2} = 1 - \eta \quad (12)$$

$$\eta = \frac{C1}{C1 + Cp + (A+1)C2} \quad (13)$$

(B1−1)B0=−ηB0 is represented by the following expression.

Formula 8

$$-\eta B0 = \frac{AC1}{C1 + Cp + (A+1)C2}(Vref + Vofop) \quad (14)$$

An output Vop,k of the operational amplifier 340 at the time when the operations of the charge accumulation and the charge transfer are repeated k times is represented by the following expression.

Formula 9

$$Vop,k+B0=B1^k(Vop,0+B0)$$

$$Vop,k=B1^k(Vop,0+B0)-B0=(1-\eta)^k(Vop,0+B0)-B0 \quad (15)$$

If the capacitors C1 and C2 and the gain A of the operational amplifier 340 are designed such that C1<<(A+1)C2 is obtained, η<<1 is obtained. In this case, if Expression (15) is expanded to a first-order term of η by the Maclaurin's expansion, the following expression is obtained.

Formula 10

$$Vop,k=(1-k\eta)(Vop,0+B0)-B0=Vop,0-k\eta(Vop,0+B0) \quad (16)$$

The electric charges accumulated in C2 are reduced to 0 by short-circuiting and opening SW3 at least once according to an RST signal in FIG. 1 before the integrating operation is executed for the first time. Therefore, the initial value Vop,0 is represented by the following expression according to Expression (4).

Formula 11

$$Vop,0 = \frac{A}{A+1}Vofop \quad (17)$$

Expression (17) is substituted in Expression (16) to obtain the following expression.

Formula 12

$$Vop, k = Vop, 0 + k(-\eta Vop, 0 - \eta B0) \quad (18)$$

$$Vop, k = \frac{A}{A+1} Vofop + k\left\{-\frac{C1}{C1 + Cp + (A+1)C2} \frac{A}{A+1} Vofop + \frac{AC1}{C1 + Cp(A+1)C2}(Vref + Vofop)\right\}$$

$$Vop, k = k\frac{AC1}{C1 + Cp + (A+1)C2}\left(Vref + \frac{A}{A+1} Vofop\right) + \frac{A}{A+1} Vofop$$

It is seen from Expression (18) that the output of the operational amplifier 340 is proportional to the number of times of integration k but an integration unit voltage, which is a proportional coefficient of k, is affected by the offset voltage of the operational amplifier 340, which is an unknown parameter. C1 and C2 also deviate from design values because of manufacturing variation, temperature, and the like. Therefore, the integration unit voltage is affected by this as well. It is difficult to accurately predict the integration unit voltage from the design value.

Since it is difficult to accurately predict the integration unit voltage from the design value as explained above, it is necessary to calibrate the offset and the integration unit voltage of the operational amplifier 340 before a signal for calibration is output. In the variable reference voltage source 100, this calibration is executed in a calibration state. In the calibration, a maximum number of times of integration with which the output of the operational amplifier 340 is smaller than Vref is calculated using the determiner 32. At this time, since it is likely that an offset voltage is present in the determiner 32 as well, it is also necessary to measure an offset voltage of the determiner 32.

In the calibration state, an offset-polarity-determination processing unit 210, an offset-measurement processing unit 211, an intermediate-potential-measurement processing unit 212, and an integration-unit-measurement processing unit 213 execute processing in this order to calibrate the offset voltage and the integration unit voltage of the operational amplifier 340. In the following expression, the processing executed by the processing units is referred to as, for example, offset polarity determination processing.

In the offset polarity determination processing, SW3 is set in a connected state, a2 and b2 of SW2 are connected, and a1 and c1 of SW1 are connected according to an operation control signal output from the control unit 21. Further, s11 and s13 of the first crossbar switch 31 are connected and s12 and s14 of the first crossbar switch 31 are connected. The output of the operational amplifier 340 is connected to a positive input of the determiner 32. Vref is connected to the negative input of the determiner 32.

If the operational amplifier 340 is the gain A, the output of the operational amplifier 340 is {A/(A+1)}(Vref+Vofop) in this state. If the offset voltage of the determiner 32 is represented as Vofc, a positive input voltage is equivalently represented as {A/(A+1)}(Vref+Vofop)+Vofc. Accordingly, when {A/(A+1)}(Vref+Vofop)+Vofc is small compared with Vref, which is a negative input voltage, a determination signal is not output from the determiner 32. When the control unit 20 confirms that the determination signal is not output, s21 and s24 of the second crossbar switch 33 are connected and s22 and s23 of the second crossbar switch 33 are connected according to an operation control signal output from the control unit 20.

In the offset measurement processing, after the connection of SW3 is opened and a4 and c4 of SW4 are connected, a charge transfer step and a charge accumulation/comparison step are repeatedly carried out until the output of the operational amplifier 340 and the reference voltage Vref become equal and the number of times of integration equivalent to a sum of offset voltages of the operational amplifier 340 and the determiner 32 is calculated. The charge transfer step is a step of performing integration according to transfer of charges to C2. The charge accumulation/comparison step is a step of performing accumulation of charges in C1 and comparison in the determiner 32 of the output of the operational amplifier 340 and the reference voltage Vref.

According to an operation control signal of the control unit 20, in the charge transfer step of the offset measurement processing, a2 and c2 of SW2 are connected in a state in which the positive input of the operational amplifier 340, to which a1 and b1 of SW1 are connected, is set to the ground. In the charge accumulation/comparison step of the offset measurement processing, after a2 and b2 of SW2 are connected in order to accumulate charges in C1, a1 and c1 of SW1 are connected, the positive input of the operational amplifier 340 is set to the reference voltage Vref, and an output of the determiner 32 is confirmed. Thereafter, a1 and b1 of SW1 are connected.

When an output of the operational amplifier 340 before the first charge transfer step is represented as Vop,0, the charges Q2,0 and Qp,0 accumulated in C2 and Cp are represented by Expression (4) and Expression (5). Charges accumulated in C1 are represented by the following expressions.

Formula 13

$$Q1, 0 = C1(Vref - V1) \quad (19)$$

$$V1 = \frac{R2}{R1 + R2} Vref \quad (20)$$

When an output of the operational amplifier 340 after the charge transfer step is represented as Vopa,1, charges Q1a,1, Q2a,1, and Qpa,1 accumulated in C1, C2, and Cp are expressions obtained by replacing Vop,1, Q1,1, Q2,1, and Qp,1 respectively with Vopa,1, Q1a,1, Q2a,1 and Qpa,1 in Expression (6), Expression (7), and Expression (8).

Charges accumulated in C1, C2, and Cp connected to the negative input of the operational amplifier 340 before and after the charge transfer step are saved in the same manner as the explanation of Expression (9). Since Expression (1) and Expression (19) are different from the expansion of Expression (10), a relational expression between Vopa,1 and Vop,0 is as follows.

Formula 14

$$Vopa, 1 = \frac{AC1}{C1 + Cp + (A+1)C2}(Vref + Vofop - V1) + \frac{Cp + (A+1)C2}{C1 + Cp + (A+1)C2} Vop, 0 \quad (21)$$

When an output of the operational amplifier 340 at the time when a1 and c1 of SW1 are connected in the charge accumulation/comparison step is represented as Vopb,1, since Vref is the reference of the operational amplifier 340, the charges Q2b,1 and Qpb,1 accumulated in C2 and Cp are represented by the following expressions.

Formula 15

$$Q2b, 1 = C2\left(Vopb, 1 - Vref - Vofop + \frac{Vopb, 1}{A}\right) \quad (22)$$

$$Qpb, 1 = Cp\left(-\frac{Vopb, 1}{A} + Vref + Vofop\right) \quad (23)$$

Since charges of C2 and Cp2 connected to the negative input of the operational amplifier 340 are saved before and after the charge accumulation/comparison step are saved, the following expression holds.

Formula 16

$$Qpa, 1 - Q2a, 1 = Qpb, 1 - Q2b, 1 \quad (24)$$

When Expression (22) and Expression (23) and expressions obtained by replacing Vop,1, Q2,1, and Qp,1 of Expression (7) and Expression (8) with Vopa,1, Q2a,1, and Qpa,1 are substituted in Expression (24), the following expression is obtained.

Formula 17

$$Cp\left(-\frac{Vopa, 1}{A} + Vofop\right) - C2\left(Vopa, 1 - Vofop + \frac{Vopa, 1}{A}\right) = \quad (25)$$

$$Cp\left(-\frac{Vopb, 1}{A} + Vref + Vofop\right) -$$

$$C2\left(Vopb, 1 - Vref - Vofop + \frac{Vopd, 1}{A}\right)$$

$$\left(\frac{Cp}{A} + \frac{A+1}{A}C2\right)Vopb, 1 = \left(\frac{Cp}{A} + \frac{A+1}{A}C2\right)Vopa,$$

$$1 + (Cp + C2)Vref$$

$$Vopb, 1 = Vopa, 1 + \frac{A(Cp + C2)}{Cp + (A+1)C2}Vref$$

When an output of the operational amplifier 340 at the time when a1 and b1 of SW1 are connected before the next second charge transfer step is represented as Vop,k, since the ground is the reference of the operational amplifier 340, the charges Q2,1 and Qp,1 accumulated in C2 and Cp are represented by the following expressions.

Formula 18

$$Q2, 1 = C2\left(Vop, 1 - Vofop + \frac{Vop, 1}{A}\right) \quad (26)$$

$$Qp, 1 = Cp\left(-\frac{Vop, 1}{A} + Vofop\right) \quad (27)$$

Since charges of C2 connected to the negative input of the operational amplifier 340 are saved before and after the connection of SW1 is changed, the following expression holds.

Formula 19

$$Qpb, 1 - Q2b, 1 = Qp, 1 - Q2, 1 \quad (28)$$

When Expression (20), Expression (21), Expression (24), and Expression (25) are substituted in Expression (26), the following expression is obtained.

Formula 20

$$Cp\left(-\frac{Vopb, 1}{A} + Vref + Vofop\right) - \quad (29)$$

$$C2\left(Vopb, 1 - Vref - Vofop + \frac{Vopb, 1}{A}\right) =$$

$$Cp\left(-\frac{Vop, 1}{A} + Vofop\right) - C2\left(Vop, 1 - Vofop + \frac{Vop, 1}{A}\right)$$

$$\left(\frac{Cp}{A} + \frac{A+1}{A}C2\right)Vop, 1 = \left(\frac{Cp}{A} + \frac{A+1}{A}C2\right)Vopb,$$

$$1 - (Cp + C2)Vref$$

$$Vop, 1 = Vopb, 1 + \frac{A(Cp + C2)}{Cp + (A+1)C2}Vref =$$

$$\frac{AC1}{C1 + Cp + (A+1)C2}(Vref + Vofop - V1) +$$

$$\frac{Cp + (A+1)C2}{C1 + Cp + (A+1)C2}Vop, 0$$

Expression (29) is different in a part where (Vref+Vofop) of the first term of Expression (10) is changed to (Vref+Vofop−V1). Therefore, the output Vop,k of the operational amplifier 340 at the time when the charge transfer step and the charge accumulation/comparison step are repeated k times is represented by the following expression.

Formula 21

$$Vop, \quad (30)$$

$$k = k\frac{AC1}{C1 + Cp + (A+1)C2}\left(Vref + \frac{A}{A+1}Vofop - V1\right) + \frac{A}{A+1}Vofop$$

An output Vopb,k of the operational amplifier 340 in the charge accumulation/comparison step is represented by the following expression using Expression (25) and Expression (18).

Formula 22

$$Vopb, k = Vopa, k + \frac{A(Cp + C2)}{Cp + (A+1)C2}Vref = Vop, \quad (31)$$

$$k + \frac{A(Cp + C2)}{Cp + (A+1)C2}Vref =$$

$$k\frac{AC1}{C1 + Cp + (A+1)C2}\left(Vref + \frac{A}{A+1}Vofop - V1\right) +$$

$$\frac{A}{A+1}Vofop + \frac{A(Cp + C2)}{Cp + (A+1)C2}Vref$$

When a voltage Vopb,k+Vofc obtained by adding an offset voltage Vofc of the determiner 32 to a positive input voltage Vopb,k of the determiner in the charge accumulation/comparison step is larger than a negative input voltage Vref, the determiner outputs a determination signal. The determination signal is detected by the control unit 20.

Figure 3:
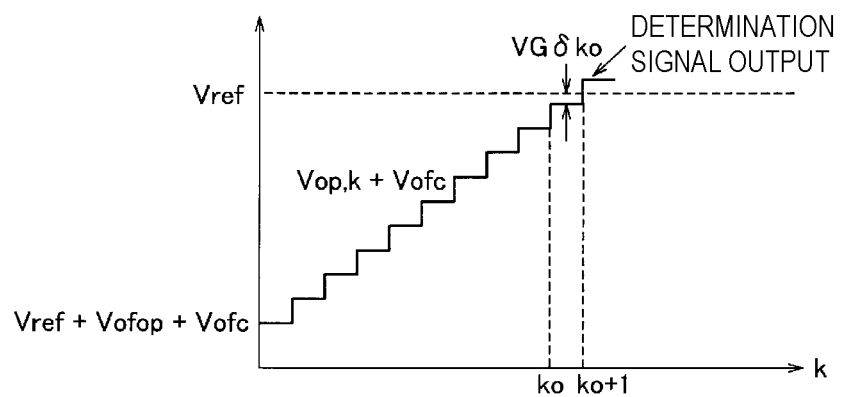
FIG. 3 is a schematic diagram schematically showing the operation of a determiner shown in FIG. 1.

A relation among the voltage Vopb,k+Vofc obtained by adding the offset voltage Vofc of the determiner to the positive input voltage Vopb,k of the determiner 32, the negative input voltage Vref, and the number of times of integration k is shown in FIG. 3. Vopb,k+Vofc increases and approaches Vref as the number of times of integration increases. When the number of times the output of the determination signal is detected for the first time is represented as ko+1, ko is defined as the number of times of offset integration.

The following equation holds about the number of times of offset integration ko.

Formula 23

$$Vref = (VG - VG2)(ko + \delta ko) + Vofpb + \Gamma Vref + Vofc \quad (32)$$

$$VG = \frac{AC1}{C1 + Cp + (A+1)C2}\left(Vref + \frac{A}{A+1}Vofop\right) \quad (33)$$

$$VG2 = \frac{AC1}{C1 + Cp + (A+1)C2}V1 \quad (34)$$

$$Vofopb = \frac{A}{A+1}Vofop \quad (35)$$

$$\Gamma = \frac{A(Cp + C2)}{Cp + (A+1)C2} \quad (36)$$

In Expression (32), the left side is a negative input voltage of the determiner 32 and the right side is a voltage obtained by adding the offset voltage of the determiner 32 to a positive input voltage. δko is a real number equal to or larger than 0 and smaller than 1. VGδko represents a difference between Vref and an output of the operational amplifier 340 at the time of the number of times of integrations ko and the offset voltage of the determiner 32.

In intermediate potential measurement processing, the connection of SW3 is once short-circuited and thereafter opened to reset the charges accumulated in C2, the charge transfer step and the charge accumulation/comparison step are repeatedly carried out in a state in which a4 and c4 of SW4 are connected, and the numbers of times of integration in which the determination signal is output when the reference of the integrating unit 34 is set to V1 and when the reference of the integrating unit 34 is set to the ground are calculated.

Since the charge transfer step of the intermediate potential measurement processing is the same operation as the charge transfer step of the offset measurement processing, detailed explanation of the charge transfer step is omitted. The output voltage Vopa,1 of the operational amplifier 340 after the first charge transfer step of the intermediate potential measurement processing is the same as Expression (21).

In the charge accumulation/comparison step of the intermediate potential measurement processing, after a2 and b2 of SW2 are connected in order to accumulate charges in C1, a1 and d1 of SW1 are connected to set the bias voltage of the integrating unit 34 to V1 and execute comparison in the determiner 32 and a1 and b1 of SW1 are connected to set the bias voltage of the integrating unit 34 to the ground and execute comparison is the determiner 32. When an output of the operational amplifier 340 at the time when the bias voltage of the integrating unit 34 is set to V1 is represented as Vopb,1, the charges Q2b,1 and Cpb,1 accumulated in C2 and Cp are represented by the following expression.

Formula 24

$$Q2b, 1 = C2\left(Vopb, 1 - V1 - Vofop + \frac{Vopb, 1}{A}\right) \quad (37)$$

$$Qpb, 1 = Cp\left(-\frac{Vopb, 1}{A} + V1 + Vofop\right) \quad (38)$$

The following relational expression between Vopa,1 and Vopb,1 is obtained using a condition under which charges of C2 and Cp connected to the negative input of the operational amplifier 340 are saved.

Formula 25

$$Cp\left(-\frac{Vopa, 1}{A} + Vofop\right) - C2\left(Vopa, 1 - Vofop + \frac{Vopa, 1}{A}\right) = \quad (39)$$

$$Cp\left(-\frac{Vopb, 1}{A} + V1 + Vofop\right) -$$

$$C2\left(Vopb, 1 - V1 - Vofop + \frac{Vopb, 1}{A}\right)$$

$$\left(\frac{Cp}{A} + \frac{A+1}{A}C2\right)Vopb, 1 = \left(\frac{Cp}{A} + \frac{A+1}{A}C2\right)Vopa, 1 + (Cp + C2)V1$$

$$Vopb, 1 = Vopa, 1 + \frac{A(Cp + C2)}{Cp + (A+1)C2}V1$$

When an output of the operational amplifier 340 at the time when the bias voltage of the integrating unit 34 is set to the ground is represented as Vop,1, the charges Q2,1 and Qp,1 accumulated in C2 and Cp are represented by the following expressions.

Formula 26

$$Q2, 1 = C2\left(Vop, 1 - Vofop + \frac{Vop, 1}{A}\right) \quad (40)$$

$$Qp, 1 = Cp\left(-\frac{Vop, 1}{A} + Vofop\right) \quad (41)$$

The following relational expression between Vopb,1 and Vop,1 is obtained using the condition under which charges of C2 and Cp connected to the negative input of the operational amplifier 340 are saved.

Formula 27

$$Cp\left(-\frac{Vopb, 1}{A} + V1 + Vofop\right) - \quad (42)$$

$$C2\left(Vopb, 1 - V1 - Vofop + \frac{Vopb, 1}{A}\right) =$$

$$Cp\left(-\frac{Vop, 1}{A} + Vofop\right) - C2\left(Vop, 1 - Vofop + \frac{Vop, 1}{A}\right)$$

$$Vop, 1 = Vopb, 1 - \frac{A(Cp + C2)}{Cp + (A+1)C2}V1$$

Since Expression (42) is the same as Expression (29), the output Vop,k of the operational amplifier 340 at the time when the charge transfer step and the charge accumulation/comparison step are repeatedly carried out k times is the same as Expression (30). The output Vopb,k of the operational amplifier 340 at the time when the bias voltage of the integrating unit 34 is set to V1 is represented by the following expression.

Formula 30

$$Q2b, 1 = C2\left(Vopb, 1 - Vofop + \frac{Vopb, 1}{A}\right) \quad (46)$$

-continued $$Qpb, 1 = Cp\left(-\frac{Vopb, 1}{A} + Vofop\right) \quad (47)$$

When the bias voltage of the integrating unit 34 is set to V1 and the ground, the numbers of times of integration in which a determination signal is output in the determiner 32 for the first time are represented as kc1+1 and kc2+1, and kc1 is defined as the number of times of intermediate potential integration 1 and kc2 is defined as the number of times of intermediate potential integration 2.

The following equations hold about the number of times of intermediate potential integration 1 and the number of times of intermediate potential integration 2.

Formula 29

$$Vref=(VG-VG2)(kc1+\delta kc1)+Vofopb+rV1Vofc \quad (44)$$

$$Vref=(VG-VG2)(kc2+\delta kc2)+Vofopb+Vofc \quad (45)$$

δkc1 is a real number equal to or larger than 0 and smaller than 1. VGδkc1 represents a difference between Vref and a sum of an output of the operational amplifier 340 at the time when the bias voltage of the integrating unit 34 is set to V1 and the number of times of integration is kc1 and the offset voltage of the determiner 32. δkc2 is a real number equal to or larger than 0 and smaller than 1. VGδkc2 represents a difference between Vref and a sum of an output of the operational amplifier 340 at the time when the bias voltage of the integrating unit 34 is set to the ground and the number of times of integration is kc2 and the offset voltage of the determiner 32.

In integration unit measurement processing, the connection of SW3 is once short-circuited and thereafter opened to reset the charges accumulated in C2 and the charge transfer step and the charge accumulation/comparison step are repeatedly carried out. The number of times of integration in which a determination signal is output in a state in which s11 and s13 of the first crossbar switch 31 are connected and s12 and s14 of the first crossbar switch 31 are connected and the number of times of integration in which a determination signal is output in a state in which s11 and s14 of the first crossbar switch 31 are connected and s12 and s13 of the first crossbar switch 31 are connected.

Since the charge transfer step of the integration unit measurement processing is the same operation as the charge transfer step of the offset measurement processing, detailed explanation of the charge transfer step is omitted. The output voltage Vopa,1 of the operational amplifier after the first charge transfer step of the integration unit measurement processing is calculated by an expression in which Vop,1 of Expression (10) is replaced with Vopa,1.

In the charge accumulation/comparison step of the integration unit measurement processing, after a2 and b2 of SW2 are connected in order to accumulate charges in C1, the comparison in the determiner 32 is executed while a1 and b1 of SW1 are kept connected. In this case, when an output of the operational amplifier 340 in the first charge accumulation/comparison step is represented as Vobp,1, the charges Q2b,1 and Cpb,1 accumulated in C2 and Cp are represented by the following expressions.

Formula 31

$$Cp\left(-\frac{Vopa, 1}{A} + Vofop\right) - C2\left(Vopa, 1 - Vofop + \frac{Vopa, 1}{A}\right) = \quad (48)$$
$$Cp\left(-\frac{Vopb, 1}{A} + Vofop\right) - C2\left(Vopb, 1 - Vofop + \frac{Vopb, 1}{A}\right)$$
$$Vopb, 1 = Vopa, 1$$

The following relational expression between Vopa,1 and Vopb,1 is obtained using a condition under which charges of C2 and Cp connected to the negative input of the operational amplifier 340 are saved as in the explanation about Expression (20) in the case of the offset measurement processing.

Formula 31

$$Cp\left(-\frac{Vopa, 1}{A} + Vofop\right) - C2\left(Vopa, 1 - Vofop + \frac{Vopa, 1}{A}\right) = \quad (48)$$
$$Cp\left(-\frac{Vopb, 1}{A} + Vofop\right) - C2\left(Vopb, 1 - Vofop + \frac{Vopb, 1}{A}\right)$$
$$Vopb, 1 = Vopa, 1$$

In the offset measurement processing, since the a1 and b1 of SW1 are kept connected, the output Vop,1 of the operational amplifier 340 before the next second charge transfer step is equal to Vopb,1. Since Vop,1 is equal to Vopa,1 as well according to Expression (48), a recurrence formula of Vop,1 is the same as Expression (10). Accordingly, Vop,k is represented by Expression (18). The output Vopb,k of the operational amplifier 340 at the time of the comparison in the offset measurement processing is represented by the following expression.

Formula 32

$$Vopb, k = \frac{A\ C1}{C1 + Cp + (A+1)C2}\left(Vref + \frac{A}{A+1}Vofop\right)k + \quad (49)$$
$$\frac{A}{A+1}Vofop = VGk + Vofopb$$

In a state in which s11 and s13 of the first crossbar switch 31 are connected and s12 and s14 of the first crossbar switch 31 are connected, the output of the operational amplifier 340 is connected to the positive input of the determiner 32 and Vref is connected to the negative input of the determiner 32.

Figure 4:
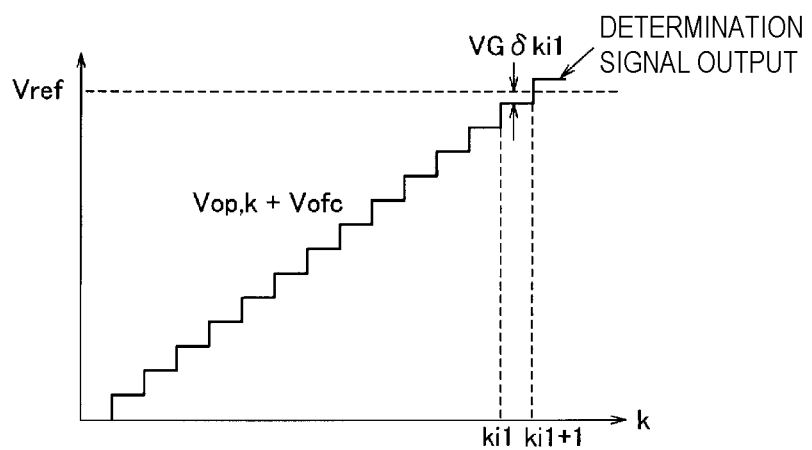
FIG. 4 is a schematic diagram schematically showing comparison of a unit voltage and a reference voltage by the determiner shown in FIG. 1.
Figure 5:
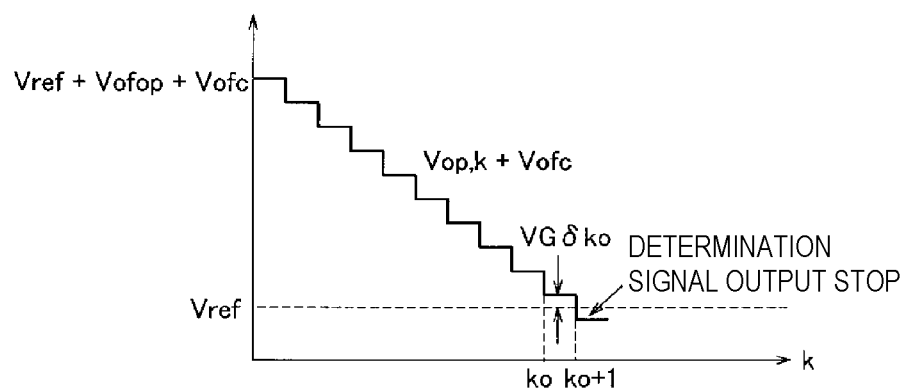
FIG. 5 is a schematic diagram schematically showing another example of the operation of the determiner shown in FIG. 4.

A relation among the voltage Vopb,k+Vofc obtained by adding the offset voltage Vofc of the determiner 32 to the positive input voltage Vopb,k of the determiner 32 in the state in which s11 and s13 of the first crossbar switch 31 are connected and s12 and s14 of the first crossbar switch 31 are connected, the negative input voltage Vref, and the number of times of integration k is shown in FIG. 4. Vopb,k+Vofc increases and approaches Vref as the number of times of integration increases. When the number of times the determination signal is detected for the first time is represented as ki+1, ki is defined as a first number of times of integration. The following equation holds about the first number of times of integration ki1.

Formula 33

$$Vref=VG(ki1+\delta ki1)+Vofopb+Vofc \quad (50)$$

In Expression (50), the left side is a negative input voltage of the determiner 32 and the right side is a voltage obtained by adding the offset voltage of the determiner 32 to a positive input voltage. δki1 is a real number equal to or larger than 0 and smaller than 1. VGδki1 represents a difference between Vref and an output of the operational amplifier 340 at the time of the number of times of integration ki1 and the offset voltage of the determiner.

In a state in which s11 and s14 of the first crossbar switch 31 are connected and s12 and s13 of the first crossbar switch 31 are connected, Vref is connected to the positive input of the determiner 32 and the output of the operational amplifier 340 is connected to the negative input of the determiner 32. A determination signal is output from the determiner 32 at the time when the number of times of integration is small. The output of the determination signal is stopped when the output of the operational amplifier 340 of the negative input of the determiner is larger than an equivalent positive input Vref+Vofc of the determiner 32. The charge transfer step and the charge accumulation/comparison step are repeated and, in the state in which s11 and s14 of the first crossbar switch 31 are connected and s12 and s13 of the first crossbar switch 31 are connected, when the number of times the determination signal is not detected for the first time is represented as ki2+1, ki2 is defined as a second number of times of integration. The following equation holds about the second number of times of integration ki2.

Formula 34

$$VG(ki2+\delta ki2)+Vofopb = Vref+Vofc \tag{51}$$

In Expression (51), the left side is a negative input voltage of the determiner 32 and the right side is a voltage obtained by adding the offset voltage of the determiner 32 to a positive input voltage. δki2 is a real number equal to or larger than 0 and smaller than 1.

In order to simplify expression expansion, it is assumed that Ko=ko+δko, Kc1=kc1+δkc1, Kc2=kc2+δkc2, Ki1=ki1+δki1, and Ki2=ki2+δki2. A difference between Expression (45) and Expression (50) is calculated to obtain the following expression.

Formula 35

$$0 = (VG - VG2)Kc2 - VGKi1 \tag{52}$$

$$VG - VG2 = \frac{Ki1}{Kc2}VG \tag{53}$$

$$VG2 = VG - \frac{Ki1}{Kc2}VG$$

A difference between Expression (32) and Expression (50) is calculated to obtain the following expression.

Formula 36

$$0 = (VG - VG2)Ko + \Gamma Vref - VGKi1 \tag{54}$$

$$\Gamma = \frac{1}{Vref}\{VGKi1 - (VG - VG2)Ko\} = \frac{1}{Vref}\left(1 - \frac{Ko}{Kc2}\right)Ki1VG$$

A ratio of Expression (34) and Expression (33) is calculated and Expression (53) is substituted in an expression obtained by the calculation of the ratio to obtain the following expression.

Formula 37

$$\frac{VG2}{VG} = \frac{V1}{Vref + Vofopb} \tag{55}$$

$$1 - \frac{Ki1}{Kc2} = \frac{V1}{Vref + Vofopb}$$

$$V1 = \left(1 - \frac{Ki1}{Kc2}\right)(Vref + Vofopb)$$

A difference between Expression (44) and Expression (50) is calculated and Expression (52), Expression (54), and Expression (55) are substituted in an expression obtained by the calculation of the difference to obtain the following expression.

Formula 38

$$0 = (VG - VG2)Kc1 + \Gamma V1 - VGKi1 \tag{56}$$

$$0 = Kc1\frac{Ki1}{Kc2}VG +$$

$$\frac{1}{Vref}\left(1 - \frac{Ko}{Kc2}\right)Ki1VG\left(1 - \frac{Ki1}{Kc2}\right)(Vref + Vofopb) - VGKi1$$

$$0 = \frac{Kc1}{Kc2} + \left(1 - \frac{Ko}{Kc2}\right)\left(1 - \frac{Ki1}{Kc2}\right)\left(1 + \frac{Vofopb}{Vref}\right) - 1$$

$$(Kc2 - Ko)(Kc2 - Ki1)\left(1 + \frac{Vofopb}{Vref}\right) = Kc2(Kc2 - Kc1)$$

$$Vofopb = \left\{\frac{Kc2((Kc2 - Kc1)}{(Kc2 - Ko)(Kc2 - Ki1)} - 1\right\}Vref$$

A difference between Expression (50) and Expression (51) is calculated and Expression (56) is substituted in an expression obtained by the calculation of the difference to obtain the following expression.

Formula 39

$$Vref - VGKi2 - Vofopb = VGKi1 + Vofopb + Vofc - Vref - Vofc \tag{57}$$

$$(Ki1 + Ki2)VG = 2Vref - 2Vofopb$$

$$VG = \frac{Vref}{Ki1 + Ki2}\left\{4 - 2\frac{Kc2(Kc2 - Kc1)}{(Kc2 - Ko)(Kc2 - Ki1)}\right\}$$

Since usually Vref>Vofopb, the right side of Expression (57) is positive.

In Expression (56) and Expression (57), ko, kc1, kc2, ki1, and ki2 are values obtained by the offset measurement processing, the intermediate potential measurement processing, and the integration unit measurement processing. However, δko, δkc1, δkc2, δki1, and δki2 are unknown parameters equal to or larger than 0 and smaller than 1 defined in order to cause the equations of Expression (32), Expression (44), Expression (45), Expression (50), and Expression (51) to hold. In the following explanation, a determining method for calibration values of VG and Vofopb from which the unknown parameters δko, δkc1, δkc2, δki1, and δki2 are removed is explained.

In Expression (56), δko, δkc1, and δki1 are partially differentiated to obtain the following expression.

Formula 40

$$\frac{\partial Vofopb}{\partial(\delta ko)} = \frac{Kc2(Kc2 - Kc1)}{(Kc2 - Ko)^2(Kc2 - Ki1)}Vref > 0 \tag{58}$$

-continued $$\frac{\partial Vofopb}{\partial(\delta kc1)} = \frac{Kc2}{(Kc2-Ko)(Kc2-Ki1)}Vref < 0 \quad (59)$$

$$\frac{\partial Vofopb}{\partial(\delta ki1)} = \frac{Kc2(Kc2-Kc1)}{(Kc2-Ko)(Kc2-Ki1)^2}Vref > 0 \quad (60)$$

In the above expressions, signs of inequality are derived from the following conditions.

(1) Since the number of times of integration at the integration unit voltage of VG2 is Kc2, the number of times of integration at the integration unit voltage of VG is Ki1, and since VG>VG2, Kc2>Ki1

(2) since the number of times of integration in a range of integration Vref−(Vofopb+Vofc) is Kc2 and the number of times of integration in a range of integration −(Vofopb+Vofc) is Ko, Kc2>Ko (3) Since the number of times of integration in a range of integration Vref−V1−(Vofopb+Vofc) is Kc1, Kc2>Kc1

Vofopb monotonously increases with respect to δko and δki1 and monotonously decreases with respect to δkc1.

In Expression (56), δkc2 is partially differentiated to obtain the following expression.

Formula 41

$$\frac{\partial Vofopb}{\partial(\delta kc2)} = \left\{ \frac{(Kc2-Kc1)}{(Kc2-Ko)(Kc2-Ki1)} + \frac{Kc2}{(Kc2-Ko)(Kc2-Ki1)} - \frac{Kc2(Kc2-Kc1)}{(Kc2-Ko)^2(Kc2-Ki1)} - \frac{Kc2(Kc2-Kc1)}{(Kc2-Ko)(Kc2-Ki1)^2} \right\} Vref = $$

$$\frac{(2Kc2-Kc1)(Kc2-Ko)(Kc2-Ki1) - }{Kc2(Kc2-Kc1)\{(Kc2-Ko)+(Kc2-Ki1)\}}Vref = $$
$$\frac{(Kc2-Ko)^2(Kc2-Ki1)^2}$$

$$\frac{(2Kc2-Kc1)\{Kc2^2-(Ko+Ki1)Kc2+KoKi1\} - }{Kc2(Kc2-Kc1)(2Kc2-Ko-Ki1)}Vref = $$
$$\frac{(Kc2-Ko)^2(Kc2-Ki1)^2}$$

$$\frac{Kc2\{-(Ko+Ki1)Kc2+2KoKi1+2Kc1Kc2-Kc1(Ko+Ki1)\} - Kc1\{Kc2^2-(Ko+Ki1)Kc2+KoKi1\}}{((Kc2-Ko)^2(Kc2-Ki1)^2)}Vref = $$

$$\frac{Kc2\{-(Ko+Ki1)Kc2+2KoKi1+Kc1Kc2\}-Kc1KoKi1}{(Kc2-Ko)^2(Kc2-Ki1)^2}Vref = $$

$$\frac{Kc2^2\{Kc1-(Ko+Ki1)\}+(2Kc2-Kc1)KoKi1}{(Kc2-Ko)^2(Kc2-Ki1)^2}Vref$$

When Expression (61) is negative, since Vofopb monotonously decreases with respect to δkc2, a range of Vofopb is represented by the following expression.

Formula 42

$$\left\{\frac{(kc2+1)(kc2-kc1)}{(kc2+1-ko)(kc2+1-ki1)} - 1\right\}Vref < \quad (62)$$

$$Vofopb < \left\{\frac{kc2(kc2-kc1)}{(kc2-ko-1)(kc2-ki1-1)} - 1\right\}Vref$$

If a calibration value of Vofopb is set to Vofopc represented by Expression (63), which is the median of a range of Expression (62), the calibration value of Vofopb can be derived at accuracy lower than ΔVofopb represented by Expression (64).

Formula 43

$$Vofopc = \frac{1}{2}\left\{\frac{(kc2+1)(kc2-kc1)}{(kc2+1-ko)(kc2+1-ki1)} + \frac{kc2(kc2-kc1)}{(kc2-ko-1)(kc2-ki1-1)} - 2\right\}Vref \quad (63)$$

$$\Delta Vofopb = \quad (64)$$
$$\frac{1}{2}\left\{\frac{kc2(kc2-kc1)}{(kc2-ko-1)(kc2-ki1-1)} - \frac{(kc2+1)(kc2-kc1)}{(kc2+1-ko)(kc2+1-ki1)}\right\}$$
$$Vref = $$
$$\frac{(kc2-kc1)\{kc2(kc2+1-ko)(kc2+1-ki1) - }{\frac{1}{2}\frac{(kc2+1)(kc2-ko\ 1)(kc2-ki1-1)\}}{(kc2\ ko\ 1)(kc2-ki1-1)(kc2+1-ko)(kc2+1-ki1)}}Vref = $$

$$\frac{(kc2-kc1)\{kc2-ko[(kc2-ko)(kc2\ ki1) + }{(kc2-ko)+(kc2-ki1)+1-(kc2-ko)(kc2-ki1) + }$$
$$1-(kc2-ko)(kc2-ki1)+(ki2-ko)+(kc2-ki1)-1$$
$$\frac{1}{2}\frac{\{-(kc2-ko-1)(kc2\ ki1-1)\}}{(kc2-ko-1)(kc2-ki1-1)(kc2+1-ko)(kc2+1-ki1)}$$
$$Vref = $$

$$\frac{(kc2-kc1)\{2kc2[(kc2-ko)+(kc2-ki1)] - }{\frac{1}{2}\frac{(kc2-ko-1)(kc2-ki1-1)\}}{(kc2-ko-1)(kc2-ki1-1)(kc2+1-ko)(kc2+1-ki1)}}$$
$$Vref$$

When Expression (61) is positive, since Vofopb monotonously increases with respect to δkc2, the range of Vofopb is represented by the following expression.

Formula 44

$$\left\{\frac{kc2(kc2-kc1-1)}{(kc2-ko)(kc2-ki1)} - 1\right\}Vref < \quad (65)$$
$$Vofopb < \left\{\frac{(kc2+1)(kc2-kc1+1)}{(kc2-ko)(kc2-ki1)} - 1\right\}Vref$$

If the calibration value of Vofopb is set to Vofopc represented by Expression (66), which is the median of a range of Expression (65), the calibration value of Vofopb can be derived at accuracy lower than ΔVofopb represented by Expression (67).

Formula 45

$$Vofopc = \quad (66)$$
$$\frac{1}{2}\left\{\frac{(kc2+1)(kc2-kc1+1)}{(kc2-ko)(kc2-ki1)} + \frac{kc2(kc2-kc1-1)}{(kc2-ko)(kc2-ki1)} - 2\right\}Vref$$

$$\Delta Vofopb = \quad (67)$$
$$\frac{1}{2}\left\{\frac{(kc2+1)(kc2-kc1+1)}{(kc2-ko)(kc2-ki1)} - \frac{kc2(kc2-kc1-1)}{(kc2-ko)(kc2-ki1)}\right\}Vref = $$
$$\frac{1}{2}\frac{kc2(kc2-kc1+1-kc2+kc1+1)+(kc2-kc1+1)}{(kc2-ko)(kc2-ki1)}Vref = $$
$$\frac{1}{2}\frac{2kc2+(kc2-kc1+1)}{(kc2-ko)(kc2-ki1)}Vref = \frac{1}{2}\frac{3kc2-kc1+1}{(kc2-ko)(kc2-ki1)}Vref$$

In Expression (64), a numerator is proportional to the cube of the number of times of integration and a denominator is proportional to the fourth power of the number of times of integration. Therefore, ΔVofopb is smaller and accuracy is higher as the number of times of integration is larger. In Expression (67), a numerator is proportional to the first power of the number of times of integration and a denominator is proportional to the square of the number of times of integration. Therefore, ΔVofopb is smaller and accuracy is higher as the number of times of integration is larger. Therefore, in order to highly accurately derive the calibration value of Vofopb, the number of times of integration only has to be increased, that is, an integration unit voltage only has to be reduced.

According to the determination described above, the calibration value of Vofopb is represented with predetermined accuracy by known Vref and the number of times of offset integration, the number of times of intermediate potential integration 1, the number of times of intermediate potential integration 2, the first number of times of integration, and the second number of times of integration obtained by the measurement.

In Expression (57), δko, δkc1, δki1, and δki2 are partially differentiated to obtain the following expression.

Formula 46

$$\frac{\partial VG}{\partial (\delta ko)} = -\frac{Vref}{Ki1+Ki2}\frac{Kc2(Kc2-Kc1)}{(Kc2-Ko)^2(Kc2-Ki1)} < 0 \quad (68)$$

$$\frac{\partial VG}{\partial (\delta kc1)} = \frac{Vref}{Ki1+Ki2}\frac{Kc2}{(Kc2-Ko)(Kc2-Ki1)} > 0 \quad (69)$$

$$\frac{\partial VG}{\partial (\delta ki1)} = -\frac{Vref}{(Ki1+Ki2)^2}\left\{4-2\frac{Kc2(Kc2-Kc1)}{(Kc2-Ko)(Kc2-Ki1)}\right\} - \frac{Vref}{Ki1+Ki2}\frac{Kc2(Kc2-Kc1)}{(Kc2-Ko)(Kc2-Ki1)^2} < 0 \quad (70)$$

$$\frac{\partial VG}{\partial (\delta ki2)} = -\frac{Vref}{(Ki1+Ki2)^2}\left\{4-2\frac{Kc2(Kc2-Kc1)}{(Kc2-Ko)(Kc2-Ki1)}\right\} < 0 \quad (71)$$

In Expression (70) and Expression (71), signs of inequality are derived using the fact that the right side of Expression (57) is positive.

VG monotonously increases with respect to δkc1 and monotonously decreases with respect to δko, δki1, and δki2.

Expression (57) is partially differentiated about δkc2 to obtain the following expression according to the same expansion as Expression (61).

Formula 47

$$\frac{\partial VG}{\partial (\delta kc2)} = -\frac{Kc2^2\{Kc1-(Ko+Ki1)\}+(2Kc2-Kc1)KoKi1}{(Kc2-Ko)^2(Kc2-Ki1)^2}Vref \quad (72)$$

To match the case in which Expression (61) is negative, the right side of Expression (72) is positive. Therefore, VG monotonously increases with respect to δkc2. A range of VG is represented by the following expression.

Formula 48

$$\frac{Vref}{ki1+ki2+2}\left\{4-2\frac{kc2(kc2-kc1)}{(kc2-ko-1)(kc2-ki1-1)}\right\} < \quad (73)$$

$$VG < \frac{Vref}{ki1+ki2}\left\{4-2\frac{(kc2+1)(kc2-kc1)}{(kc2-ko)(kc2-ki1)}\right\}$$

If a calibration value of VG is set to VGc represented by Expression (74), which is the median of a range of Expression (73), the calibration value of VG can be derived at accuracy lower than ΔVG represented by Expression (75).

Formula 49

$$VGc = \frac{Vref}{ki1+ki2}\left\{2-\frac{(kc2+1)(kc2-kc1)}{(kc2-ko)(kc2-ki1)}\right\} + \frac{Vref}{ki1+ki2+2}\left\{2-\frac{kc2(kc2-kc1)}{(kc2-ko-1)(kc2-ki1-1)}\right\} \quad (74)$$

$$\Delta VG = \frac{Vref}{ki1+ki2}\left\{2-\frac{(kc2+1)(kc2-kc1)}{(kc2-ko)(kc2-ki1)}\right\} - \frac{Vref}{ki1+ki2+2}\left\{2-\frac{kc2(kc2-kc1)}{(kc2-ko-1)(kc2-ki1-1)}\right\} = \quad (75)$$

$$2\frac{2Vref}{(ki1+ki2)(ki1+ki2+2)} +$$

$$Vref\frac{(kc2-kc1)\{-(kc2+1)(ki1+ki2+2)(kc2-ko-1)(kc2-ki1-1)+kc2(ki1+ki2)(kc2-ko)(kc2-ki1)\}}{(ki1+ki2)(kc2-ko)(kc2-ki1)(ki1+ki2+2)(kc2-ko-1)(kc2-ki1-1)} =$$

$$\frac{4Vref}{(ki1+ki2)(ki1+ki2+2)} + Vref$$

$$(kc2-kc1)\{-(ki1+ki2+2)(kc2-ko-1)(kc2-ki1-1)-kc2(2(kc2-ko-1)+(kc2-ki1-1)\}$$

$$\frac{\{(ki1+ki2)(2kc2+ko+ki1+1)\}}{(ki1+ki2)(kc2-ko)(kc2-ki1)}$$

$$(ki1+ki2+2)(kc2-ko-1)(kc2-ki1-1)$$

To match the case in which Expression (61) is positive, the right side of Expression (72) is negative. Therefore, VG monotonously decreases with respect to δkc2. A range of VG is represented by the following expression.

Formula 50

$$\frac{Vref}{ki1+ki2+2}\left\{4-2\frac{(kc2+1)(kc2-kc1+1)}{(kc2-ko)(kc2-ki1)}\right\} < \quad (76)$$

$$VG < \frac{Vref}{ki1+ki2}\left\{4-2\frac{kc2(kc2-kc1-1)}{(kc2-ko)(kc2-ki1)}\right\}$$

If the calibration value of VG is set to VGc represented by Expression (77), which is the median of a range of Expression (76), the calibration value of VG can be derived at accuracy lower than ΔVG represented by Expression (78).

Formula 51

$$VGc = \frac{Vref}{ki1+ki2}\left\{2-\frac{kc2(kc2-kc1-1)}{(kc2-ko)(kc2-ki1)}\right\} + \frac{Vref}{ki1+ki2+2}\left\{2-\frac{(kc2+1)(kc2-kc1+1)}{(kc2-ko)(kc2-ki1)}\right\} \quad (77)$$

-continued $$\Delta VG = \frac{Vref}{ki1+ki2}\left\{2-\frac{kc2(kc2-kc1-1)}{(kc2-ko)(kc2-ki1)}\right\}- \quad (78)$$

$$\frac{Vref}{ki1+ki2+2}\left\{2-\frac{(kc2+1)(kc2-kc1+1)}{(kc2-ko)(kc2-ki1)}\right\}=$$

$$2\frac{2Vref}{(ki1+ki2)(ki1+ki2+2)}+\frac{Vref}{(kc2-ko)(kc2-ki1)}$$

$$\left\{\frac{kc2(kc2-kc1-1)}{(ki1+ki2)}-\frac{(kc2+1)(kc2-kc1+1)}{(ki1+ki2+2)}\right\}=$$

$$2\frac{2Vref}{(ki1+ki2)(ki1+ki2+2)}+\frac{Vref}{(kc2-ko)(kc2-ki1)}$$

$$\frac{kc2(kc2-kc1-1)(ki1+ki2+2)-}{(ki1+ki2)(ki1+ki2+2)}=$$

$$2\frac{2Vref}{(ki1+ki2)(ki1+ki2+2)}+\frac{Vref}{(kc2-ko)(kc2-ki1)}\times$$

$$\left\{\begin{array}{l}kc2(kc2-kc1)(ki1+ki2)+\\ \frac{kc2\{2(kc2-kc1)-(ki1+ki2)-2\}}{(ki1+ki2)(ki1+ki2+2)}-\end{array}\right.$$

$$\left.\frac{kc2(kc2-kc1)(ki1+ki2)-}{kc2(ki1+ki2)(kc2-kc1+1)(ki1+ki2)}\right\}=$$

$$2\frac{2Vref}{(ki1+ki2)(ki1+ki2+2)}+\frac{Vref}{(kc2-ko)(kc2-ki1)}$$

$$\frac{kc2\{2(kc2-kc1)-(ki1+ki2)-2\}-}{kc2(ki1+ki2)-(kc2-kc1+1)(ki1+ki2)}=$$

$$2\frac{2Vref}{(ki1+ki2)(ki1+ki2+2)}+\frac{Vref}{(kc2-ko)(kc2-ki1)}\times$$

$$\left\{\frac{2kc2\{(kc2-kc1)-(ki1+ki2)-1\}}{(ki1+ki2)(ki1+ki2+2)}-\right.$$

$$\left.\frac{(kc2-kc1+1)(ki1+ki2)}{(ki1+ki2)(ki1+ki2+2)}\right\}$$

In Expression (75), a numerator is proportional to the fourth power of the number of times of integration and a denominator is proportional to the sixth power of the number of times of integration. Therefore, $\Delta VG$ is smaller and accuracy is higher as the number of times of integration is larger. In Expression (78), a numerator is proportional to the square of the number of times of integration and a denominator is proportional to the fourth power of the number of times of integration. Therefore, $\Delta VG$ is smaller and accuracy is higher as the number of times of integration is larger. Therefore, in order to highly accurately derive the calibration value of VG, the number of times of integration only has to be increased, that is, the integration unit voltage only has to be reduced.

Consequently, in this embodiment, in the calibration state, a measuring instrument serving as a reference for calibration is unnecessary on the outside of a sensor node even after sensor circuit setting. It is possible to derive, at predetermined accuracy, calibration values of the offset voltage and the integration unit voltage of the operational amplifier 340.

When the processing explained above is completed, the control unit 20 outputs the calibration values of the offset voltage and the integration unit voltage of the operational amplifier 340 to the outside as calibration data.

When the sensor circuit is calibrated, the variable signal source for calibration is set in an output state. A voltage set by setting data including the number of times of integration k is output. In the output state, after the setting data is acquired by the control unit 20, charges accumulated in C2 are initialized by closing SW3. Subsequently, SW3 is opened and the charge transfer step and the charge accumulation/comparison step are repeatedly executed by the number of times of integration of k. When the charge transfer step and the charge accumulation/comparison step for the number of times of integration are completed, the control unit 20 outputs calibration data representing the completion.

A voltage output from the variable reference voltage source 100 can be treated as a known voltage because the voltage can be derived from Expression (18), Expression (33), and Expression (35) using the calibration values of the integration unit voltage VG and Vofopb derived in the calibration state. Therefore, the known voltage output from the variable reference voltage source 100 is input to the amplifier and the AD converter of the sensor circuit. It is possible to calibrate an offset and a gain of the amplifier and an offset of the AD converter from a correlation with the output.

A measuring instrument serving as a reference for calibration is unnecessary on the outside of a sensor node even after sensor circuit setting. Calibration values of the offset and the integration unit voltage can be calculated at predetermined accuracy according to a calibration state of the variable reference voltage source 100 in this embodiment. Therefore, it is possible to perform calibration of the sensor circuit even if the offset and the integration unit voltage change because of a change with time.

In the above explanation, Vref+Vofop+Vofc is small compared with Vref, which is the negative input voltage of the determiner 32 in the offset polarity determination processing. However, when Vref+Vofop+Vofc is large compared with Vref, a determination signal is output from the determiner 32. When the control unit 20 confirms that the determination signal is output, s21 and s23 of the second crossbar switch 33 are connected and s22 and s24 of the second crossbar switch 33 are connected according to an operation control signal output from the control unit 20.

When the offset measurement processing is carried out in a state in which s21 and s23 of the second crossbar switch 33 are connected and s22 and s24 of the second crossbar switch 33 are connected, a charge $Q1,0$ accumulated in C1 in the charge accumulation/comparison step is represented by the following expression.

Formula 52

$$Q1,_0 = -C1(Vref - V1) \quad (79)$$

Accordingly, the relational expression between Vopa,1 and Vop,0 is as follows.

Formula 53

$$Vopa, 1 = \frac{A\ C1}{C1+Cp+(A+1)C2}(-Vref+Vofop+V1)+ \quad (81)$$

$$\frac{Cp+(A+1)C2}{C1+Cp+(A+1)C2}Vop, 0$$

Since a relational expression among Vopb,1, Vop,1, and Vopa,1 does not change, a relational expression between Vop,1 and Vop,0 is as follows.

Formula 54

$$Vop, 1 = \frac{A\ C1}{C1 + Cp + (A+1)C2}(-Vref + Vofop + V1) + \frac{Cp + (A+1)C2}{C1 + Cp + (A+1)C2}Vop, 0 \quad (81)$$

Expression (81) is different in a part where (Vref+Vofop) of the first term of Expression (10) is changed to (−Vref+Vofop+V1). Therefore, the output Vop,k of the operational amplifier 340 at the time when the charge transfer step and the charge accumulation/comparison step are repeated k times is represented by the following expression.

Formula 55

$$Vop, k = k\frac{A\ C1}{C1 + Cp + (A+1)C2}\left(-Vref + \frac{A}{A+1}Vofop + V1\right) + \frac{A}{A+1}Vofop \quad (82)$$

The output Vopb,k of the operational amplifier 340 in the charge accumulation/comparison step is the following expression.

Formula 56

$$Vopb, k = k\frac{A\ C1}{C1 + Cp + (A+1)C2}\left(-Vref + \frac{A}{A+1}Vofop + V1\right) + \frac{A}{A+1}Vofop + \frac{A(Cp1C2)}{Cp + (A+1)C2}Vref \quad (83)$$

When the voltage Vopb,k+Vofc obtained by adding the offset voltage Vofc of the determiner 32 to the positive input voltage Vopb,k of the determiner 32 in the charge accumulation/comparison step is larger than the negative input voltage Vref, the determiner 32 outputs a determination signal. The determination signal is detected by the control unit 20.

A relation among the voltage Vopb,k+Vofc obtained by adding the offset voltage Vofc of the determiner 32 to the positive input voltage Vopb,k of the determiner 32, the negative input voltage Vref, and the number of times of integration k is shown in FIG. 3. Vopb,k+Vofc decreases and approaches Vref as the number of times of integration increases. When the number of times a stop of the determination signal is detected for the first time is represented as ko+1, ko is defined as the number of times of offset integration.

The following equation holds about the number of times of offset integration ko.

Formula 57

$$Vref = (VGm + VG2)(ko + \delta ko) + Vofopb + \Gamma Vref + Vofc \quad (84)$$

$$VGm = \frac{A\ C1}{C1 + Cp + (A+1)C2}(-Vref + Vofopb) \quad (85)$$

The intermediate potential measurement processing and the integration unit measurement processing are the same as those at the time when the s21 and s24 of the second crossbar switch 33 are connected and s22 and s23 of the second crossbar switch 33 are connected. Therefore, explanation of the intermediate potential measurement processing and the integration unit measurement processing is omitted.

A difference between Expression (84) and Expression (50) is calculated to obtain the following expression.

Formula 58

$$0 = (VGm + VG2)Ko + \Gamma Vref - VG\ Ki1 \quad (86)$$

$$\Gamma = \frac{1}{Vref}\{VG\ Ki1 - (VGm + VG2)Ko\}$$

A ratio of Expression (85) and Expression (33) is calculated to obtain the following expression.

Formula 59

$$\frac{VGm}{VG} = \frac{-Vref + Vofopb}{Vref + Vofopb} \quad (87)$$

A difference between Expression (44) and Expression (50) is calculated and Expression (52), Expression (86), Expression (55), and Expression (87) are substituted in an expression obtained by the calculation of the difference to obtain the following expression.

Formula 60

$$0 = (VG - VG2)Kc1 + \Gamma V1 - VG\ Ki1 \quad (88)$$

$$0 = Kc1\frac{Ki1}{Kc2}VG +$$

$$\frac{1}{Vref}\left\{VG\ Ki1 - \left(\frac{-Vref + Vofopb}{Vref + Vofopb}VG + VG - \frac{Ki1}{Kc2}VG\right)Ko\right\}$$

$$\left(1 - \frac{Ki1}{Kc2}\right)(Vref + Vofopb) - VG\ Ki1$$

$$0 = \left(\frac{Kc1}{Kc2} - 1\right)Ki1\ Vref + \left\{Ki1 - \left(\frac{2Vofopb}{Vref + Vofopb} - \frac{Ki1}{Kc2}\right)Ko\right\}$$

$$\left(1 - \frac{Ki1}{Kc2}\right)(Vref + Vofopb)$$

$$0 = \left(\frac{Kc1}{Kc2} - 1\right)Ki1\ Vref +$$

$$\left\{Ki1\left(1 + \frac{Ko}{Kc2}\right)(Vref + Vofopb) - 2Vofopb\ Ko\right\}\left(1 - \frac{Ki1}{Kc2}\right)$$

$$\left(Ki1 + Ki1\frac{Ko}{Kc2} - 2Ko\right)Vofopb =$$

$$\frac{Kc2 - Kc1}{Kc2 - Ki1}Ki1Vref - Ki1\left(1 + \frac{Ko}{Kc2}\right)Vref$$

$$Vofopb = \frac{\frac{Ki1 - Kc1}{Kc2 - Ki1} - \frac{Ko}{Kc2}}{Ki1 + Ki1\frac{Ko}{Kc2} - 2Ko}Ki1\ Verf =$$

$$\frac{(Ki1 - Kc1)Kc2 - Ko(Kc2 - Ki1)}{(ki1Kc2 + Ki1Ko - 2KoKc2)(Kc2 - Ki1)}Ki1\ Verf$$

If Expression (88) is substituted in the following expression obtained by calculating a difference between Expression (50) and Expression (51), VG represented by Ko, Kc2, Ki1, and Ki2 obtained in the calibration state is obtained.

Formula 61

$$(Ki1 + Ki2)VG = 2Vref - 2Vofopb \quad (89)$$
$$VG = \frac{2}{Ki1 + Ki2}(Vref - Vofopb)$$

Expression (88) is partially differentiated about δko, δkc1, and δki1 to obtain the following expression.

Formula 62

$$\frac{\partial Vofopb}{\partial(\delta ko)} = \frac{(Kc2 - Ki1)}{(Ki1Kc2 + Ki1Ko - 2KoKc2)(Kc2 - Ki1)}Ki1Vref - \quad (90)$$
$$\frac{\{(Ki1 - Kc1)Kc2 - Ko(Kc2 - Ki1)\}(Ki1\ 2Kc2)}{(Ki1Kc2 + Ki1Ko - 2KoKc2)^2(Kc2 - Ki1)}Ki1Vref =$$
$$(Kc2 - Ki1)(Ki1Kc2 + Ki1Ko\ 2KoKc2) -$$
$$\frac{\{(Ki1 - Kc1)Kc2 - Ko(Kc2 - Ki1)\}(Ki1 - 2Kc2)}{(Ki1Kc2 + Ki1Ko - 2KoKc2)^2(Kc2 - Ki1)}Ki1Vref =$$
$$\frac{-Kc2\{Kc2(2Kc1 - Ki1) - Ki1Kc1\}}{(Ki1Kc2 + Ki1Ko - 2KoKc2)(Kc2\ Ki1)}Ki1Vref < 0$$

$$\frac{\partial Vofopb}{\partial(\delta kc1)} = \frac{-Kc2}{(Ki1Kc2 + Ki1Ko - 2KoKc2)(Kc2\ Ki1)}Ki1Vref < 0 \quad (91)$$

$$2Kc2X^2 - \{-(Kc1 + Ko)(Kc2 - Ki1) + \quad (92)$$
$$(Kc2 - 2Ko + Kc1)Ki1\}Kc2X - Kc2^2$$
$$\frac{\partial Vofopb}{\partial(\delta ki1)} = \frac{(Kc2Ko - Kc2Kc1 - Ko^2 + KoKc1)Ki1}{X^2(Kc2 - Ki1)^2}Vref =$$
$$2Kc2X^2 - \{X + (Kc1 - 3Ko)Kc2 - 4KoKi1\}Kc2X -$$
$$\frac{Kc2^2\{KoX + 2Ko^2(Kc2\ Ki1) + (Ko - Kc2)Kc1Ki1\}}{X^2(Kc2 - Ki1)^2}Vref =$$
$$Kc2X^2 - \{(Kc1 - 4Ko)Kc2 - 4KoKi1\}KC2X +$$
$$\frac{Kc2^2\{(Kc2 - Ko)Kc1Ki1 - 2Ko2^2(Kc2 - Ki1)\}}{X^2(Kc2 - Ki1)^2}Vref =$$
$$\{X - (Kc1 - 4Ko)Kc2 - 4KoKi1\}Kc2X +$$
$$\frac{Kc2^2\{(Kc2 - Ko)Kc1Ki1 - 2Ko^2(Kc2 - Ki1)\}}{X^2(Kc2 - Ki1)^2}Vref =$$
$$\{Ki1Kc2 + Ki1Ko - 2KoKc2 - (Kc1 - 4Ko)Kc2 +$$
$$4KoKi1\}Kc2X + Kc2^2\{(Kc2 - Ko)Kc1Ki1 -$$
$$\frac{2Ko^2(Kc2 - Ki1)\}}{X^2(Kc2 - Ki1)^2}Vref =$$
$$\{(Ki1 - Kc1)Kc2 + SKi1Ko + 2KoKc2\}Kc2X +$$
$$\frac{Kc2^2\{(Kc2 - Ko)Kc1Ki1\ - 2Ko^2(Kc2 - Ki1)\}}{X^2(Kc2 - Ki1)^2}Vref > 0$$

Note that the following expression is used when Expression (92) is obtained.

Formula 63

$$X = KiKc2 + Ki1Ko - 2KoKc2(Ki1 - Kc1)Kc2 -$$
$$Ko(Kc2 - Ki1) + (Kc2 + Ko)Ki1 =$$
$$2(Ki1Kc2 + Ki1Ko - 2KoKc2) - (Kc1 + Ko)Kc2 =$$
$$2X - (Kc1 + Ko)Kc2 - (Ki1Kc2 + Ki1Ko - 2KoKc2) +$$
$$(Kc2 - Ki1)(Kc2 + Ko) =$$
$$-2(Ki1Kc2 + Ki1Ko - 2KoKc2) + Kc2(Kc2 - Ko) =$$
$$-2X + Kc2(Kc2 - Ko)$$

According to Expression (90), Expression (91), and Expression (92), Vofopb monotonously increases with respect to δki1 and monotonously decreases with respect to δkc1 and δko Expression (89) is partially differentiated about δkc2 to obtain the following expression.

Formula 64

$$\frac{\partial Vofopb}{\partial(\delta kc2)} = \frac{Ki1 - Kc1 - Ko}{(Ki1Kc2 + Ki1Ko - 2KoKc2)(Kc2 - Ki1)}Ki1Vref - \quad (93)$$
$$\frac{\{(Ki1 - Kc1)Kc2 - Ko(Kc2 - Ki1)\}\{(Ki1Kc2 + Ki1Ko - 2KoKc2) + (Kc2 - Ki1)(Ki1 - 2Ko)\}}{(Ki1Kc2 + Ki1Ko - 2KoKc2)^2(Kc2 - Ki1)^2}Ki1Vref$$

When Expression (93) is positive, since Vofopb monotonously increases with respect to δkc2, a range of Vofopb is represented by the following expression.

Formula 65

$$\frac{(ki1 - kc1)kc2 - (ko + 1)(kc2 - ki1)}{\{ki1kc2 + ki1(ko + 1) - 2(ko + 1)kc2\}(kc2 - ki1)}ki1\ Verf < Vofopb < \quad (94)$$
$$\frac{(ki1 - kc1 + 1)(kc2 + 1) - ko(kc2 - ki1)}{\{(ki1 + 1)(kc2 + 1) + ko(ki1 + 1) - 2ko(kc2 + 1)\}(kc2 - ki1)}(ki1 + 1)Vref$$

If the calibration value of Vofopb is set to Vofopc represented by Expression (95), which is the median of a range of Expression (94), the calibration value of Vofopb can be derived at accuracy lower than ΔVofopb represented by Expression (96).

Formula 66

$$Vofopc = \frac{(ki1 - kc1 + 1)(kc2 + 1) - ko(kc2 - ki1)}{2\{(ki1 + 1)(kc2 + 1) + ko(ki1 + 1) - 2ko(kc2 + 1)\}(kc2 - ki1)} \quad (95)$$
$$(ki1 + 1)Verf +$$
$$\frac{(ki1 - kc1 - 1)kc2 - (ko + 1)(kc2 - ki1)}{2\{ki1kc2 + ki1(ko + 1) - 2(ko + 1)kc2\}(kc2 - ki1)}Ki1\ Verf$$

$$\Delta Vofopb = \quad (96)$$
$$\frac{(ki1 - kc1 + 1)(kc2 + 1) - ko(kc2 - ki1)}{2\{(ki1 + 1)(kc2 + 1) + ko(ki1 + 1) - 2ko(kc2 + 1)\}(kc2 - ki1)}$$
$$(ki1 + 1)Verf -$$
$$\frac{(ki1 - kc1 - 1)kc2 - (ko + 1)(kc2 - ki1)}{2\{ki1kc2 + ki1(ko + 1) - 2(ko + 1)kc2\}(kc2 - ki1)}Ki1\ Verf$$

When Expression (93) is negative, since Vofopb monotonously decreases with respect to δkc2, the range of Vofopb is represented by the following expression.

Formula 67

$$\frac{(ki1 - kc1 - 1)(kc2 + 1) - (ko + 1)(kc2 - ki1 + 1)}{\{ki1(kc2 + 1)ki1(ko + 1) - 2(ko + 1)kc2 + 1)\}(kc2 - ki1 + 1)} \quad (97)$$
$$ki1\ Verf < Vofopb <$$
$$\frac{(ki1 - kc1 + 1)kc2 - ko(kc2 - ki1 - 1)}{\{(ki1 + 1)kc2 + ko(ki1 + 1) - 2kokc2\}(kc2 - k1 - 1)}(ki1 + 1)Vref$$

If the calibration value of Vofopb is set to Vofopc represented by Expression (98), which is the median of a range of Expression (97), the calibration value of Vofopb can be derived at accuracy lower than ΔVofopb represented by Expression (99).

Formula 68

$$Vofopc = \qquad (98)$$
$$\frac{(ki1 - kc1 + 1)kc2 - ko(kc2 - ki1 - 1)}{2\{(ki1 + 1)kc2 + ko(ki1 + 1) - 2kokc2\}(kc2 - k1 - 1)}(ki1 + 1)Verf +$$
$$\frac{(ki1 - kc1 - 1)(kc2 + 1) - (ko + 1)(kc2 - ki1 + 1)}{2\{ki1(kc2 + 1) + ki1(ko + 1) -}Ki1 \; Verf$$
$$2(ko + 1)(kc2 + 1)\}(kc2 - ki1 + 1)$$

$$\Delta Vofopb = \qquad (99)$$
$$\frac{(ki1 - kc1 + 1)kc2 - ko(kc2 - ki1 - 1)}{2\{(ki1 + 1)kc2 + ko(ki1 + 1) - 2kokc2\}(kc2 - k1 - 1)}(ki1 + 1)Verf -$$
$$\frac{(ki1 - kc1 - 1)(kc2 + 1) - (ko + 1)(kc2 - ki1 + 1)}{2\{ki1(kc2 + 1) + ki1(ko + 1) -}Ki1 \; Verf$$
$$2(ko + 1)(kc2 + 1)\}(kc2 - ki1 + 1)$$

Expression (89) is partially differentiated about δko, δkc1, δki1, and δki2 to obtain the following expression.

Formula 69

$$\frac{\partial VG}{\partial(\delta ko)} = \frac{-2}{Ki1 + Ki2}\frac{\partial Vofopb}{\partial(\delta ko)} = \qquad (100)$$
$$\frac{2Kc2\{Kc2(2Kc1 - Ki1) - Ki1Kc1\}}{(Ki1 + Ki2)(Ki1Kc2 + Ki1Ko - 2KoKc2)^2(Kc2 - Ki1)}Ki1Vref >$$
$$0$$

$$\frac{\partial VG}{\partial(\delta kc1)} = \frac{-2}{Ki1 + Ki2}\frac{\partial Vofopb}{\partial(\delta kc1)} = \qquad (101)$$
$$\frac{2Kc2}{(Ki1 + Ki2)(Ki1Kc2 + Ki1Ko - 2KoKc2)(Kc2 - Ki1)}Ki1Vref >$$
$$0$$

$$\frac{\partial VG}{\partial(\delta ki1)} = \frac{-2}{(Ki1 + Ki2)^2}(Vref - Vofopb) + \frac{-2}{Ki1 + Ki2}\frac{\partial Vofopb}{\partial(\delta ki1)} < 0 \qquad (102)$$

$$\frac{\partial VG}{\partial(\delta ki2)} = \frac{-2}{(Ki1 + Ki2)^2}(Vref - Vofopb) < 0 \qquad (103)$$

The right side first term of Expression (102) is negative because Vref>Vofopb. Concerning the right side second term, since partial differential of Vofopb with respect to δki1 is negative from Expression (92), the right side second term is also negative. Therefore, a sign of inequality of Expression (102) holds. Concerning Expression (103), Expression (89), which is negative because Vref>Vofopb, is partially differentiated about δkc2 to obtain the following expression.

Formula 70

$$\frac{\partial VG}{\partial(\delta kc2)} = \frac{-2}{Ki1 + Ki2}\frac{\partial Votopb}{\partial(\delta kc2)} \qquad (104)$$

When Expression (104) corresponding to when Expression (93) is positive is negative, since VG monotonously decreases with respect to δkc2, a range of VG is represented by the following expression.

Formula 71

$$\frac{2(ki1 + 1)Vref}{ki1 + ki2 + 2}\left\{1 - \qquad (105)\right.$$
$$\left.\frac{(ki1 - kc1 + 1)(kc2 + 1) - ko(kc2 - ki1)}{\{(ki1 + 1)(kc2 + 1) + ko(ki1 + 1) - 2ko(kc2 + 1)\}(kc2 - ki1)}\right\}$$
$$< VG < \frac{2ki1Vref}{ki1 + ki2}$$
$$\left\{1 - \frac{(ki1 - kc1 - 1)kc2 - (ko + 1)(kc2 - ki1)}{\{ki1kc2 + ki1(ko + 1) - 2(ko + 1)k2\}(kc2 - ki1)}\right\}$$

If the calibration value of VG is set to VGc represented by Expression (106), which is the median of a range of Expression (105), the calibration value of VG can be derived at accuracy lower than ΔVG represented by Expression (107).

Formula 72

$$VGc = \qquad (106)$$
$$\frac{ki1Vref}{ki1 + ki2}\left\{1 - \frac{(ki1 - kc1 + 1)kc2 - (ko + 1)(kc2 - ki1)}{\{ki1kc2 + ki1(ko + 1) - 2(ko + 1)k2\}(kc2 - ki1)}\right\} +$$
$$\frac{(ki1 + 1)Vref}{ki1 + ki2 + 2}\left\{1 - \frac{(ki1 - kc1 + 1)(kc2 + 1) - ko(kc2 - ki1)}{\{(ki1 + 1)(kc2 + 1) + ko(ki1 + 1) -}\right.$$
$$\left.2ko(kc2 + 1)\}(kc2 - ki1)\right\}$$

$$\Delta VG = \qquad (107)$$
$$\frac{ki1Vref}{ki1 + ki2}\left\{1 - \frac{(ki1 - kc1 - 1)kc2 - (ko + 1)(kc2 - ki1)}{\{ki1kc2 + ki1(ko + 1) - 2(ko + 1)k2\}(kc2 - ki1)}\right\} -$$
$$\frac{(ki1 + 1)Vref}{ki1 + ki2 + 2}\left\{1 - \frac{(ki1 - kc1 + 1)(kc2 + 1) - ko(kc2 - ki1)}{\{(ki1 + 1)(kc2 + 1) + ko(ki1 + 1) -}\right.$$
$$\left.2ko(kc2 + 1)\}(kc2 - ki1)\right\}$$

When Expression (104) corresponding to when Expression (93) is negative is positive, since VG monotonously increases with respect to δkc2, the range of VG is represented by the following expression.

Formula 73

$$\frac{2(ki1 + 1)Vref}{ki1 + ki2 + 2} \qquad (108)$$
$$\left\{1 - \frac{(ki1 - kc1 + 1)kc2 - ko(kc2 - ki1 - 1)}{\{(ki1 + 1)kc2 + ko(ki1 + 1) - 2kokc2\}(kc2 - ki1 - 1)}\right\} <$$
$$VG < \frac{2ki1Vref}{ki1 + ki2}$$
$$\left\{1 - \frac{(ki1 - kc1 - 1)(kc2 + 1) - (ko + 1)(kc2 - ki1 + 1)}{\{ki1(kc2 + 1) + ki1(ko + 1) -}\right.$$
$$\left.2(ko + 1)(k2 + 1)\}(kc2 - kc1 + 1)\right\}$$

If the calibration value of VG is set to VGc represented by Expression (109), which is the median of a range of Expression (108), the calibration value of VG can be derived at accuracy lower than ΔVG represented by Expression (110).

Formula 74

$$VGc = \tag{109}$$

$$\frac{ki1 Vref}{ki1+ki2}\left\{1 - \frac{(ki1-kc1-1)(kc2+1)-(ko+1)(kc2-ki1+1)}{\{ki1(kc2+1)+ki1(ko+1)-2(ko+1)(k2+1)\}(kc2-ki1+1)}\right\} +$$

$$\frac{(ki1+1)Vref}{ki1+ki2+2}$$

$$\left\{1 - \frac{(ki1-kc1+1)kc2-ko(kc2-ki1-1)}{\{(ki1+1)kc2+ko(ki1+1)-2kokc2\}(kc2-ki1-1)}\right\}$$

$$\Delta VG = \tag{110}$$

$$\frac{ki1 Vref}{ki1+ki2}\left\{1 - \frac{(ki1-kc1-1)(kc2+1)-(ko+1)(kc2-ki1+1)}{\{ki1(kc2+1)+ki1(ko+1)-2(ko+1)(k2+1)\}(kc2-ki1+1)}\right\} -$$

$$\frac{(ki1+1)Vref}{ki1+ki2+2}$$

$$\left\{1 - \frac{(ki1-kc1+1)kc2-ko(kc2-ki1-1)}{\{(ki1+1)kc2+ko(ki1+1)-2kokc2\}(kc2-ki1-1)}\right\}$$

As explained above, even when a positive input Vref+Vofop+Vofc is large compared with the negative input voltage Vref of the determiner 32 in the offset polarity determination processing, the calibration values of the offset voltage and the integration unit voltage of the operational amplifier 340 can be derived at predetermined accuracy.

Operation at the time when the sensor circuit is calibrated is the same as the operation at the time when the positive input Vref+Vofop+Vofc is small compared with the negative input voltage Vref of the determiner 32 in the offset polarity determination processing. Therefore, explanation of the operation is omitted. A known voltage output from the variable reference voltage source 100 in this embodiment by the operation is input to the amplifier and the AD converter of the sensor circuit. It is possible to perform calibration of a gain and an offset of the amplifier and an offset of the AD converter from a correlation with the output.

A measuring instrument serving as a reference for calibration is unnecessary on the outside of a sensor node even after sensor circuit setting. The calibration values of the offset and the integration unit voltage can be calculated at predetermined accuracy according to the calibration state of the variable reference voltage source 100 in this embodiment. Therefore, it is possible to perform calibration of the sensor circuit even if the offset and the integration unit voltage change because of a change with time.

Second Configuration of the First Embodiment

Figure 6:
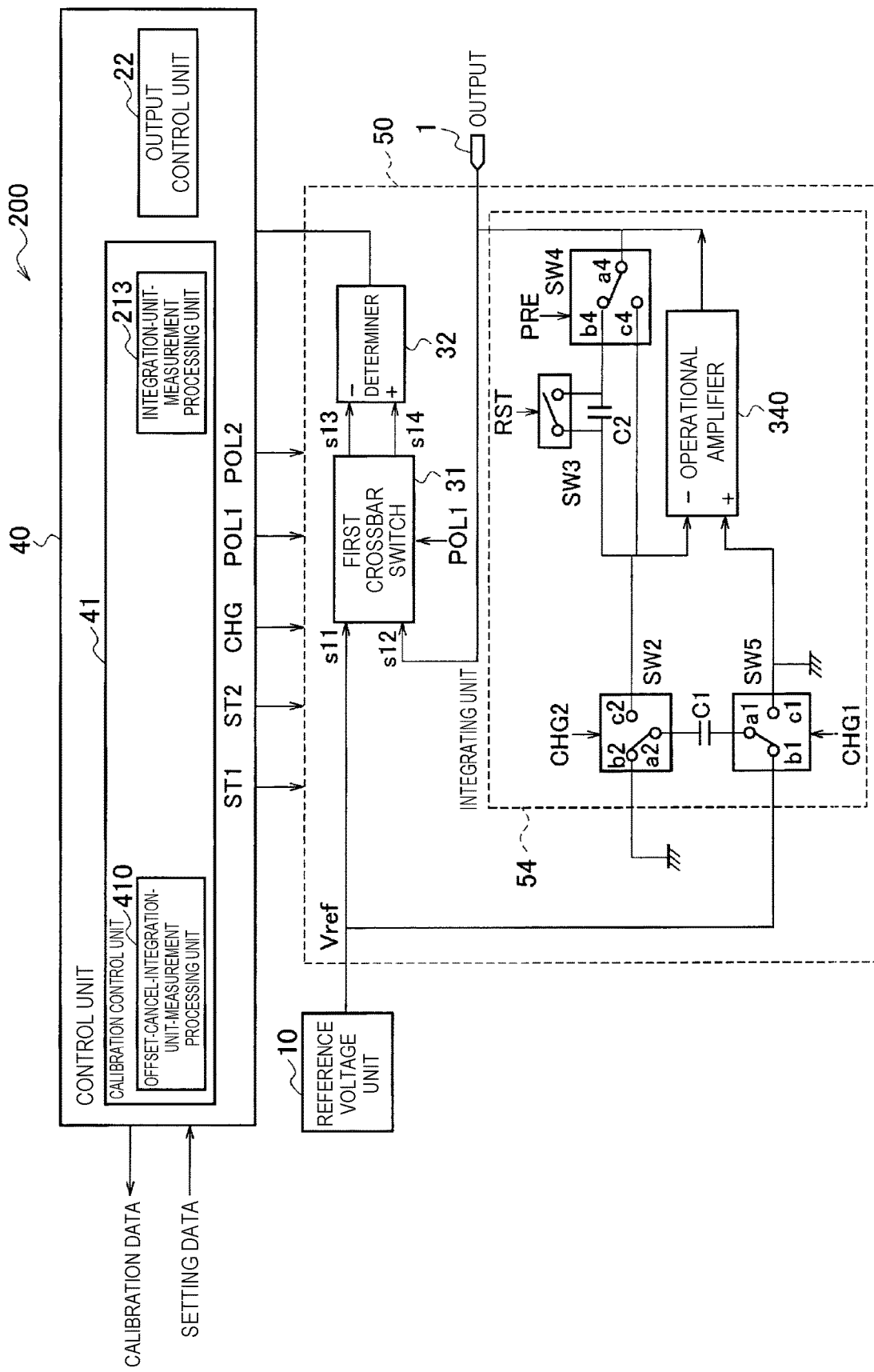
FIG. 6 is a functional block diagram showing another configuration example of an integrated-voltage generating unit shown in FIG. 1.

A second configuration example of the integrated-voltage generating unit in the first embodiment is shown in FIG. 6. An integrated-voltage generating unit 50 in this configuration example is configured by an integrating unit 54, the determiner 32 that has positive and negative inputs and determines that a positive input voltage exceeds a negative input voltage during a calibration state and outputs a determination signal, and the first crossbar switch 31 used for measurement of an offset voltage of the determiner 32.

Connection of SW5, SW2, SW3, SW4, and the first crossbar switch 31 is controlled by operation control signals CHG1, CHG2, RST, PRE, and POL1 output from a control unit 40.

In the calibration state, processing is executed in the order of offset cancel integration unit measurement processing and integration unit measurement processing in this order to calibrate an offset voltage and an integration unit voltage of the operational amplifier 340. An offset-cancel-integration-unit-measurement processing unit 410 of a calibration control unit 41 executes the offset cancel integration unit measurement processing. The integration-unit-measurement processing unit 213 executes the integration unit measurement processing.

The offset cancel integration unit measurement processing is configured by an initial/comparison step, a charge accumulation step, and a charge transfer step.

In the beginning of the offset cancel integration unit measurement processing, SW3 is connected to initialize charges of C2 to zero and connection of a1 and b1 of SW5, connection of a2 and b2 of SW2, and connection of a4 and b4 of SW4, which are connection of SW2 to SW5 in the initial/comparison step and disconnection of SW3 are carried out. After the initialization in the beginning of the offset cancel integration unit measurement processing, the disconnection of SW3 is maintained. The parasitic capacitance Cp is present in the negative input of the operational amplifier 340 as shown in FIG. 2. When the output of the operational amplifier 340 is represented as Vop,0, the charges Q2,0 and Qp,0 accumulated in C2 and Cp are represented by Expression (4) and Expression (5).

Subsequently, in the charge accumulation step, after a4 and c4 of SW4 are connected, a2 and c2 of SW2 are connected. By connecting a4 and c4 of SW4, charges accumulated in C2 are saved. The operational amplifier 340 operates as a unity gain buffer. The output Vopa,1 of the operational amplifier 340 at this time is represented by the following expression.

Formula 75

$$Vopa, 1 = A(Vofop - Vopa, 1) \tag{111}$$

$$Vopa, 1 = \frac{A}{A+1} Vofop$$

A differential voltage between the reference voltage Vref and Vopa,1 is applied to C1. The charges Q1a,1, Q2a,1, and Qpa,1 accumulated in C1, C2, and Cp in this step are represented by the following expression.

Formula 76

$$Q1a, 1 = C1\left(Vref - \frac{A}{A+1} Vofop\right) \tag{112}$$

$$Q2a, 1 = Q2, 0 = C2\left(\frac{A+1}{A} Vopb, 0 - Vofop\right) \tag{113}$$

$$Qpa, 1 = Cp \frac{A}{A+1} Vofop \tag{114}$$

In the charge transfer step, after a4 and b4 of SW4 are connected, a1 and c1 of SW5 are connected. The charges Q1b,1, Q2b,1, and Qpb,1 accumulated in C1, C2, and Cp in this step are represented by the following expression.

Formula 77

$$Q1b, 1 = -C1\left(-\frac{1}{A}Vopb, 1 + Vofop\right) \quad (115)$$

$$Q2b, 1 = C2\left(\frac{A+1}{A}Vopb, 1 - Vofop\right) \quad (116)$$

$$Qpb, 1 = Cp\left(-\frac{1}{A}Vopb, 1 + Vofop\right) \quad (117)$$

Charges accumulated in the capacitors connected to the negative input of the operational amplifier 340 before and after the charge transfer step are salved. Accordingly, a relational expression between Vopb,1 and Vop,0 is as follows.

Formula 78

$$-Q1a, 1 + Qpa, 1 - Q2a, 1 = -Q1b, 1 + Qpb, \quad (118)$$
$$1 - Q2b, 1 - C1\left(Vref - \frac{A}{A+1}Vofop\right) +$$
$$Cp\frac{A}{A+1}Vofop - C2\left(\frac{A+1}{A}Vop, 0 - Vofop\right) =$$
$$C1\left(-\frac{1}{A}Vopb, 1 + Vofop\right) + Cp\left(-\frac{1}{A}Vopb, 1 + Vofop\right) -$$
$$C2\left(\frac{A+1}{A}Vopb, 1 - Vofop\right)\left(\frac{C1}{A} + \frac{Cp2}{A} + \frac{A+1}{A}C2\right)Vopb,$$
$$1 = C1\left(Vref - \frac{A}{A+1}Vofop + Vofop\right) + C2\frac{A+1}{A}Vop,$$
$$0 + Cp\left(Vofop - \frac{A}{A+1}Vofop\right)$$
$$Vopb, 1 = \frac{AC1}{C1 + Cp + (A+1)C2}\left(Vref + \frac{1}{A+1}Vofop\right) +$$
$$\frac{(A+1)C2}{C1 + Cp + (A+1)C2}Vop, 0 + \frac{Cp}{C1 + Cp + (A+1)C2}\frac{A}{A+1}Vofop$$

When the processing transitions to the initial/comparison step again, the charges Q2,1 and Qp,1 accumulated in C2 and Cp are represented by expressions obtained by replacing Vop,0, Q2,0, and Qp,0 respectively with Vop,1, Q2,1, and Qp,1 in Expression (4) and Expression (5). Charges accumulated in the capacitors connected to the negative input of the operational amplifier before and after the transition to the initial/comparison step are saved. Accordingly, a relational expression between Vop,1 and Vopb,1 is as follows.

Formula 79

$$Qpb,_1 = Q2b,_1 = Qp,_1 - Q2,_1 \quad (119)$$
$$Cp\left(-\frac{1}{A}Vopb, 1 + Vofop\right) - C2\left(\frac{A+1}{A}Vopb, 1 - Vofop\right) =$$
$$Cp\left(-\frac{1}{A}Vop, 1 + Vofop\right) - C2\left(\frac{A+1}{A}Vop, 1 - Vofop\right)$$
$$Vop, 1 = Vopb, 1$$

Therefore, a relational expression between Vop,1 and Vop,0 is the following expression.

Formula 80

$$Vop, 1 = \frac{AC1}{C1 + Cp + (A+1)C2}\left(Vref + \frac{1}{A+1}Vofop\right) + \quad (120)$$
$$\frac{(A+1)C2}{C1 + CP + (A+1)C2}Vop, 0 + \frac{Cp}{C1 + Cp + (A+1)C2}\frac{A}{A+1}$$

As in the derivation of Expression (18), when the relational expression between Vop,1 and Vop,0 is represented in the form of Expression (11), B1, η, and −ηB0 are represented by the following expression.

Formula 81

$$B1 = \frac{(A+1)C2}{C1 + Cp + (A+1)C2} = 1 - \frac{C1 + Cp}{C1 + Cp + (A+1)C2} = 1 - \eta \quad (121)$$

$$\eta = \frac{C1 + CP}{C1 + Cp + (A+1)C2} \quad (122)$$

$$-\eta B0 = \frac{AC1}{C1 + Cp + (A+1)C2}\left(Vref + \frac{1}{A+1}Vofop\right) + \quad (123)$$
$$\frac{Cp}{C1 + Cp + (A+1)C2}\frac{A}{A+1}Vofop$$

Vop,0 is the same as Expression (17). The output Vop,k of the operational amplifier 340 at the time when it is assumed that η≪1 as in the derivation of Expression (18) and the initial/comparison step, the charge accumulation step, and the charge transfer step are repeated k times is represented by the following expression by substituting Expression (17), Expression (122), and Expression (123) in Expression (16).

Formula 82

$$Vop,_k = Vop,_0 - k\eta(Vop,_0 + B0) \quad (124)$$
$$Vop,_k = \frac{A}{A+1}Vofop + k\left\{-\frac{C1 + Cp}{C1 + Cp + (A+1)C2}\frac{A}{A+1}Vofop + \right.$$
$$\frac{AC1}{C1 + Cp + (A+1)C2}\left(Vref + \frac{1}{A+1}Vofop\right) +$$
$$\left.\frac{Cp}{C1 + Cp + (A+1)C2}\frac{A}{A+1}Vofop\right\}$$
$$Vop,_k = k\frac{AC1}{C1 + Cp + (A+1)C2}Vref + \frac{A}{A+1}Vofop$$

In the state in which s11 and s13 of the first crossbar switch 31 are connected and s12 and s14 of the first crossbar switch 31 are connected, the output of the operational amplifier 340 is connected to the positive input of the determiner 32 and Vref is connected to the negative input of the determiner 32. As in the explanation with reference to FIG. 4, Vopb,k+Vofc increases and approaches Vref as the number of times of integration increases. When the number of times the determination signal is detected for the first time is represented as kr1+1, kr1 is defined as a first number of times of offset cancel integration. The following equation holds about the first number of times of offset cancel integration kr1.

Formula 83

$$Vref = VGr(kr1 + \delta kr1) + Vofopb + Vofc \quad (125)$$

$$VGr = \frac{AC1}{C1 + CP + (A+1)C2} Vref \quad (126)$$

In Expression (125), the left side is a negative input voltage of the determiner 32 and the right side is a voltage obtained by adding the offset voltage of the determiner 32 to a positive input voltage. δkr1 is a real number equal to or larger than 0 and smaller than 1. VGrδkr1 represents a difference between Vref and an output of the operational amplifier 340 at the time of the first number of times of offset cancel integration kr1 and the offset voltage of the determiner. Vofopb in Expression (125) is the same as Expression (35).

In the state in which s11 and s14 of the first crossbar switch 31 are connected and s12 and s13 of the first crossbar switch 31 are connected, Vref is connected to the positive input of the determiner 32 and the output of the operational amplifier 340 is connected to the negative input of the determiner 32. The charge transfer step and the charge accumulation/comparison step are repeated and, in the state in which s11 and s14 of the first crossbar switch 31 are connected and s12 and s13 of the first crossbar switch 31 are connected, when the number of times the determination signal is detected for the first time is represented as kr2+1, kr2 is defined as a second number of times of offset cancel integration. The following equation holds about the second number of times of offset cancel integration kr2.

Formula 84

$$VGr(kr2+\delta kr2)+Vofopb=Vref+Vofc \quad (127)$$

In Expression (127), the left side is a negative input voltage of the determiner 32 and the right side is a voltage obtained by adding the offset voltage of the determiner 32 to a positive input voltage. δkr2 is a real number equal to or larger than 0 and smaller than 1.

In the integration unit measurement processing, first, a4 and b4 of SW4 are connected and SW3 is connected to reset charges accumulated in C2. After the reset of the charges, SW4 maintains the connection of a4 and b4. Thereafter, the charge transfer step and the charge accumulation/comparison step are repeatedly carried out to calculate the number of times of integration in which the determination signal is output in the state in which s11 and s13 of the first crossbar switch 31 are connected and s12 and s14 of the first crossbar switch 31 are connected.

In the charge accumulation/comparison step of the integration unit measurement processing, a1 and b1 of SW5 are connected and a2 and b2 of SW2 are connected. In the charge transfer step, a1 and c1 of SW5 are connected and a2 and c2 of SW2 are connected. Operation in the integration unit measurement processing is the same as the operation in the integration unit measurement processing in the first embodiment. A relation between the number of times of repetition k of the charge transfer step and the charge accumulation/comparison step and the output Vop,k of the operational amplifier 340 is the same as Expression (49).

In the state in which s11 and s13 of the first crossbar switch 31 are connected and s12 and s14 of the first crossbar switch 31 are connected, the output of the operational amplifier 340 is connected to the positive input of the determiner 32 and Vref is connected to the negative input of the determiner 32.

As in the explanation with reference to FIG. 4, Vopb,k+Vofc increases and approaches Vref as the number of times of integration increases. When the number of times the detection signal is detected for the first time is represented as ki+1, ki is defined as a first number of times of integration. Expression (50) holds about the first number of times of integration ki1.

The following expression holds from Expression (33) and Expression (126).

Formula 85

$$VG = \frac{Vref + Vofopb}{Vref} VGr \quad (128)$$

In order to simplify expression expansion, it is assumed that Kr1=kr1+δkr1, Kr2=kr2+δkr2, and Ki1=ki1+δki1. A difference between Expression (125) and Expression (50) is calculated and Expression (128) is substituted in an expression obtained by the calculation to obtain the following expression about Vofopb.

Formula 86

$$0 = VGr\, Kr1 - VG\, Ki1 \quad (129)$$
$$0 = VGr\, Kr1 - \frac{Vref + Vofopb}{Vref} VGr\, Ki1$$
$$0 = VGr\, Kr1 - (Vref + Vofopb)Ki1$$
$$Vofopb = \frac{Kr1 - Ki1}{Ki1} Vref$$

A difference between Expression (127) and Expression (128) is calculated to obtain the following expression about VGr.

Formula 87

$$Vref - VGr\, Kr2 - Vofopb = VGrKr1 + Vofopb - Vref \quad (130)$$
$$(Kr1 + Kr2)VGr = 2(Vref - Vofopb)$$
$$VGr = \frac{2(Vref - Vofopb)}{Kr1 + Kr2}$$

Calibration values of Vofopb and VGr are determined by medians of ranges of Vofopb and VGr as in the first embodiment.

Expression (129) is partially differentiated about δkr1 and δki1 to obtain the following expression.

Formula 88

$$\frac{\partial Vofopb}{\partial (\delta kr1)} = \frac{1}{Ki1} Vref > 0 \quad (131)$$

$$\frac{\partial Vofopb}{\partial (\delta ki1)} = -\frac{Kr1}{Ki1^2} Vref < 0 \quad (132)$$

According to Expression (131) and Expression (132), Vofopb monotonously increases with respect to δkr1 and monotonously decreases with respect to δki1. Accordingly, a range of Vofopb is represented by the following expression.

Formula 89

$$\frac{kr1-ki1-1}{ki1+1}Vref < Vofopb < \frac{kr1-ki1+1}{ki1}Vref \quad (133)$$

If a calibration value of Vofopb is set to Vofopc represented by Expression (134), which is the median of a range of Expression (133), the calibration value of Vofopb can be derived at accuracy lower than ΔVofopb represented by Expression (135).

Formula 90

$$Vofopc = \frac{kr1-ki1+1}{2ki1}Vref + \frac{kr1-ki1-1}{2(ki1+1)}Vref \quad (134)$$

$$\Delta Vofopb = \frac{kr1-ki1+1}{2ki1}Vref - \frac{kr1-ki1-1}{2(ki1+1)}Vref \quad (135)$$

When Expression (130) is partially differentiated about δkr1, δkr2, and δki1 to obtain the following expressions.

Formula 91

$$\frac{\partial VGr}{\partial(\delta kr1)} = -\frac{2(Vref - Vofopb)}{(Kr1+Kr2)^2} - \frac{2}{Kr1+Kr2}\frac{\partial Vofopb}{\partial(\delta kr1)} < 0 \quad (136)$$

$$\frac{\partial VGr}{\partial(\delta kr2)} = -\frac{2(Vref - Vofopb)}{(Kr1+Kr2)^2} < 0 \quad (137)$$

$$\frac{\partial Vofopb}{\partial(\delta ki1)} = -\frac{2}{Kr1+Kr2}\frac{\partial Vofopb}{\partial(\delta ki1)} > 0 \quad (138)$$

About a sign of inequality of Expression (136), Vref>Vofopb and ∂Vofopb/∂(δkr1)>0 are used. About a sign of inequality of Expression (137), Vref>Vofopb is used. About a sign of inequality of Expression (138), ∂Vofopb/∂(δki1)<0 is used. According to Expression (136), Expression (137), and Expression (138), VGr monotonously decreases with respect to δkr1 and δkr2 and monotonously increases with respect to δki1. Accordingly, a range of VGr is represented by the following expression.

Formula 92

$$\frac{2Vref}{kr1+kr2+2}\frac{2ki1-kr1-1}{ki1} < VGr < \frac{2Vref}{kr1+kr2}\frac{2ki1-kr1+2}{ki1+1} \quad (139)$$

If a calibration value of VGr is set to VGrc represented by Expression (140), which is the median of a range of Expression (139), the calibration value of VGr can be derived at accuracy lower than ΔVGr represented by Expression (141).

Formula 93

$$VGrc = \frac{Vref}{kr1+kr2}\frac{2ki1-kr1+2}{ki1+1} + \frac{Vref}{kr1+kr2+2}\frac{2ki1-kr1-1}{ki1} \quad (140)$$

$$\Delta VGr = \frac{Vref}{kr1+kr2}\frac{2ki1-kr1+2}{ki1+1} - \frac{Vref}{kr1+kr2+2}\frac{2ki1-kr1-1}{ki1} \quad (141)$$

As explained above, in the configuration example in the second embodiment as well, calibration values of the offset voltage and the integration unit voltage of the operational amplifier 340 can be derived at predetermined accuracy.

As operation at the time when the sensor circuit is calibrated, a variable reference voltage source 200 in this embodiment is set in an output state and a voltage set by setting data including the number of times of integration k is output. In the output state, after the setting data is acquired by the control unit 40, charges accumulated in C2 are initialized by closing SW3. Subsequently, SW3 is opened to sequentially repeatedly execute, the number of times of integration k, the initial/comparison step, the charge accumulation step, and the charge transfer step in the number of times of offset cancel integration measurement processing. When the charge transfer step and the charge accumulation/comparison step for the number of times of integration are completed, the control unit 40 outputs calibration data representing the completion.

A voltage output from the variable reference voltage source 200 at this time can be derived from Expression (124) using the calibration values of the integration unit voltage VGr and Vofopb derived in the calibration state. Therefore, the voltage can be treated as a known voltage. Therefore, the known voltage output from the variable signal source for calibration is input to the amplifier and the AD converter of the sensor circuit. It is possible to calibrate an offset and a gain of the amplifier and an offset of the AD converter from a correlation with the output.

A measuring instrument serving as a reference for calibration is unnecessary on the outside of a sensor node even after sensor circuit setting. The calibration values of the offset and the integration unit voltage can be calculated at predetermined accuracy according to the calibration state of the variable reference voltage source 200 in this embodiment. Therefore, it is possible to perform calibration of the sensor circuit even if the offset and the integration unit voltage change because of a change with time.

Third Configuration Example of the First Embodiment

Figure 7:
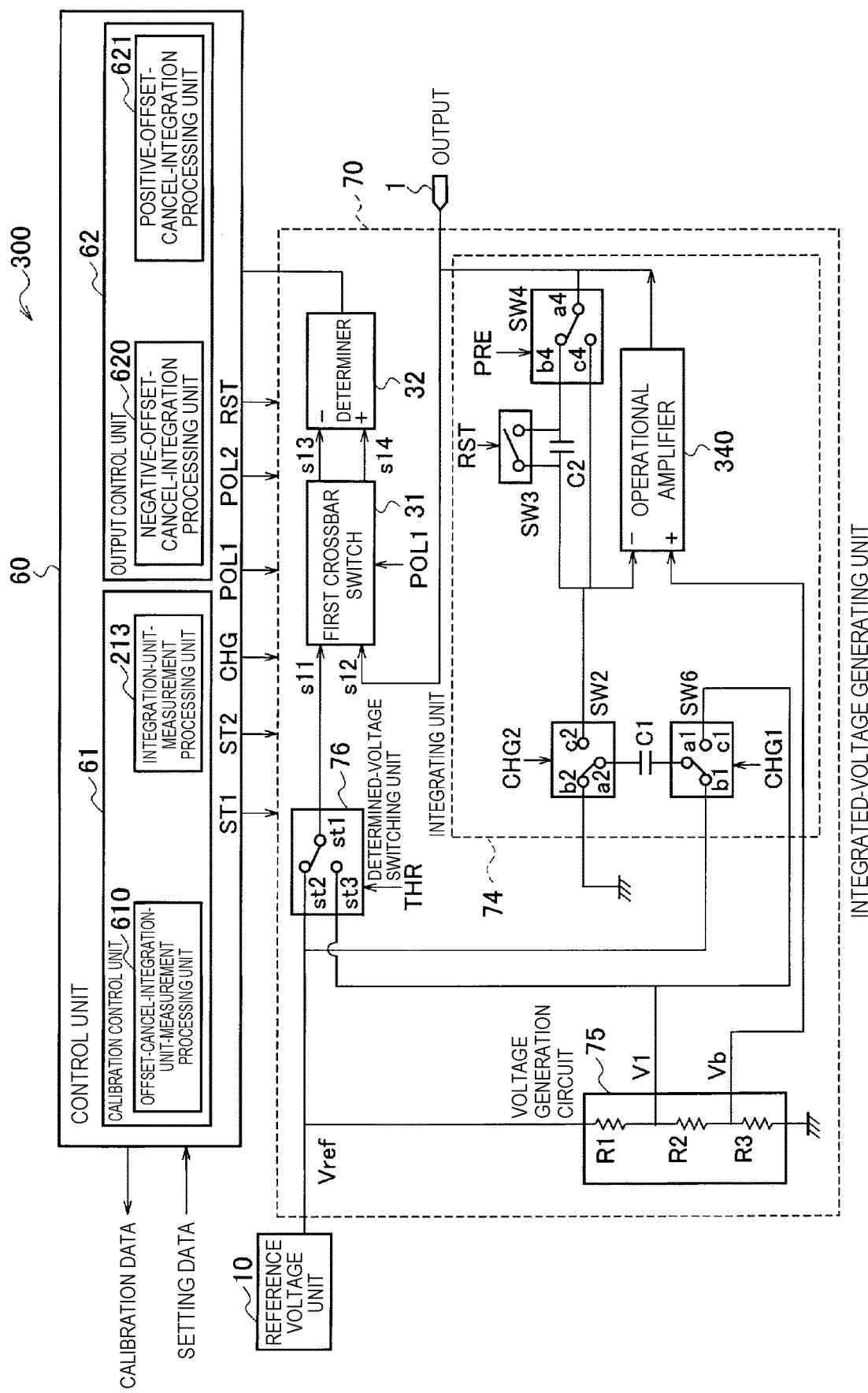
FIG. 7 is a functional block diagram showing another configuration example of the integrated-voltage generating unit shown in FIG. 1.

A third configuration example of the integrated-voltage generating unit in the first embodiment is shown in FIG. 7. An integrated-voltage generating unit 70 in this embodiment is configured by an integrating unit 74, the determiner 32 that has positive and negative inputs and determines that a positive input voltage exceeds a negative input voltage during a calibration state and outputs a determination signal, the first crossbar switch 31 used for measurement of an offset voltage of the determiner 32, a voltage generation circuit 75 that generates a bias voltage Vb and intermediate potential V1 of the integrating unit 74, and a determined-voltage switching unit 76 that switches a voltage serving as a reference applied to the determiner 32 through the first crossbar switch 31 at during the calibration state.

Connection of SW2, SW3, SW4, SW6, the first crossbar switch 31, and the determined-voltage switching unit 76 is controlled by operation control signals CHG1, CHG2, RST, PRE, POL1, and THD output from a control unit 60.

This configuration example is different from the configuration example shown in FIG. 6 in that the integrating unit is biased by Vb and the integration unit voltage can be set smaller than V1.

In the calibration state, processing is executed in the order of the offset cancel integration unit measurement processing and the integration unit measurement processing to calibrate a bias voltage and an offset voltage and an integration unit voltage of the operational amplifier 340.

In the configuration example of the integrated-voltage generating unit 70 shown in FIG. 7, in the offset cancel integration unit measurement processing, the number of times of integration in which a determination signal switches in two states explained below is measured. A first state is, when st1 and st3 of the determined-voltage switching unit 76 are connected and V1 is input to the determiner 32, a state in which s11 and s13 of the first crossbar switch 31 are connected and s12 and s14 of the first crossbar switch 31 are connected and a state in which s11 and s14 of the first crossbar switch 31 are connected and s12 and s13 of the first crossbar switch 31 are connected. A second state is, when st1 and st3 of the determined-voltage switching unit 76 are connected and Vref is input to the determiner 32, a state in which s11 and s13 of the first crossbar switch 31 are connected and s12 and s14 of the first crossbar switch 31 are connected and a state in which s11 and s14 of the first crossbar switch 31 are connected and s12 and s13 of the first crossbar switch 31 are connected.

The operation of integration in the offset cancel integration unit measurement processing is configured by an initial/comparison step, a charge accumulation step, and a charge transfer step.

In the beginning of the offset cancel integration unit measurement processing, SW3 is connected to initialize charges of C2 to zero and connection of a1 and b1 of SW6, connection of a2 and b2 of SW2, and connection of a4 and b4 of SW4, which are connection of SW2, SW3, SW4, and SW6 of the initial/comparison step and disconnection of SW3 are carried out. After the initialization in the beginning of the offset cancel integration unit measurement processing, SW3 maintains the disconnection. When an output of the operational amplifier 340 is represented as Vop,0, the charge Q2,0 accumulated in C2 is represented by the following expression in which Vofop in Expression (4) is changed to Vofop+Vb.

Formula 94

$$Q2,0 = C2\left\{\frac{A+1}{A}Vop, 0 - (Vofop + Vb)\right\} \quad (142)$$

In the charge accumulation step, after a4 and c4 of SW4 are connected, a2 and c2 of SW2 are connected. By connecting a4 and c4 of SW4, charges accumulated in C2 are saved. The operational amplifier 340 operates as a unity gain buffer. The output Vopa,1 of the operational amplifier 340 at this time is represented by the following expression.

Formula 195

$$Vopa, 1 = \frac{A}{A+1}(Vofop + Vb) \quad (143)$$

A differential voltage between the reference voltage Vref and Vopa,1 is applied to C1. The charges Q1a,1, Q2a,1, and Qpa,1 accumulated in C1, C2, and Cp in this step are represented by the following expressions.

Formula 96

$$Q1a, 1 = C1\left\{Vref - \frac{A}{A+1}(Vofop + Vb)\right\} \quad (144)$$

$$Q2a, 1 = Q2,0 = C2\left(\frac{A+1}{A}Vobp, 0 - Vofop - Vb\right) \quad (145)$$

$$Qpa, 1 = Cp\frac{A}{A+1}(Vofop + Vb) \quad (146)$$

In the charge transfer step, after a4 and b4 of SW4 are connected, a1 and c1 of SW6 are connected. Since c1 of SW6 is connected to V1, the charges Q1b,1, Q2b,1, and Qpb,1 accumulated in C1, C2, and Cp in this step are represented by the following expressions.

Formula 97

$$Q1b, 1 = C1\left\{V1 + \frac{1}{A}Vopb, 1 - (Vofop + Vb)\right\} \quad (147)$$

$$Q2b, 1 = C2\left(\frac{A+1}{A}Vobp, 1 - (Vofop - Vb)\right) \quad (148)$$

$$Qpb, 1 = Cp\left\{-\frac{1}{A}Vopb, 1 + (Vofop + Vb)\right\} \quad (149)$$

Charges accumulated in a capacitor connected to the negative input of the operational amplifier 340 before and after the charge transfer step are saved. Accordingly, a relational expression between Vopb,1 and Vop,0 is as follows.

Formula 98

$$-Q1a, 1 + Qpa, 1 - Q2a, 1 = -Q1b, 1 + Qpb, 1 - Q2b, 1 \quad (150)$$

$$-C1\left\{Vref - \frac{A}{A+1}(Vofop + Vb)\right\} +$$

$$Cp\frac{A}{A+1}(Vofop + Vb) - C2\left(\frac{A+1}{A}Vop, 0 - Vofop - Vb\right) -$$

$$C1\left(V1 + \frac{1}{A}Vopb, 1 - Vofop - Vb\right) +$$

$$Cp\left(-\frac{1}{A}Vopb, 1 + Vofop + Vb\right) -$$

$$C2\left(\frac{A+1}{A}Vobp, 1 - Vofop - Vb\right)$$

$$\left(\frac{C1}{A} + \frac{Cp2}{A} + \frac{A+1}{A}C2\right)Vopb,$$

$$1 = C1\left\{Vref - V1 + \frac{1}{A+1}(Vofop + Vb)\right\} + C2\frac{A+1}{A}Vop,$$

$$0 + Cp\frac{1}{A+1}(Vofop + Vb)$$

$$Vopb, 1 = \frac{AC1}{C1 + Cp + (A+1)C2}\left\{Vref - V1 + \frac{1}{A+1}(Vofop + Vb)\right\} +$$

$$\frac{(A+1)C2}{C1 + Cp + (A+1)C2}Vop,$$

$$0 + \frac{Cp}{C1 + Cp + (A+1)C2}\frac{A}{A+1}(Vofop + V1)$$

The output Vop,1 of the operational amplifier 340 at the time when the processing transitions to the initial/comparison step again is the same as Vopb,1 as in the second configuration example shown in FIG. 6. Accordingly, a relational expression between Vop,1 and Vop,0 is as follows.

Formula 99

$$Vop,1 = \frac{AC1}{C1+Cp+(A+1)C1}\left\{Vref-V1+\frac{1}{A+1}(Vofop+Vb)\right\}+ \quad (151)$$
$$\frac{(A+1)c2}{C1+CP+(A+1)C2}Vop,$$
$$0+\frac{Cp}{C1+Cp+(A+1)C2}\frac{A}{A+1}(Vofop+V1)$$

As in the derivation of Expression (18), when the relational expression between Vop,1 and Vop,0 is represented in the form of Expression (11), B1, η, and −ηB0 are represented by the following expressions.

Formula 100

$$B1 = \frac{(A+1)C2}{C1+Cp+(A+1)C2} = 1 - \frac{C1+Cp}{C1+Cp+(A+1)C2} = 1-\eta \quad (152)$$

$$\eta = \frac{C1+Cp}{C1+Cp+(A+1)C2} \quad (153)$$

$$-\eta B0 = \frac{AC1}{C1+Cp+(A+1)C2}\left\{Vref-V1+\frac{1}{A+1}(Vofop+Vb)\right\}+ \quad (154)$$
$$\frac{Cp}{C1+Cp+(A+1)C2}\frac{A}{A+1}(Vofop+Vb)$$

Vop,0 is represented by the following expression in which Vofop in Expression (17) is changed to Vofop+Vb.

Formula 101

$$Vop,0 = \frac{A}{A+1}(Vofop+Vb) \quad (155)$$

The output Vop,k of the operational amplifier 340 at the time when it is assumed that η<<1 as in the derivation of Expression (18) and the initial/comparison step, the charge accumulation step, and the charge transfer step are repeated k times is represented by the following expressions by substituting Expression (155), Expression (153), and Expression (154) in Expression (16).

Formula 102

$$Vop,k = Vop,0 - k\eta(Vop,0+B0) \quad (156)$$

$$Vop,k = \frac{A}{A+1}(Vofop+Vb)+ \quad (157)$$
$$k\left\{-\frac{C1+Cp}{C1+Cp+(A+1)C2}\frac{A}{A+1}(Vofop+Vb)+\right.$$
$$\frac{AC1}{C1+CP+(A+1)C2}\left[Vref-V1+\frac{1}{A+1}(Vofop+Vb)\right]+$$
$$\left.\frac{CP}{C1\ Cp+(A+1)C2}\frac{A}{A+1}(Vofop+Vb)\right\}$$

$$Vop,k = k\frac{AC1}{C1+CP+(A+1)C2}(Vref-V1)+\frac{A}{A+1}(Vofop+Vb) \quad (158)$$

$$VGp = \frac{AC1}{C1+Cp+(A+1)C2}(Vref-V1)$$

$$Vofb = \frac{A}{A+1}(Vofop+Vb)$$

In the above explanation, explanation of an initial/comparison state for derivation of the output Vop,k by the operational amplifier 340 is simplified. However, in an actual initial/comparison state, after connection of a1 and b1 of SW6, connection of a2 and b2 of SW2, and connection of a4 and b4 of SW4 are carried out, for comparison of V1 and an output of the operational amplifier 340, st1 and st3 of the determined-voltage switching unit 76 are connected and s11 and s13 of the first crossbar switch 31 are connected and s12 and s14 of the first crossbar switch 31 are connected, and an output of the operational amplifier 340 is input to the positive input of the determiner 32 and V1 is input to the negative input of the determine 32. Thereafter, the determined-voltage switching unit 76 maintains the connection, s11 and s14 of the first crossbar switch 31 are connected and s12 and s13 of the first crossbar switch 31 are connected, V1 is input to the positive input of the determiner 32, and an output of the operational amplifier 340 is input to the negative input of the determiner 32. After the output of the operational amplifier 340 is large in all the connections of the first crossbar switch 31 in the comparison of the intermediate potential V1 and the output of the operational amplifier 340 described above, for comparison of Vref and the output of the operational amplifier 340, st1 and st2 of the determined-voltage switching unit 76 are connected, s11 and s13 of the first crossbar switch 31 are connected and s12 and s14 of the first crossbar switch 31 are connected, the output of the operational amplifier 340 is input to the positive input of the determiner 32, and Vref is input to the negative input of the determiner 32. Thereafter, the determined-voltage switching unit 76 maintains the connection, s11 and s14 of the first crossbar switch 31 are connected and s12 and s13 of the first crossbar switch 31 are connected, Vref is input to the positive input of the determiner 32, and the output of the operational amplifier 340 is input to the negative input of the determiner 32.

In a state in which st1 and st3 of the determined-voltage switching unit 76 are connected and s11 and s13 of the first crossbar switch 31 are connected and s12 and s14 of the first crossbar switch 31 are connected, the output of the operational amplifier 340 is connected to the positive input of the determiner 32 and V1 is connected to the negative input of the determiner 32. Vopb,k+Vofc increases and approaches V1 as the number of times of integration increases. When the number of times the determination signal is detected for the first time is represented as kc+1, kc is defined as a first number of times of intermediate potential integration. The following equation holds about the first number of times of intermediate potential integration kc1.

Formula 103

$$V1 = VGp(kc1+\delta kc1)+Vofb+Vofc \quad (159)$$

In Expression (159), the left side is a negative input voltage of the determiner 32 and the right side is a voltage obtained by adding the offset voltage of the determiner 32 to a positive input voltage. δkc1 is a real number equal to or larger than 0 and smaller than 1. VGpδkc1 represents a difference between V1 and an output of the operational amplifier 340 at the time of the number of times of integration kc1 and the offset voltage of the determiner.

In a state in which st1 and st3 of the determined-voltage switching unit 76 are connected and s11 and s14 of the first crossbar switch 31 are connected and s12 and s13 of the first crossbar switch 31 are connected, V1 is connected to the positive input of the determine 32 and the output of the operational amplifier 340 is connected to the negative input of the determiner 32. The charge transfer step and the charge accumulation/comparison step are repeated and, in the state in which s11 and s14 of the first crossbar switch 31 are connected and s12 and s13 of the first crossbar switch 31 are connected, when the number of times the determination signal is detected for the first time is represented as kc2+1, kc2 is defined as a second number of times of intermediate potential integration. The following equation holds about the second number of times of intermediate potential integration kc2.

Formula 104

$$VGp(kc2+\delta kc2)+Vofb=V1+Vofc \quad (160)$$

In Expression (160), the left side is a negative input voltage of the determiner 32 and the right side is a voltage obtained by adding the offset voltage of the determiner 32 to a positive input voltage. δkc2 is a real number equal to or larger than 0 and smaller than 1.

In a state in which st1 and st2 of the determined-voltage switching unit 76 are connected and s11 and s13 of the first crossbar switch 31 are connected and s12 and s14 of the first crossbar switch 31 are connected, an output of the operational amplifier 340 is connected to the positive input of the determiner 32 and Vref is connected to the negative input of the determiner 32. Vopb,k+Vofc increases and approaches Vref as the number of times of integration increases. When the number of times the determination signal is detected for the first time is represented as kr+1, kr is defined as a first number of times of offset cancel integration. The following equation holds about the first number of times of offset cancel integration kr1.

Formula 105

$$Vref=VGp(kr1+\delta kr1)+Vofb+Vofc \quad (161)$$

In Expression (161), the left side is a negative input voltage of the determiner 32 and the right side is a voltage obtained by adding the offset voltage of the determiner 32 to a positive input voltage. δkr1 is a real number equal to or larger than 0 and smaller than 1. VGpδkr1 represents a difference between Vref and an output of the operational amplifier 340 at the time of the number of times integration kr1 and the offset voltage of the determiner.

In a state in which st1 and st2 of the determined-voltage switching unit 76 are connected and s11 and s14 of the first crossbar switch 31 are connected and s12 and s13 of the first crossbar switch 31 are connected, Vref is connected to the positive input of the determiner 32 and the output of the operational amplifier 340 is connected to the negative input of the determiner 32. The charge transfer step and the charge accumulation/comparison step are repeated and, in the state in which s11 and s14 of the first crossbar switch 31 are connected and s12 and s13 of the first crossbar switch 31 are connected, when the number of times the determination signal is detected for the first time is represented as kr2+1, kr2 is defined as a second number of times of offset cancel integration. The following equation holds about the second number of times of offset cancel integration kr2.

Formula 106

$$VGp(kr2+\delta kr2)+Vofb=Vref+Vofc \quad (162)$$

In Expression (162), the left side is a negative input voltage of the determiner 32 and the right side is a voltage obtained by adding the offset voltage of the determiner 32 to a positive input voltage. δkr2 is a real number equal to or larger than 0 and smaller than 1.

In the integration unit measurement processing, first, a4 and b4 of SW4 are connected and SW3 is connected to reset charges accumulated in C2. After the reset of the charges, SW4 maintains the connection of a4 and b4. Thereafter, the charge transfer step and the charge accumulation/comparison step are repeatedly carried out and the number of times of integration is calculated in which the determination signal is output in the state in which s11 and s13 of the crossbar switch 1 are connected and s12 and s14 of the crossbar switch 1 are connected.

In the charge accumulation/comparison step of the integration unit measurement processing, a1 and b1 of SW6 are connected and a2 and b2 of SW2 are connected. In the charge transfer step, a1 and c1 of SW6 are connected and a2 and c2 of SW2 are connected. The operation of the switch in the integration unit measurement processing is the same as the operation in the integration unit measurement processing in the embodiment shown in FIG. 6. This configuration example is different from the embodiment shown in FIG. 6 in that the positive input of the operational amplifier 340 is connected to Vb and c1 of SW6 is connected to V1.

When an output of the operational amplifier 340 in the first charge accumulation/comparison step is represented as Vop,0, the charges Q1,0, Q2,0, and Qp,0 accumulated in C1, C2, and Cp are represented by the following expressions.

Formula 107

$$Q1,0 = C1\ Vref \quad (163)$$

$$Q2,0 = C2\left\{\frac{A+1}{A}Vop,0 - (Vofop + Vb)\right\} \quad (164)$$

$$Qp,0 = Cp\left\{-\frac{1}{A}Vop,0 + (Vofop + Vb)\right\} \quad (165)$$

When the output of the operational amplifier 340 in the charge transfer step is represented as Vopa,1, the charges Q1a,1, Q2a,1, and Qpa,1 accumulated in C1, C2, and Cp are represented by the following expressions.

Formula 108

$$Q1a,1 = C1\left\{V1 + \frac{1}{A}Vopa,1 - (Vofop + Vb)\right\} \quad (166)$$

$$Q2a,1 = C2\left\{\frac{A+1}{A}Vopa,1 - (Vofop + Vb)\right\} \quad (167)$$

$$Qpa,1 = Cp\left\{-\frac{1}{A}Vopa,1 + (Vofop + Vb)\right\} \quad (168)$$

The charge conservation holds about charges accumulated in a capacitor connected to the negative input of the operational amplifier 340 before and after the charge transfer step. Therefore, the following relational expression holds between Vopa,1 and Vop,0.

Formula 109

$$-Q1, 0 + Qp, 0 - Q2, 0 = -Q1a, 1 + Qpa, 1 - Q2a, 1 \quad (169)$$

$$-C1 \, Vref + Cp\left\{-\frac{1}{A}Vop, 0 + (Vofop + Vb)\right\} -$$

$$C2\left\{\frac{A+1}{A}Vop, 0 - (Vofop + Vb)\right\} =$$

$$-C1\left\{V1 + \frac{1}{A}Vopa, 1 - (Vofop + Vb)\right\} +$$

$$Cp\left\{-\frac{1}{A}Vopa, 1 + (Vofop + Vb)\right\} -$$

$$C2\left\{\frac{A+1}{A}Vopa, 1 - (Vofop + Vb)\right\}$$

$$\left(\frac{C1}{A} + \frac{Cp2}{A} + \frac{A+1}{A}C2\right)Vopa,$$

$$1 = C1\{Vref - V1 + (Vofop + Vb)\} + \left(\frac{Cp2}{A} + C2\frac{A+1}{A}\right)Vop, 0$$

$$Vopa, 1 = \frac{AC1}{C1 + Cp + (A+1)C2}\{Vref - V1 + (Vofop + Vb)\} +$$

$$\frac{Cp + (A+1)C2}{C1 + Cp + (A+1)C2}Vop, 0$$

When an output of the operational amplifier 340 at the time when the processing changes to the charge accumulation/comparison step again is represented as Vop,1, the charges Q2,1 and Qp,1 accumulated in C2 and Cp are expressions obtained by changing Q2,0, Qp,0, and Vop,0 of Expression (164), Expression (165) to Q2,1, Qp,1, and Vop,1. Since the charge conservation holds before and after the charge accumulation/comparison step, a relational expression between Vop,1 and Vopa,1 is represented by the following expression.

Formula 110

$$Qpa, 1 - Q2a, 1 = Qp, 1 - Q2, 1$$

$$Cp\left\{-\frac{1}{A}Vopa, 1 + (Vofop + Vb)\right\} - C2\left\{\frac{A+1}{A}Vopa, 1 - (Vofop + Vb)\right\} =$$

$$Cp\left\{-\frac{1}{A}Vop, 1 + (Vofop + Vb)\right\} - C2\left\{\frac{A+1}{A}Vop, 1 - (Vofop + Vb)\right\}$$

$$Vopa, 1 = Vop, 1$$

Therefore, a relational expression between Vop,1 and Vop,0 is represented by the following expression.

Formula 111

$$Vop, 1 = \frac{AC1}{C1 + Cp + (A+1)C2}\{Vref - V1 + (Vofop + Vb)\} + \quad (170)$$

$$\frac{Cp + (A+1)C2}{C1 + Cp + (A+1)C2}Vop, 0$$

As in the derivation of Expression (18), when the relational expression between Vop,1 and Vop,0 is represented in the form of Expression (11), B1, $\eta$, and $-\eta B0$ are represented by the following expressions.

Formula 112

$$B1 = \frac{Cp + (A+1)C2}{C1 + CP + (A+1)C2} = 1 - \frac{C1}{C1 + Cp + (A+1)C2} = 1 - \eta \quad (171)$$

$$\eta = \frac{C1}{C1 + Cp + (A+1)C2} \quad (172)$$

$$\eta B0 = \frac{AC1}{C1 + CP + (A+1)C2}\{Vref - V1 + (Vofop + Vb)\} \quad (173)$$

Vop,0 is the same as Expression (155). The output Vop,k of the operational amplifier 340 at the time when it is assumed that $\eta \ll 1$ as in the derivation of Expression (18) and the initial/comparison step, the charge accumulation step, and the charge transfer step are repeated k times is represented by the following expression by substituting Expression (155), Expression (172), and Expression (173) in Expression (16).

Formula 113

$$Vop, k = Vop_{,0} - k\eta(Vop_{,0} + B0) \quad (174)$$

$$Vop, k = \frac{A}{A+1}(Vofop + Vb) + \quad (175)$$

$$k\left\{-\frac{C1}{C1 + Cp + (A+1)C2}\frac{A}{A+1}(Vofop + Vb) + \right.$$

$$\left. \frac{AC1}{C1 + CP + (A+1)C2}[Vref - V1 + (Vofop + Vb)]\right\}$$

$$Vop, k = k\frac{AC1}{C1 + CP + (A+1)C2}\left\{Vref - V1 + \frac{A}{A+1}(Vofop + Vb)\right\} +$$

$$\frac{A}{A+1}(Vofop + Vb)$$

$$VGp2 = \frac{AC1}{C1 + Cp + (A+1)C2}\{Vref - V1 + Vofb\}$$

In the state in which s11 and s13 of the first crossbar switch 31 are connected and s12 and s14 of the first crossbar switch 31 are connected, the output of the operational amplifier 340 is connected to the positive input of the determiner 32 and Vref is connected to the negative input of the determiner 32. Vopb,k+Vofc increases and approaches Vref as the number of times of integration increases. When the number of times the determination signal is detected for the first time is represented as ki+1, ki is defined as a first number of times of integration. The following equation holds about the first number of times of integration ki1.

Formula 114

$$Vref = VGp2(ki1 + \delta ki1) + Vofb + Vofc \quad (176)$$

To simplify expression expansion, it is assumed that Kc1=kc1+$\delta$kc1, Kc2=kc2+$\delta$kc2, Kr1=kr1+$\partial$kr1, Kr2=kr2+$\delta$kr2, Ki1=ki1+$\delta$ki1, and Ki2=ki2+$\delta$ki2. A difference between Expression (176) and Expression (161) is calculated and Expression (157) and Expression (175) are substituted in an expression obtained by the calculation to obtain the following expression.

Formula 115

$$0 = VGp2 \; Ki1 - VGpKr1 \quad (177)$$

$$(Vref - V1 + Vofb) \; Ki1 = (Vref - V1)Kr1$$

$$Vofb = (Vref - V1)\left(\frac{Kr1}{Ki1} - 1\right)$$

A difference between Expression (159) and Expression (160) is calculated to obtain the following expression.

Formula 116

$$V1-VGpKc2-Vofb=VGp\,Kc1=Vofb-V1$$

$$2V1=VGp(Kc1+Kc2)+2Vofb \qquad (178)$$

A difference between Expression (161) and Expression (162) is calculated to obtain the following expression.

Formula 117

$$Vref-VGpKr2-Vofb=VGpKr1+Vofb-Vref$$

$$2Vref=VGp(Kr1=Kr2)+2Vofb \qquad (179)$$

A difference between Expression (179) and Expression (178) is calculated to obtain the following expression.

Formula 118

$$2(Vref-V1)=VGp(Kr1+Kr2-Kc1-Kc2)$$

$$Vref-V1=\tfrac{1}{2}VGp(Kr1+Kr2-Kc1+Kc2) \qquad (180)$$

Expression (177) and Expression (180) are substituted in Expression (179) to obtain an expression of VGp.

Formula 119

$$2Vref = \qquad (181)$$

$$VGp\,(Kr1+Kr2) + 2\left(\frac{Kr1}{Ki1}-1\right)\tfrac{1}{2}VGp\,(Kr1+Kr2-Kc1-Kc2)$$

$$VGp = \frac{2Ki1}{Ki1(Kc1+Kc2)+Kr1(Kr1+Kr2-Kc1-Kc2)}Vref =$$

$$\frac{2Ki1}{Ki1(Kc1+Kc2)+(Ki1-Kr1)(Kc1+Kc2)}Vref$$

Expression (180) and Expression (181) are substituted in Expression (177) to obtain an expression of Vofb.

Formula 120

$$Vofb = \tfrac{1}{2}(Kr1+Kr2-Kc1-Kc2)\left(\frac{Kr1}{Ki1}-1\right) \qquad (182)$$

$$\frac{2Ki1}{Kr1(Kc1+Kc2)+(Ki1-Kr1)(Kc1+Kc2)}Vref$$

$$= \frac{(Kr1+Kr2-Kc1-Kc2)(Kr1-Ki1)}{Kr1(Kc1+Kc2)+(Ki1-Kr1)(Kc1+Kc2)}$$

Calibration values of Vofb and VGp are determined by medians of ranges of Vofb and VGp as in the first embodiment and the second configuration example of the integration/determination/signal output unit.

Expression (181) is partially differentiated about δkr1, δkr2, and δki1 to obtain the following expression.

Formula 121

$$\frac{\partial VGp}{\partial(\delta kr1)} = -\frac{2Kr1+Kr2-Kc1-Kc2}{\{Kr1(Kr1+Kr2)+(Ki1-Kr1)(Kc1+Kc2)\}^2}2Ki1Vref < 0 \qquad (183)$$

$$\frac{\partial VGp}{\partial(\delta kr2)} = -\frac{Kr1}{\{Kr1(Kr1+Kr2)+(Ki1-Kr1)(Kc1+Kc2)\}^2}2Ki1Vref < 0 \qquad (184)$$

$$\frac{\partial VGp}{\partial(\delta ki1)} = \frac{2}{Kr1(Kr1+Kr2)+(Ki1-Kr1)(Kc1+Kc2)}Vref - \qquad (185)$$

$$\frac{Kc1+Kc2}{\{Kr1(Kr1+Kr2)+(Ki1-Kr1)(Kc1+Kc2)\}^2}2Ki1Vref$$

$$= \frac{Kr1(Kr1+Kr2)+(Ki1-Kr1)(Kc1+Kc2)-Ki1(Kc1+Kc2)}{\{Kr1(Kr1+Kr2)+(Ki1-Kr1)(Kc1+Kc2)\}^2}2Vref$$

$$= \frac{Kr1(Kr1+Kr2-Kc1-Kc2)}{\{Kr1(Kr1+Kr2)+(Ki1-Kr1)(Kc1+Kc2)\}^2}2Vref > 0$$

In derivation of signs of inequality of Expression (183), Expression (184), and Expression (185), the following condition is used.

"Since the integration unit voltage is the same at VGp in the measurement of Kr1 and Kr2 and Kc1 and Kc2 and the threshold Vref of the measurement of Kr1 and Kr2 is larger than the threshold V1 of the measurement of Kc1 and Kc2, Kr1+Kr2>Kc1+Kc2 is obtained."

According to Expression (183), Expression (184), and Expression (185), VGp monotonously decreases with respect to δkr1 and δkr2 and monotonously increases with respect to δki1.

Expression (181) is partially differentiated about δkc1 and δkc2 to obtain the following expression.

Formula 122

$$\frac{\partial VGp}{\partial(\delta kc1)} = \frac{\partial VGp}{\partial(\delta kc2)} = \qquad (186)$$

$$-\frac{Ki1-Kr1}{\{Kr1(Kr1+Kr2)+(Ki1-Kr1)(Kc1+Kc2)\}^2}2Ki1Vref$$

Expression (182) is partially differentiated about δkr1 and δki1 to obtain the following expression.

Formula 123

$$\frac{\partial Vofb}{\partial(\delta kr1)} = \frac{2Kr1 + Kr2 - Kc1 - Kc2 - Ki1}{Kr1(Kr1 + Kr2) + (Ki1 - Kr1)(Kc1 + Kc2)} Vref - \tag{187}$$

$$\frac{(Kr1 + Kr2 - Kc1 - Kc2)(Kr1 - Ki1)(2Kr1 + Kr2 - Kc1 - Kc2)}{\{Kr1(Kr1 + Kr2) + (Ki1 - Kr1)(Kc1 + Kc2)\}^2} Vref$$

$$= \frac{(2Kr1 + Kr2 - Kc1 - Kc2 - Ki1)\{Kr1(Kr1 + Kr2) + (Ki1 - Kc1)(Kc1 + Kc2)\} - (Kr1 + Kr2 - Kc1 - Kc2)(Kr1 - Ki1)(2Kr1 - Kr2 - Kc1 - Kc2)}{\{Kr1(Kr1 + Kr2) + (Ki1 - Kr1)(Kc1 + Kc2)\}^2} Vref$$

$$= \frac{(2Kr1 + Kr2 - Kc1 - Kc2 - Ki1)\{Kr1(Kr1 + Kr2 - Kc1 - Kc2) + Ki1(Kc1 + Kc2)\} - (Kr1 + Kr2 - Kc1 - Kc2)(Kr1 - Ki1)(2Kr1 - Kr2 - Kc1 - Kc2)}{\{Kr1(Kr1 + Kr2) + (Ki1 - Kr1)(Kc1 + Kc2)\}^2} Vref$$

$$= \frac{Ki1(Kc1 + Kc2)(2Kr1 + Kr2 - Kc1 - Kc2 - Ki1) + (Kr1 + Kr2 - Kc1 - Kc2)\{Kr1(2Kr1 + Kr2 - Kc1 - Kc2 - Ki1) - (Kc1 - Ki1)(2Kr1 + Kr2 - Kc1 - Kc2)\}}{\{Kr1(Kr1 + Kr2) + (Ki1 - Kr1)(Kc1 + Kc2)\}^2} Vref$$

$$= \frac{Ki1(Kc1 + Kc2)(2Kr1 + Kr2 - Kc1 - Kc2 - Ki1) + (Kr1 + Kr2 - Kc1 - Kc2)\{Kr1(-Ki1) - Ki1(2Kr1 + Kr2 - Kc1 - Kc2)\}}{\{Kr1(Kr1 + Kr2) + (Ki1 - Kr1)(Kc1 + Kc2)\}^2} Vref$$

$$= \frac{Ki1(Kr1 + Kr2 - Kc1 - Kc2)^2}{\{Kr1(Kr1 + Kr2) + (Ki1 - Kr1)(Kc1 + Kc2)\}^2} Vref > 0$$

$$\frac{\partial Vofb}{\partial(\delta ki1)} = \frac{-(Kr1 + Kr2 - Kc1 - Kc2)}{Kr1(Kr1 + Kr2) + (Ki1 - Kr1)(Kc1 + Kc2)} Vref - \tag{188}$$

$$\frac{(Kr1 + Kr2 - Kc1 - Kc2)(Kr1 - Ki1)(Kc1 + Kc2)}{\{Kr1(Kr1 + Kr2) + (Ki1 - Kr1)(Kc1 + Kc2)\}^2} Vref$$

$$= -\frac{(Kr1 + Kr2 - Kc1 - Kc2)\{Kr1(Kr1 + Kr2) + (Ki1 - Kr1)(Kc1 + Kc2)\} + (Kr1 + Kr2 - Kc1 - Kc2)(Kr1 - Ki1)(Kc1 + Kc2)}{\{Kr1(Kr1 + Kr2) + (Ki1 - Kr1)(Kc1 + Kc2)\}^2} Vref$$

$$= -\frac{(Kr1 + Kr2 - Kc1 - Kc2)\{Kr1(Kr1 + Kr2) + (Ki1 - Kr1)(Kc1 + Kc2) - (Ki1 - Kr1)(Kc1 + Kc2)\}}{\{Kr1(Kr1 + Kr2) + (Ki1 - Kr1)(Kc1 + Kc2)\}^2} Vref$$

$$= -\frac{(Kr1 + Kr2 - Kc1 - Kc2)Kr1(Kr1 + Kr2)}{\{Kr1(Kr1 + Kr2) + (Ki1 - Kr1)(Kc1 + Kc2)\}^2} Vref < 0$$

According to Expression (187) and Expression (188), Vofb monotonously increases with respect to δkr1 and monotonously decreases with respect to δki1.

Expression (182) is partially differentiated about δkr2, δkc1, and δkc2 to obtain the following expression.

Formula 124

$$\frac{\partial Vofb}{\partial(\delta kr2)} = \frac{Kr1 - Ki1}{Kr1(Kr1 + Kr2) + (Ki1 - Kr1)(Kc1 + Kc2)} Vref - \frac{(Kr1 + Kr2 - Kc1 - Kc2)(Kr1 - Ki1)Kr1}{\{Kr1(Kr1 + Kr2) + (Ki1 - Kr1)(Kc1 + Kc2)\}^2} Vref$$

$$= \frac{(Kr1 - Ki1)\{Kr1(Kr1 + Kr2) + (Ki1 - Kr1)(Kc1 + Kc2)\} - (Kr1 + Kr2 - Kc1 - Kc2)(Kr1 - Ki1)Kr1}{\{Kr1(Kr1 + Kr2) + (Ki1 - Kr1)(Kc1 + Kc2)\}^2} Vref$$

$$= \frac{(Kr1 - Ki1)Ki1(Kc1 + Kc2)}{\{Kr1(Kr1 + Kr2) + (Ki1 - Kr1)(Kc1 + Kc2)\}^2} Vref \tag{189}$$

$$\frac{\partial Vofb}{\partial(\delta kc1)} = \frac{\partial Vofb}{\partial(\delta kc2)} = \frac{-(Kr1 - Ki1)}{Kr1(Kr1 + Kr2) + (Ki1 - Kr1)(Kc1 + Kc2)} Vref - \frac{(Kr1 + Kr2 - Kc1 - Kc2)(Kr1 - Ki1)(Ki1 - Kr1)}{\{Kr1(Kr1 + Kr2) + (Ki1 - Kr1)(Kc1 + Kc2)\}^2} Vref$$

$$= -\frac{(Kr1 - Ki1)\{Kr1(Kr1 + Kr2) + (Ki1 - Kr1)(Kc1 + Kc2)\} + (Kr1 + Kr2 - Kc1 - Kc2)(Kr1 - Ki1)(Ki1 - Kr1)}{\{Kr1(Kr1 + Kr2) + (Ki1 - Kr1)(Kc1 + Kc2)\}^2} Vref$$

$$= -\frac{(Kr1 - Ki1)\{Kr1(Kr1 + Kr2) + (Ki1 - Kr1)(Kc1 + Kc2) - (Kr1 + Kr2 - Kc1 - Kc2)(Kr1 - Ki1)(Ki1 - Kr1)\}}{\{Kr1(Kr1 + Kr2) + (Ki1 - Kr1)(Kc1 + Kc2)\}^2} Vref$$

$$= -\frac{(Kr1 - Ki1)\{(2Kr1 - Ki1)(Kr1 + Kr2) + 2(Ki1 - Kr1)(Kc1 + Kc2)\}}{\{Kr1(Kr1 + Kr2) + (Ki1 - Kr1)(Kc1 + Kc2)\}^2} Vref$$

$$= -\frac{(Kr1 - Ki1)\{2Kr1(Kr1 + Kr2 - Kc1 - Kc2) + Ki1(2KC1 + 2Kc2 - Kc1 - Kc2)\}}{\{Kr1(Kr1 + Kr2) + (Ki1 - Kr1)(Kc1 + Kc2)\}^2} Vref \tag{190}$$

Since Kr1>Ki1 according to Expression (177) when Vofb>0, Expression (186) is negative and VGp monotonously decreases with respect to δkc1 and δkc2. Since Expression (189) is positive, Vofb monotonously increases with respect to δkr2. Since Expression (190) is negative, Vofb monotonously decreases with respect to δkc1 and δkc2.

Accordingly, ranges of VGp and Vofb are as follows.

Formula 125

$$\frac{2ki1}{(kr1+1)(kr1+kr2+1)+(ki1-kr1-1)(kc1+kc2+2)} Vref < \tag{191}$$

$$VGp < \frac{2(ki1+1)}{kr1(kr1+ke2)+(ki1-kr1+1)(kc1+kc2)} Vref$$

$$\frac{(kr1+kr2-kc1-kc2-2)(kr1-ki1-1)}{kr1(kr1+kr2)+(ki1-kr1+1)(kc1+kc2+2)} Vref < Vofb < \tag{192}$$

$$\frac{(kr1+kr2-kc1-kc2+2)(kr1-ki1+1)}{(kr1+1)(kr1+kr2+2)+(ki1-kr1-1)(kc1+kc2)} Vref$$

If a calibration value of VGpc is set to VGpc represented by Expression (193), which is the median of a range of Expression (191), the calibration value of VGp can be derived at accuracy of ΔVGp represented by Expression (194). If a calibration value of Vofb is set to Vofbc represented by Expression (195), which is the median of Expression (192), the calibration value of Vofb can be derived at accuracy of ΔVofb represented by Expression (196).

Formula 126

$$VGpc = \frac{(ki1+1)}{ki1(kr1+kr2)+(ki1-kr1+1)(kc1+kc2)} Vref + \frac{ki1}{(kr1+1)(kr1-+kr2+1)(ki1-kr1-1)(kc1+kc2+2)} Vref \tag{193}$$

$$\Delta VGp = \frac{(ki1+1)}{ki1(kr1+kr2)+(ki1-kr1+1)(kc1+kc2)} Vref - \frac{ki1}{(kr1+1)(kr1-+kr2+1)(ki1-kr1-1)(kc1+kc2+2)} Vref \tag{194}$$

$$Vofbc = \tag{195}$$
$$\frac{1}{2}\frac{(kr1+kr2-kc1-kc2+2)(kr1-ki1+1)}{(kr1+1)(kr1+kr2+2)+(ki1-kr1-1)(kc1+kc2)} Vref + \frac{1}{2}\frac{(kr1+kr2-kc1-kc2-2)(kr1-ki1-1)}{kr1(kr1+kr2)+(ki1-kr1+1)(kc1+kc2+2)} Vref$$

$$\Delta Vofbc = \tag{196}$$
$$\frac{1}{2}\frac{(kr1+kr2-kc1-kc2+2)(kr1-ki1+1)}{(kr1+1)(kr1+kr2+2)+(ki1-kr1-1)(kc1+kc2)} Vref - \frac{1}{2}\frac{(kr1+kr2-kc1-kc2-2)(kr1-ki1-1)}{kr1(kr1+kr2)+(ki1-kr1+1)(kc1+kc2+2)} Vref$$

Since Kr1<Ki1 according to Expression (177) when Vofb<0, Expression (186) is positive and VGp monotonously increases with respect to δkc1 and δkc2. Since Expression (189) is negative, Vofb monotonously decreases with respect to δkr2. Since Expression (190) is positive, Vofb monotonously increases with respect to δkc1 and δkc2.

Accordingly, ranges of VGp and Vofb are as follows.

Formula 127

$$\frac{2ki1}{(kr1+1)(kr1+kr2+1)+(ki1-kr1-1)(kc1+kc2+2)}Vref < \quad (197)$$
$$VGp < \frac{2(ki1+1)}{kr1(kr1+ke2)+(ki1-kr1+1)(kc1+kc2)}Vref$$

$$\frac{(kr1+kr2-kc1-kc2-2)(kr1-ki1-1)}{kr1(kr1+kr2)+(ki1-kr1+1)(kc1+kc2+2)}Vref < Vofb < \quad (198)$$
$$\frac{(kr1+kr2-kc1-kc2+2)(kr1-ki1+1)}{(kr1+1)9kr1+kr2+2)+(ki1-kr1-1)(kc1+kc2)}Vref$$

If a calibration value of VGpc is set to VGpc represented by Expression (199), which is the median of a range of Expression (197), the calibration value of VGp can be derived at accuracy of ΔVGp represented by Expression (200). If a calibration value of Vofb is set to Vofbc represented by Expression (201), which is the median of Expression (198), the calibration value of Vofb can be derived at accuracy of ΔVofb represented by Expression (202).

Formula 128

$$VGpc = \frac{(ki1+1)}{ki1(kr1+kr2)+(ki1-kr1+1)(kc1+kc2)}Vref + \quad (199)$$
$$\frac{ki1}{(kr1+1)(kr1-+kr2+1)(ki1-kr1-1)(kc1+kc2+2)}Vref$$

$$\Delta VGp = \frac{(ki1+1)}{ki1(kr1+kr2)+(ki1-kr1+1)(kc1+kc2)}Vref - \quad (200)$$
$$\frac{ki1}{(kr1+1)(kr1-+kr2+1)(ki1-kr1-1)(kc1+kc2+2)}Vref$$

$$Vofbc = \quad (201)$$
$$\frac{1}{2}\frac{(kr1+kr2-kc1-kc2+2)(kr1-ki1+1)}{(kr1+1)(kr1+kr2+2)+(ki1-kr1-1)(kc1+kc2)}Vref +$$
$$\frac{1}{2}\frac{(kr1+kr2-kc1-kc2-2)(kr1-ki1-1)}{kr1(kr1+kr2)+(ki1-kr1+1)(kc1+kc2+2)}Vref$$

$$\Delta Vofbc = \quad (202)$$
$$\frac{1}{2}\frac{(kr1+kr2-kc1-kc2+2)(kr1-ki1+1)}{(kr1+1)(kr1+kr2+2)+(ki1-kr1-1)(kc1+kc2)}Vref -$$
$$\frac{1}{2}\frac{(kr1+kr2-kc1-kc2-2)(kr1-ki1-1)}{kr1(kr1+kr2)+(ki1-kr1+1)(kc1+kc2+2)}Vref$$

In the derivation of VGp and Vofb, when kr1>ki1, Expression (193) and Expression (195) are used. When kr1<ki1, Expression (199) and Expression (201) are used.

Consequently, in this embodiment, in the calibration state, a measuring instrument serving as a reference for calibration is unnecessary on the outside of a sensor node even after sensor circuit setting. It is possible to derive, at predetermined accuracy, calibration values of the offset voltage and the integration unit voltage of the operational amplifier 340.

When the processing explained above is completed, the control unit 60 outputs the calibration values of the offset voltage and the integration unit voltage of the operational amplifier 340 as calibration data.

As operation at the time when the sensor circuit is calibrated, a variable reference voltage source 300 in this embodiment is set in an output state and a voltage set by setting data including the number of times of integration k is output. When a voltage larger than Vofb is output, an initial/comparison step, a charge accumulation step, and a charge transfer step are repeatedly executed in the same processing as the number of times of offset cancel integration measurement processing by a positive-offset-cancel-integration processing unit 621 of an output control unit 62. A voltage output from the variable reference voltage source 300 at this time can be derived from Expression (156) using the calibration values of the integration unit voltage VGp and Vofb derived in the calibration state. Therefore, the voltage can be treated as a known voltage. Therefore, the known voltage output from the variable reference voltage source 300 is input to the amplifier and the AD converter of the sensor circuit. It is possible to calibrate an offset and a gain of the amplifier and an offset of the AD converter from a correlation with the output.

When a voltage smaller than Vofb is output, negative offset cancel integration processing is executed by a negative-offset-cancel-integration processing unit 620 of the output control unit 62. The negative offset cancel integration processing is configured by an initial/comparison step, a charge accumulation step, and a charge transfer step. First, SW3 is connected to initialize charges of C2 to zero and connection of a1 and c1 of SW6, connection of a2 and b2 of SW2, and connection of a4 and b4 of SW4, which are connection of SW2, SW3, SW4, and SW6 of the initial/comparison step and disconnection of SW3 are carried out. After the initialization in the beginning, the disconnection of SW3 is maintained. When an output of the operational amplifier 340 is represented as Vop,0, the charge Q2,0 accumulated in C2 is the same as Expression (142).

In the charge accumulation step, after a4 and c4 of SW4 are connected, a2 and c2 of SW2 are connected. By connecting a4 and c4 of SW4, charges accumulated in C2 are saved. The operational amplifier 340 operates as a unity gain buffer. The output Vopa,1 of the operational amplifier 340 at this time is the same as Expression (143). A differential voltage between the voltage V1 and Vopa,1 is applied to C1. The charge Q1a,1 accumulated in C1 in this step is represented by the following expression.

Formula 129

$$Q1a,1 = C1\left\{V1 - \frac{A}{A+1}(Vofop + Vb)\right\} \quad (203)$$

The charges Q2a,1 and Qpa,1 accumulated in C2 and Cp are Expression (145) and Expression (146).

In the charge transfer step, after a4 and b4 of SW4 are connected, a1 and b1 of SW6 are connected. Since b1 of SW6 is connected to Vref, the charge Q1b,1 accumulated in C1 in this step is represented by the following expression.

Formula 130

$$Q1b,1 = C1\left\{Vref + \frac{1}{A}Vopb,1 - (Vofop + Vb)\right\} \quad (204)$$

The charges Q2b,1 and Qpb,1 accumulated in C2 and Cp are Expressions (148) and Expression (149).

Charges accumulated in a capacitor connected to the negative input of the operational amplifier 340 before and after the charge transfer step are saved. Accordingly, a relational expression between Vopb,1 and Vop,0 is as follows.

Formula 131

$$-Q1a,1 + Qpa,1 - Q2a,1 = -Q1b,1 + Qpb,1 - Q2b,1 \quad (205)$$

$$-C1\left\{V1 + \frac{A}{A+1}(Vofop + Vb)\right\} +$$

$$Cp\frac{A}{A+1}(Vofop + Vb) - C2\left(\frac{A+1}{A}Vop,0 - Vofop - Vb\right) =$$

$$C1\left(Vref + \frac{1}{A}Vopb,1 - Vofop - Vb\right) + Cp\left(-\frac{1}{A}Vopb,\right.$$

$$\left.1 + Vofop + Vb\right) - C2\left(\frac{A+1}{A}Vobp,1 - Vofop - Vb\right)$$

$$\left(\frac{C1}{A} + \frac{Cp2}{A} + \frac{A+1}{A}C2\right)Vopb,$$

$$1 = C1\left\{V1 - Vref + \frac{1}{A+1}(Vofop + Vb)\right\} + C2\frac{A+1}{A}Vop,$$

$$0 + Cp\frac{1}{A+1}(Vofop + Vb)$$

$$Vopb,1 = \frac{AC1}{C1 + Cp + (A+1)C2}\left\{V1 - Vref + \frac{1}{A+1}(Vofop + Vb)\right\} +$$

$$\frac{(A+1)C2}{C1 + Cp + (A+1)C2}Vop,$$

$$0 + \frac{Cp}{C1 + Cp + (A+1)C2}\frac{A}{A+1}(Vofop + Vb)$$

The output Vop,1 of the operational amplifier 340 at the time when the processing transitions to the initial/comparison step again is the same as Vopb,1 as in the second configuration example in the first embodiment shown in FIG. 6. Accordingly, a relational expression between Vop,1 and Vop,0 is the following expression.

Formula 132

$$Vop,1 = \frac{AC1}{C1 + Cp + (A+1)C2}\left\{V1 - Vref + \frac{1}{A+1}(Vofop + Vb)\right\} + \quad (206)$$

$$\frac{(A+1)C2}{C1 + Cp + (A+1)C2}Vop,$$

$$0 + \frac{Cp}{C1 + Cp + (A+1)C1}\frac{A}{A+1}(Vofop + Vb)$$

When Expression (206) is compared with Expression (151), only signs of V1 and Vref of the right side first term are different. Therefore, the output Vop,k of the operational amplifier 340 at the time when the initial/comparison step, the charge accumulation step, and the charge transfer step are repeated k times is represented by the following expression.

Formula 133

$$Vop,k = -k\frac{AC1}{C1 + Cp + (A+1)C2}(Vref - V1) + Vofb \quad (207)$$

$$= -kVGp + Vofb$$

Since calibration values of VGp and Vofb in Expression (207) are derived in the calibration state, in the negative offset cancel integration processing as well, an output voltage of the operational amplifier 340 after the negative offset cancel integration processing is repeated by the number of times of integration k can be treated as a known voltage. Therefore, the known voltage output from the variable signal source for calibration is input to the amplifier and the AD converter of the sensor circuit. It is possible to calibrate an offset and a gain of the amplifier and an offset of the AD converter from a correlation with the output.

Second Embodiment

Figure 8:
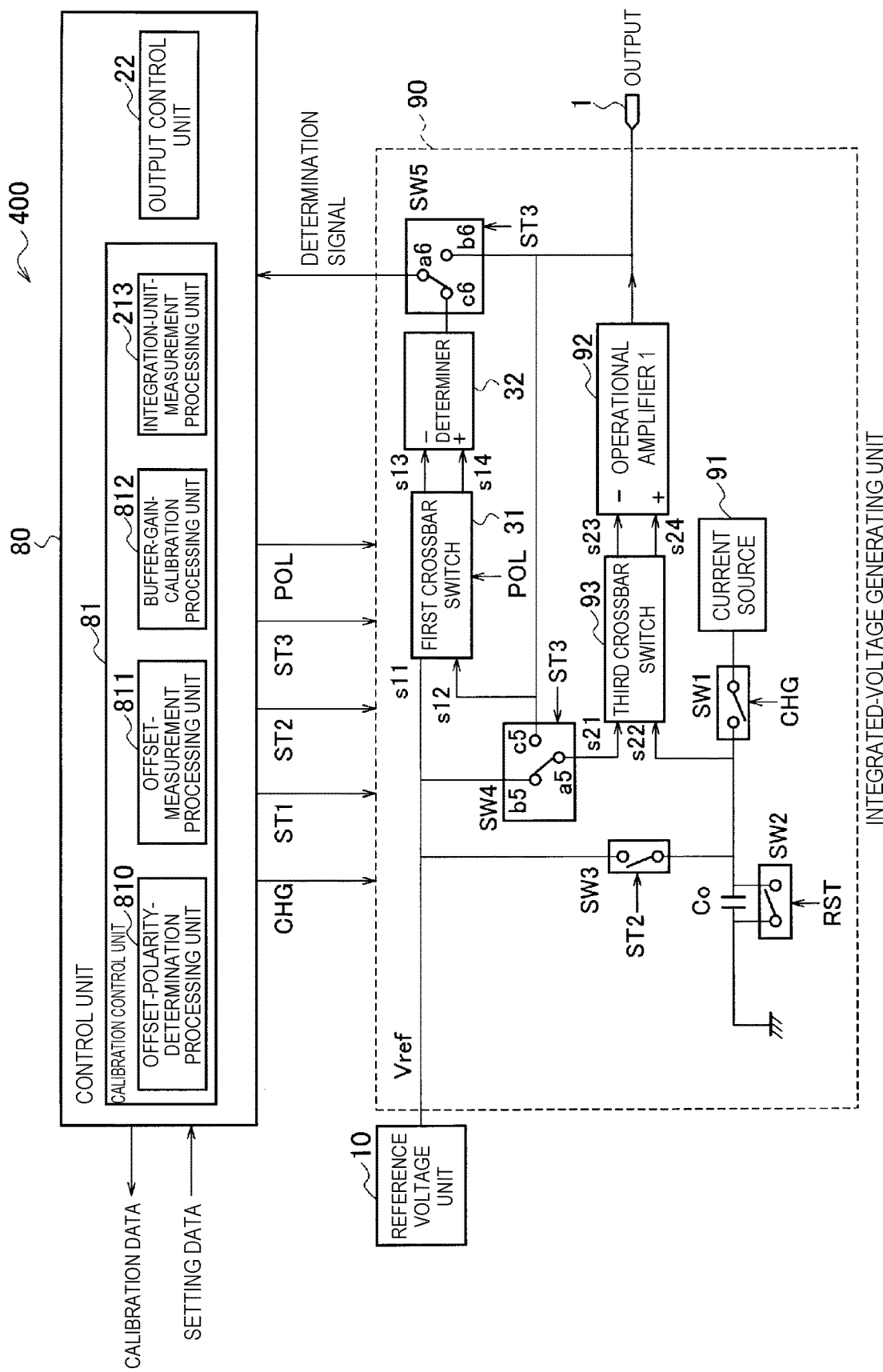
FIG. 8 is a functional block diagram showing a configuration example of a variable reference voltage source according to a second embodiment of the present invention.

A configuration example of a variable reference voltage source according to a second embodiment of the present invention is shown in FIG. 8 is shown. A variable reference voltage source 400 shown in FIG. 8 is configured by the reference voltage unit 10 that outputs the reference voltage Vref, a control unit 80, and an integrated-voltage generating unit 90. The control unit 80 changes a state to a calibration state and an output state based on command/response data from a sensor node and executes, in the calibration state, processing of calibration of an offset, an integration unit voltage, and a buffer gain and acquires calibration values of the offset, the integration unit voltage, and the buffer gain. In the output state, the control unit 80 executes processing for setting and outputting a voltage used for the calibration. In the calibration state, the integrated-voltage generating unit 90 executes, based on an operation control signal from the control unit 80, in order to calculate the offset and the integration unit voltage, an integration operation until a voltage based on charges accumulated in the capacitor Co becomes equal to the reference voltage Vref. In the output state, the integrated-voltage generating unit 90 executes the integration operation by a predetermined number of times based on the command/response data from the sensor node and outputs the voltage.

The integrated-voltage generating unit 90 includes the determiner 32 that has positive and negative inputs and determines that a positive input voltage exceeds a negative input voltage during a calibration state and outputs a determination signal, the first crossbar switch 31 used for measurement of an offset voltage of the determiner 32, the capacitor Co, a current source 91 that supplies charges to the capacitor Co, SW1 connected when the charges are supplied to the capacitor Co, SW2 that resets charges accumulated in the capacitor Co, an operational amplifier 92 that outputs a voltage set during an output state, a third crossbar switch 93 used when polarity of an offset of the operational amplifier 92 is determined, SW3 connected when the offset of the operational amplifier 92 is determined, SW4 that changes connection between the time when the offset of the operational amplifier 92 is calibrated and the output state, and SW5 that changes connection between the time when the offset of the operational amplifier 92 is calibrated and the time when an integration unit voltage is configured.

The integration operation in this embodiment is explained. Integration is carried out by supplying charges from the current source to the capacitor Co in a time period an integer times as long as a predetermined time unit. An equivalent circuit in the case in which s21 and s23 of the third crossbar switch 93 are connected and s22 and s24 of the third crossbar switch 93 are connected is shown in FIG. 9(*a*). In the equivalent circuit, an electrode connected to the current source side of Co is represented as plus (+) and an electrode connected to the ground side is represented as minus (−). When an output current of the current source 91 is represented as Io and the predetermined time unit is represented as Δt, charges supplied from the current source 91 in a time period kΔt k times as long as Δt is Ilk·Δt. When parasitic capacitance Cp1 present in a positive input of the operational amplifier 92 is considered, a voltage Vo of Co is represented by the following expression.

Formula 134

$$Vo = \frac{Io}{Co + Cp1} \Delta t\, k \quad (208)$$

When s21 and s24 of the third crossbar switch 93 are connected and s22 and s23 of the third crossbar switch 93 are connected as shown in FIG. 9(*b*), parasitic capacitance Cp2 on a negative input side of the operational amplifier 92 is connected to Co. Accordingly, the voltage Vo of Co generated by the charges supplied from the current source in the time kΔt k times as long as Δt is represented by the following expression.

Formula 135

$$Vo = \frac{Io}{Co + Cp2} \Delta t\, k \quad (209)$$

In this way, the voltage Vo is proportional to the integer time k of the predetermined time Δt.

In the calibration state in this embodiment, processing is executed in the order of offset polarity determination processing, offset measurement processing, integration unit measurement processing, and buffer gain calibration processing to calibrate an offset voltage, an integration unit voltage, and a buffer gain.

In the offset polarity determination processing, a6 and b6 of SW5 are connected, a5 and b5 of SW4 are connected, SW3 is set in a connected state, and SW1 and SW2 are set in a disconnected state according to an operation control signal output from a control/processing unit. Further, s21 and s23 of the third crossbar switch 93 are connected and s22 and s24 of the third crossbar switch 93 are connected.

When an offset voltage of the operational amplifier 92 is represented as Vofop, Vref+Vofop is equivalently input to the positive input of the operational amplifier 92 and Vref is input to the negative input of the operational amplifier 92. Accordingly, in the case of Vofop>0, a high-output voltage, which is a maximum value of an output of the operational amplifier 92, is output. In the case of Vofop<0, a low-output voltage, which is a minimum value of the output of the operational amplifier 92, is output. Therefore, in the case of Vofop>0, the determination signal is the high-output voltage. In the case of Vofop<0, the determination signal is the low-output voltage. When the control unit 80 detects that the determination signal is the high-output voltage, s21 and s24 of the third crossbar switch 93 are connected and s22 and s23 of the third crossbar switch 93 are connected. When the control unit 80 detects the low-output voltage, the processing shifts to the offset measurement processing without changing the connection of the third crossbar switch 93.

In the offset measurement processing, a6 and b6 of SW5 are connected and a5 and b5 of SW4 are connected. After SW1 is set in the disconnected state, SW3 is set in the connected state and thereafter set in the disconnected state. Thereafter, the charge accumulation step and the comparison step are repeated until the output of the operational amplifier 92 changes. In the following explanation, Vofop>0, that is, s21 and s24 of the third crossbar switch 93 are connected and s22 and s23 of the third crossbar switch 93 are connected (equivalent to FIG. 9(*b*)).

In the charge accumulation step, SW1 is set in the connected state in a period of the predetermined time Δt and, thereafter, SW1 is set in the disconnected state. When viewed from the current source 91, the capacitor Co and the parasitic capacitance Cp2 are connected in parallel. Therefore, charges supplied from the current source in the period of the predetermined time Δt are accumulated such that voltages generated in Co and Cp2 are the same. When voltages by charges accumulated in Co and Cp2 before and after SW1 is set in the connected state in the period of the predetermined time Δt (hereinafter described as voltages of Co) are respectively represented as Vo,0 and Vo,1, the following expression is obtained from charges Δt·Io supplied from the current source in the period of the predetermined time Δt and the charge conservation.

Formula 136

$$(Co + Cp2)Vo, 1 = (Co + Cp2)Vo, 0 + \Delta t\, Io \quad (210)$$

$$Vo, 1 = Vo, 0 + \frac{\Delta t\, Io}{Co + Cp2}$$

Subsequently, in the comparison step, the output of the operational amplifier 92 is monitored by the control unit 80. The positive input of the operational amplifier 92 is equivalently Vref+Vofop. If the negative input, which is the voltage of Co, is large, the output of the operational amplifier 92 is the low-output voltage. If the negative input is small, the output of the operational amplifier 92 is the high-output voltage. When the output of the operational amplifier 92 is the high-output voltage, the processing shifts to the charge accumulation step.

In the case of Vofop>0, the charge accumulation step and the comparison step are repeated until the output of the operational amplifier 92 changes from the high-output voltage of the first output to the low-output voltage. Since the voltage of Co is represented by an arithmetical series according to Expression (210), a voltage Vo,k of Co at the time when the charge accumulation step and the comparison step are repeated k times is the following expression.

Formula 137

$$Vo, k = k\frac{\Delta t\, Io}{Co + Cp2} + Vo, 0 = k\, VGi + Vo, 0 \quad (211)$$

$$VGi = \frac{\Delta t\, Io}{Co + Cp2} \quad (212)$$

Figure 10:
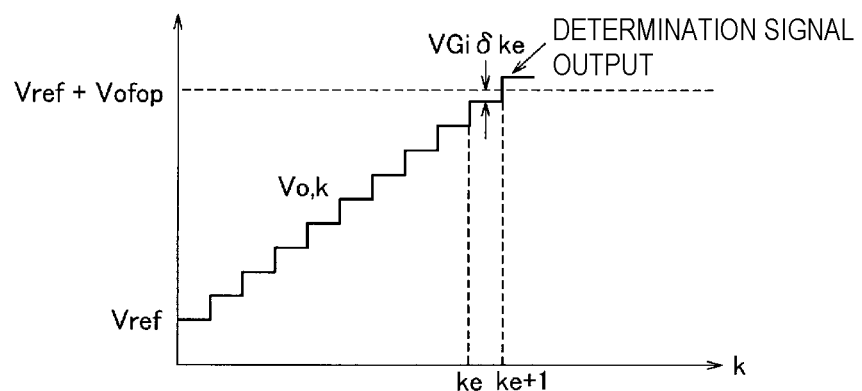
FIG. 10 is a schematic diagram schematically showing the operation of a determiner shown in FIG. 8.

In the offset measurement processing, since SW3 is set in the connected state first, Vo,0 is Vref. A relation between the negative input voltage Vo,k and the number of times of integration k with respect to the positive input voltage Vref+Vofop of the operational amplifier 92 is shown in FIG. 10. Vo,k increases and approaches Vref+Vofop as the number of times of integration increases. When the number of times of integration in which the output of the operational amplifier 92 changes from the high-output voltage of the first output to the low-output voltage is represented as ke+1, ke is defined as the number of times of offset integration. The following expression holds when the positive and negative inputs of the operational amplifier 92 are equal.

Formula 138

$$Vref+Vofop=(ke+\delta ke)VGi+Vref \quad (213)$$

In expression (213), $\delta ke$ is a real number equal to or larger than 0 and smaller than 1. $VGi\delta ke$ represents a difference between Vref+Vofop and a voltage of Co at the time of the number of times of integration ke.

In the integration unit measurement processing in the case of Vofop>0, a6 and b6 of SW5 are connected, s5 and b5 of SW4 are connected, and SW3 is set in the disconnected state. First, a first number of times of integration is measured in a state in which s21 and s24 of the third crossbar switch 93 are connected and s22 and s23 of the third crossbar switch 93 are connected. Subsequently, a second number of times of integration is measured in a state in which s21 and s23 of the third crossbar switch 93 are connected and s22 and s24 of the third crossbar switch 93 are connected. In the measurement of the first number of times of integration and the second number of times of integration, the charge accumulation step and the comparison step are repeatedly executed.

After SW1 is set in the disconnected state, SW2 is set in the connected state and the charges accumulated in Co are reset. Thereafter, in the charge accumulation step, SW1 is set in the connected state in the period of the predetermined time Δt. Thereafter, SW1 is set in the disconnected state. When respective voltages of Co before and after SW1 is set in the connected state in the period of the predetermined time Δt are represented as Vo,0 and Vo,1, the following relational expression is obtained.

Formula 139

$$(Co+Cp2)Vo,1 = (Co+Cp2)Vo,0 + \Delta t\, Io$$
$$Vo,1 = Vo,0 + \frac{\Delta t\, Io}{Co+Cp2} \quad (214)$$

In the comparison step, the output of the operational amplifier 92 is monitored by the control/processing unit. The charge accumulation step and the comparison step are repeated until the output of the operational amplifier 92 changes from the first high-output voltage to the low-output voltage. An output of the operational amplifier 92 at the time when the charge accumulation step and the comparative step are repeated k times is the same as Expression (211). When the number of times of integration in which the output of the operational amplifier 92 changes from the high-output voltage of the first output to the low-output voltage is represented as kf1+1, the kf1 is a first number of times of integration. The following equation holds about the first number of times of integration.

Formula 140

$$Vref+Vofop=(kf1+\delta kf1)VGi \quad (215)$$

In Expression (215), $\delta kf1$ is a real number equal to or larger than 0 and smaller than 1. $VGi\delta kf1$ represents a difference between Vref+Vofop and a voltage of Co at the time of the number of times of integration kf1.

After the first number of times of integration is obtained, s21 and s23 of the crossbar switch 2 are connected and s22 and s24 of the crossbar switch 2 are connected and, after SW1 is set in the disconnected state, SW2 is set in the connected state to reset the charges accumulated in Co. Thereafter, the charge accumulation step and the comparison step are repeatedly executed until the second integration unit voltage is obtained. The first output of the operational amplifier 92 in this state is the low-output voltage.

Figure 9A:
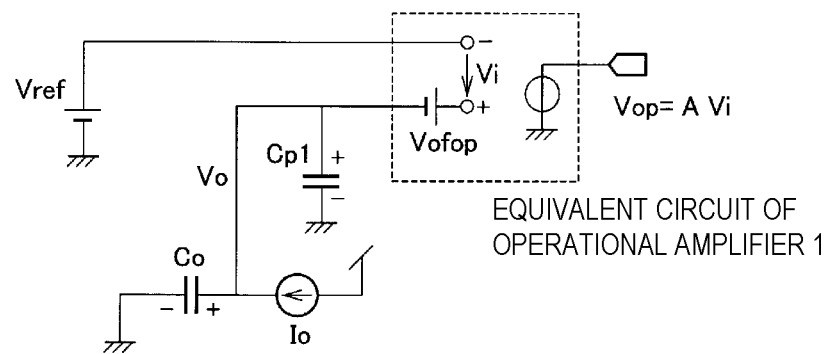
FIGS. 9(a) and 9(b) are diagrams showing an equivalent circuit of an operational amplifier shown in FIG. 6.

Since the connection of s21 and s23 of the third crossbar switch 93 and the connection of s22 and s24 of the third crossbar switch 93 are equivalent to the equivalent circuit shown in FIG. 9(a), Co and Cp1 are connected in parallel. In the charge accumulation step, SW1 is set in the connected state in the period of the predetermined time Δt. Thereafter, SW1 is set in the disconnected state. A relational expression between the voltages Vo,0 and Vo,1 before and after SW1 is set in the connected state in the period of the predetermined time Δt is an expression in which Cp2 of Expression (210) is replaced with Cp1.

Formula 141

$$Vo,1 = Vo,0 + \frac{\Delta t\, Io}{Co+Cp1} \quad (216)$$

In the comparison step, the output of the operational amplifier 92 is monitored by the control unit 80. The charge accumulation step and the comparison step are repeatedly executed until the output of the operational amplifier 92 changes from the first low-output voltage to the high-output voltage. A voltage of Co at the time when the charge accumulation step and the comparison step are repeated k times is represented by the following expressions because Vo,0 is zero.

Formula 142

$$Vo,k = k\frac{\Delta t\, Io}{Co+Cp1} = k\, VGj \quad (217)$$

$$VGj = \frac{\Delta t\, Io}{Co+Cp1} \quad (218)$$

When the number of times of integration in which, in the comparison step, the output of the operational amplifier 92 changes from the low-output voltage of the first output to the high-output voltage is represented as kf2+1, kf2 is a second number of times of integration. The following equation holds about the second number of times of integration.

Formula 143

$$Vref=(kf2+\delta kf2)VGj+Vofop \quad (219)$$

In Expression (219), $\delta kf2$ is a real number equal to or larger than 0 and smaller than 1. $VGj\delta kf2$ represents a difference between Vref and a sum of a voltage of Co at the time of the number of times of integration kf2 and Vofop.

Figure 11:
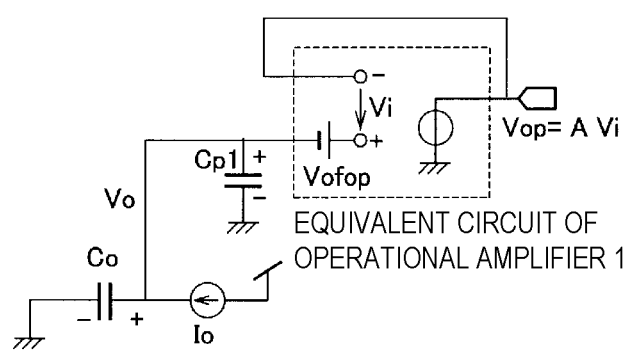
FIG. 11 is a schematic diagram schematically showing another operation example of the determiner shown in FIG. 8.

In the buffer gain calibration processing, a6 and c6 of SW5 are connected, a5 and c5 of SW4 are connected, and SW3 is set in the disconnected state. Further, s21 and s23 of the crossbar switch 2 are connected and s22 and s24 of the crossbar switch 2 are connected. An equivalent circuit of the operational amplifier in this case is shown in FIG. 11. When a gain of the operational amplifier 92 is represented as A, a relational expression between the output Vop of the operational amplifier 92 and the positive input Vo of the operational amplifier 92 is as follows.

Formula 144

$$Vop = A(Vo + Vofop - Vop) \quad (220)$$

$$Vop = \frac{A}{A+1}(Vo + Vofop) = Ae(Vo + Vofop) \quad (221)$$

$$Ae = \frac{A}{A+1}$$

In the buffer gain calibration processing, the charge accumulation step and the comparison step are repeatedly carried out to calculate the number of times of integration in which the determination signal is output in the state in which s11 and s13 of the first crossbar switch 31 are connected and s12 and s14 of the first crossbar switch 31 are connected and the number of times of integration in which the determination signal is output in the state in which s11 and s14 of the first crossbar switch 31 are connected and s12 and s13 of the first crossbar switch 31 are connected.

After SW1 is set in the disconnected state first, SW2 is set in the connected state to reset the charges accumulated in Co. Thereafter, SW2 is set in the disconnected state to execute the charge accumulation step.

In the charge accumulation step, SW1 is set in the connected state in the period of the predetermined time Δt. Thereafter, SW1 is set in the disconnected state. When voltages of Co before and after SW1 is set in the connected state in the period of the predetermined time Δt are respectively represented as Vo,0 and Vo,1, a relational expression of Expression (216) is obtained. The voltage Vo,k of the capacitor Co at the time when this is repeated k times is represented by Expression (217). Therefore, the output Vop,k of the operational amplifier 92 is represented by the following expression according to Expression (220).

Formula 145

$$Vop,k = Ae(kVGj + Vofop) \quad (222)$$

In the comparison step, the determination signal of the determiner 32 is monitored by the control unit 80 in the state in which s11 and s13 of the first crossbar switch 31 are connected and s12 and s14 of the first crossbar switch 31 are connected and the state in which s11 and s14 of the first crossbar switch 31 are connected and s12 and s13 of the first crossbar switch 31 are connected.

In the state in which s11 and s13 of the first crossbar switch 31 are connected and s12 and s14 of the first crossbar switch 31 are connected, the output of the operational amplifier is connected to the positive input of the determiner 32 and Vref is connected to the negative input of the determiner 32. A voltage Vop,k+Vofc obtained by adding the offset voltage Vofc of the determiner 32 to the positive input voltage Vop,k of the determiner 32 in the state in which s11 and s13 of the first crossbar switch 31 are connected and s12 and s14 of the first crossbar switch 31 are connected and the negative input voltage Vref are compared by the determiner 32. When the number of times Vop,k+Vofc becomes larger than Vref for the first time and the determination signal is detected is represented as kj1+1, kj1 is defined as a first number of times of gain calibration integration. The following equation holds about the first number of times of gain calibration integration kj1.

[Formula 146]

$$Vref = Ae\{(kj1+\delta kj1)VGj + Vofop\} + Vofc \quad (223)$$

In Expression (223), δkj1 is a real number equal to or larger than 0 and smaller than 1. VGjδkj1 represents a difference between Vref and an output of the operational amplifier 92 at the time of the number of times of integration kj1 and the offset voltage of the determiner 32.

In the state in which s11 and s14 of the first crossbar switch 31 are connected and s12 and s13 of the first crossbar switch 31 are connected, Vref is connected to the positive input of the determiner 32 and the output of the operational amplifier 92 is connected to the negative input of the determiner 32. The charge accumulation step and the comparison step are repeated. In the state in which s11 and s14 of the first crossbar switch 31 are connected and s12 and s13 of the first crossbar switch 31 are connected, when the number of times the determination signal is detected for the first time is represented as kj2+1, kj2 is defined as a second number of times of gain calibration integration. The following equation holds about the second number of times of gain calibration integration kj2.

Formula 147

$$Ae\{(kj2+\delta kj2)VGj + Vofop\} = Vref + Vofc \quad (224)$$

In Expression (224), the left side is a negative input voltage of the determiner 32 and the right side is a voltage obtained by adding the offset voltage of the determiner to a positive input voltage. δkj2 is a real number equal to or larger than 0 and smaller than 1.

In the output state, since a voltage represented by Expression (222) is output from the operational amplifier 92, after measurement by the first and second numbers of times of gain calibration integration is completed, calibration values of VGj, Vofop, and Ae are determined. To simplify expression expansion, it is assumed that Ke=ke+δke, Kf1=kf1+δkf1, Kf2=kf2+δkf2, Kj1=kj1+δkj1, and Kj2=kj2+δkj2. The following expression is obtained from Expression (213).

Formula 148

$$VGi = \frac{Vofop}{Ke} \quad (225)$$

Expression (225) is substituted in Expression (215) to obtain the following expression.

Formula 149

$$Vref + Vofop = Kf1\frac{Vofop}{Ke} \quad (226)$$

$$Vofop = \frac{Ke}{Kf1 - Ke}Vref$$

The following expression is obtained from Expression (219).

Formula 150

$$Vref = Kf2 VGj + Vofop \quad (227)$$
$$VGj = \frac{Vref - Vofop}{Kf2}$$

A difference between Expression (223) and Expression (224) is calculated to obtain the following expression.

Formula 151

$$Vref - Ae(Kj2VGj + Vofop) = \quad (228)$$
$$Ae(Kj1\ VGj + Vofop) + Vofc - Vref - Vofc$$
$$Ae\{(Kj1 + Kj2)VGj + 2Vofop\} = Vref$$
$$Ae = \frac{Vref}{(Kj1 + Kj2)VGj + 2Vofop}$$

A method of removing unknown real numbers δke, δkf1, δkf2, δkj1, and δkj2 included in VGj, Vofop, and Ae and determining calibration values of VGj, Vofop, and Ae is explained below. Expression (226) is partially differentiated about δke and δkf1 to obtain the following expressions.

Formula 152

$$\frac{\partial Vofop}{\partial(\delta ke)} = \quad (229)$$
$$\frac{1}{Kf1 - Ke}Vref + \frac{Ke}{(Kf1 - Ke)^2}Vref = \frac{Kf1}{(Kf1 - Ke)^2}Vref > 0$$

$$\frac{\partial Vofop}{\partial(\delta kf1)} = -\frac{Ke}{(Kf1 - Ke)^2}Vref < 0 \quad (230)$$

According to Expression (229) and Expression (230), Vofop monotonously decreases with respect to δkf1 and monotonously increases with respect to δke. Accordingly, a range of Vofop is represented by the following expression.

Formula 153

$$\frac{ke}{kf1 - ke + 1}Vref < Vofop < \frac{ke + 1}{kf1 - ke - 1}Vref \quad (231)$$

If a calibration value of Vofop is set to Vofopc represented by Expression (232), which is the median of a range of Expression (231), the calibration value of Vofop can be derived at accuracy lower than ΔVofop represented by Expression (233).

Formula 154

$$Vofopc = \frac{ke + 1}{2(kf1 - ke - 1)}Vref + \frac{ke}{2(kf1 - ke + 1)}Vref \quad (232)$$

$$\Delta Vofop = \frac{ke + 1}{2(kf1 - ke - 1)}Vref - \frac{ke}{2(kf1 - ke + 1)}Vref \quad (233)$$

Expression (227) is partially differentiated about δke, δkf1, and δkf2 to obtain the following expressions.

Formula 155

$$\frac{\partial VGj}{\partial(\delta ke)} = -\frac{\partial Vofop}{\partial(\delta ke)} < 0 \quad (234)$$

$$\frac{\partial VGj}{\partial(\delta kf1)} = -\frac{\partial Vofop}{\partial(\delta kf1)} > 0 \quad (235)$$

$$\frac{\partial VGj}{\partial(\delta kf2)} = -\frac{Vref - Vofop}{Kf2^2} < 0 \quad (236)$$

According to Expression (234), Expression (235), and Expression (236), VGj monotonously decreases with respect to δke and δkf2 and monotonously increases with respect to δkf1. Expression (226) is substituted in Expression (227) to obtain the following expression. A range of VGj is represented by Expression (237).

Formula 156

$$VGj = \quad (237)$$
$$\frac{Vref - Vofop}{Kf2} = \frac{Vref}{Kf2}\left(1 - \frac{Ke}{Kf1 - Ke}\right) = \frac{Kf1 - 2Ke}{Kf2(Kf1 - Ke)}Vref$$
$$\frac{kf1 - 2ke - 2}{(kf2 + 1)(kf1 - ke - 1)}Vref < VGj < \frac{kf1 - 2ke + 1}{kf2(kf1 - ke + 1)}Vref$$

If a calibration value of VGj is set to VGjc represented by Expression (238), which is the median of a range of Expression (237), the calibration value of VGj can be derived at accuracy lower than ΔVGj represented by Expression (239).

Formula 157

$$VGjc = \frac{kf1 - 2ke + 1}{2kf2(kf1 - ke + 1)}Vref + \frac{kf1 - 2ke - 1}{2(kf2 + 1)(kf1 - ke - 1)}Vref \quad (238)$$

$$\Delta VGj = \frac{kf1 - 2ke + 1}{2kf2(kf1 - ke + 1)}Vref - \frac{kf1 - 2ke - 1}{2(kf2 + 1)(kf1 - ke - 1)}Vref \quad (239)$$

Expression (229) is partially differentiated about δke, δkf1, δkf2, δkj1, and δkj2 to obtain the following expression.

Formula 158

$$\frac{\partial Ae}{\partial(\delta ke)} = \frac{(Kj1 + Kj2)Vref}{\{(Kj1 + Kj2)VGj + 2Vofop\}^2}\frac{\partial Vgj}{\partial(\delta ke)} - \quad (240)$$
$$\frac{2Vref}{\{(Kj1 + Kj2)VGj + 2Vofop\}^2}\frac{\partial Vofop}{\partial(\delta ke)}$$
$$= \frac{(Kj1 + Kj2) - 2}{\{(Kj1 + Kj2)VGj + 2Vofop\}^2}Vref\frac{\partial Vofop}{\partial(\delta ke)} > 0$$

$$\frac{\partial Ae}{\partial(\delta kf1)} = \frac{(Kj1 + Kj2) - 2}{\{(Kj1 + Kj2)VGj + 2Vofop\}^2}Vref\frac{\partial Vofop}{\partial(\delta kf1)} < 0 \quad (241)$$

$$\frac{\partial Ae}{\partial(\delta kf2)} = -\frac{(Kj1 + Kj2)Vref}{\{(Kj1 + Kj2)VGj + 2Vofop\}^2}\frac{\partial VGj}{\partial(\delta kf2)} > 0 \quad (242)$$

$$\frac{\partial Ae}{\partial(\delta kj1)} = -\frac{VGj}{\{(Kj1 + Kj2)VGj + 2Vofop\}^2}Vref < 0 \quad (243)$$

$$\frac{\partial Ae}{\partial(\delta kj2)} = -\frac{VGj}{\{(Kj1 + Kj2)VGj + 2Vofop\}^2}Vref < 0 \quad (244)$$

According to Expression (240), Expression (241), Expression (242), Expression (243), and Expression (244) Ae monotonously decreases with respect to δkf1, δkj1, δkj2 and monotonously increases with respect to δke and δkf2. Expression (226) and Expression (227) are substituted in Expression (228) to obtain the following expression. A range of Ae is represented by Expression (245).

Formula 159

$$Ae = \frac{Vref}{(Kj1+Kj2)VGj+2Vofop} = $$
$$\frac{1}{(Kj1+Kj2)\frac{Kf1-2Ke}{Kf2(Kf1-Ke)}+2\frac{Ke}{Kf1-Ke}} = $$
$$\frac{Kf2(Kf1-Ke)}{(Kj1+Kj2)(Kf1-2Ke)+KeKf2}$$
$$\frac{kf2(kf1-ke+1)}{(kj1+kj2+2)(kf1-2ke+1)+2kckf2} < Ae < $$
$$\frac{(kf2+1)9kf1-ke-1)}{(kj1+kj2)(kf1-2ke-2)+2(ke+1)(kf2+1)} \quad (245)$$

If a calibration value of Ae is set to Aec represented by Expression (246), which is the median of a range of Expression (245), the calibration value of Ae can be derived at accuracy lower than ΔAe represented by Expression (247).

Formula 160

$$Aec = \frac{1}{2}\frac{(kf2+1)(kf1-ke-1)}{(kj1+kj2)(kf1-2ke-2)+2(ke+1)(kf2+1)} + \frac{1}{2}\frac{kf2(kf1-ke+1)}{(kj1+kj2+2)(kf1-2ke+1)+kekf2} \quad (246)$$

$$\Delta Ae = \frac{1}{2}\frac{(kf2+1)(kf1-ke-1)}{(kj1+kj2)(kf1-2ke-2)+2(ke+1)(kf2+1)} - \frac{1}{2}\frac{kf2(kf1-ke+1)}{(kj1+kj2+2)(kf1-2ke+1)+kekf2} \quad (247)$$

Consequently, in this embodiment, in the calibration state, a measuring instrument serving as a reference for calibration is unnecessary on the outside of a sensor node even after sensor circuit setting. Calibration values of the offset voltage Vofop, the integration unit voltage VGj, and the buffer gain Ae of the operational amplifier 92 can be derived at predetermined accuracy.

When the processing explained above is completed, the control unit 80 outputs the calibration values of the offset voltage Vofop, the integration unit voltage VGj, and the buffer gain Ae of the operational amplifier 92 as correction data.

In the above explanation, Vofop>0. However, the configuration of VGj, Vofopb, and Ae are possible even when Vofop<0.

When it is determined Vofop<0 in the offset polarity determination processing, the processing shifts to the offset measurement processing while s21 and s23 of the third crossbar switch 93 and s22 and s24 of the third crossbar switch 93 are kept connected.

In the offset measurement processing, connection of the switches other than the third crossbar switch 93 is the same as that in the case of Vofop>0. Therefore, explanation about the connection is omitted.

The state in which s21 and s23 of the third crossbar switch 93 are connected and s22 and s24 of the third crossbar switch 93 are connected is equivalent to FIG. 9(a). Therefore, parasitic capacitance is Cp1. Accordingly, the voltage Vo,k of Co at the time when the charge accumulation step and the comparison step are repeated k times is the following expression in which Cp2 of Expression (211) is replaced with Cp1.

Formula 161

$$Vo,k = k\frac{\Delta t\, Io}{Co+Cp1}+Vo,0 = k\,VGj+Vo,0 \quad (248)$$

In the offset measurement processing, since SW3 is set in the connection state first and thereafter set in the disconnected state, Vo,0=Vref. In a state in which the s21 and s23 of the third crossbar switch 93 are connected and s22 and s24 of the third crossbar switch 93 are connected, Vo,k is input to the positive input of the operational amplifier 92. Vo,k+Vofop and the negative input Vref are equivalently compared. Vo,k increases and approaches Vref as the number of times of integration increases. When the number of times of integration in which the output of the operational amplifier 92 changes from the low-output voltage of the first output to the high-output voltage is represented as ke+1, ke is defined as the number of offset integration. The following expression holds when the positive and negative inputs of the operational amplifier 92 are equal.

Formula 162

$$Vref=(ke+\delta ke)VGj+Vref+Vofop \quad (249)$$

In Expression (249), δke is a real number equal to or larger than 0 and smaller than 1. VGjδke represents a difference between a sum of a voltage of Co at the time of the number of times of integration ke and Vofop and Vref.

In the integration unit measurement processing in the case of Vofop<0, the charge accumulation step and the comparison step are repeatedly executed to measure a first number of times of integration in the state in which s21 and s23 of the third crossbar switch 93 are connected and s22 and s24 of the third crossbar switch 93 are connected. Connection of SW5, SW4, and SW3 is the same as that in the case of Vofop>0. Since the voltage of Co is input to the positive input of the operational amplifier 92 and Vref is input to the negative input of the operational amplifier 92, when the charges of Co are reset, the low-output voltage is output as the output of the operational amplifier 92.

Since the operations of SW1 and SW2 are also the same as the operations in the case of Vofop>0, explanation of detailed operations is omitted. A voltage of Co at the time when the charge accumulation step and the charge comparison step are repeated k times is Expression (217). When the number of times of integration in which the output of the operational amplifier 92 changes from the low-output voltage of the first output to the high-output voltage is represented as kf1+1, kf1 is a first number of times of integration. The following equation holds about the first number of times of integration.

Formula 163

$$Vref=(kf1+\delta kf1)VGj+Vofop \quad (250)$$

In Expression (250), δkf1 is a real number equal to or larger than 0 and smaller than 1. VGjδkf1 represents a difference between a sum of a voltage of Co at the time of the number of times of integration kf1 and Vofop and Vref.

The operation of the buffer gain calibration processing is the same as the operation in the case of Vofop>0. Therefore, explanation of the operation is omitted.

In the output state, the voltage represented by Expression (222) is output from the operational amplifier 92. After measurement by the first and second numbers of times of gain calibration integration is completed, calibration values of VGj, Vofop, and Ae are determined. To simplify expression expansion, it is assumed that Ke=ke+δke, Kf1=kf1+δkf1, Kj1=kj1+δkj1, and K2j=kj2+δkj2. A difference between Expression (250) and Expression (249) is calculated to obtain the following expression.

Formula 164

$$0 = (Kf1 - Ke)VGj - Vref \qquad (251)$$

$$VGj = \frac{Vref}{Kf1 - Ke}$$

Expression (251) is substituted in Expression (249) to obtain the following expression.

Formula 165

$$0 = Ke\, VGj + Vofop \qquad (252)$$

$$Vofop = \frac{-Ke}{Kf1 - Ke} Vref$$

Ae is the same as that in the case of Vofop>0 and is represented by Expression (228). In the following explanation, a method of determining calibration values of VGj, Vofop, and Ae is explained. Expression (226) is partially differentiated about δke and δkf1 to obtain the following expression.

Formula 166

$$\frac{\partial Vofop}{\partial(\delta ke)} = \qquad (253)$$

$$\frac{-1}{Kf1 - Ke}Vref - \frac{Ke}{(Kf1 - Ke)^2}Vref = \frac{-Kf1}{(Kf1 - Ke)^2}Vref < 0$$

$$\frac{\partial Vofop}{\partial(\delta kf1)} = \frac{Ke}{(Kf1 - Ke)^2}Vref > 0 \qquad (254)$$

According to Expression (223) and Expression (224), Vofop monotonously decreases with respect to δke and monotonously increases with respect to δkf1. Accordingly, a range of Vofop is represented by the following expression.

Formula 167

$$\frac{-ke - 1}{kf1 - ke - 1}Vref < Vofop < \frac{-ke}{kf1 - ke + 1}Vref \qquad (255)$$

If a calibration value of Vofop is set to Vofopc represented by Expression (256), which is the median of a range of Expression (255), the calibration value of Vofop can be derived at accuracy lower than ΔVofop represented by Expression (257).

Formula 168

$$Vofopc = \frac{-ke}{2(kf1 - ke + 1)}Vref + \frac{-ke - 1}{2(kf1 - ke - 1)}Vref \qquad (256)$$

$$\Delta Vofop = \frac{-ke}{2(kf1 - ke + 1)}Vref - \frac{-ke - 1}{2(kf1 - ke - 1)}Vref \qquad (257)$$

Expression (251) is partially differentiated about δke and δk+1 to obtain the following expression.

Formula 169

$$\frac{\partial VGj}{\partial(\delta ke)} = \frac{Vref}{(Kf1 - Ke)^2} > 0 \qquad (258)$$

$$\frac{\partial VGj}{\partial(\delta ke)} = -\frac{Vref}{(Kf1 - Ke)^2} < 0 \qquad (259)$$

According to Expression (258) and Expression (259), VGj monotonously decreases with respect to δkf1 and monotonously increases with respect to δke. Accordingly, a range of VGj is represented by Expression (260).

Formula 170

$$\frac{Vref}{kf1 - ke + 1} < VGj < \frac{Vref}{kf1 - ke - 1} \qquad (260)$$

If a calibration value of VGj is set to VGjc represented by Expression (261), which is the median of a range of Expression (260), the calibration value of VGj can be derived at accuracy lower than ΔVGj represented by Expression (262).

Formula 171

$$VGjc = \frac{Vref}{2(kf1 - ke - 1)} + \frac{CVref}{2(kf1 - ke + 1)} \qquad (261)$$

$$\Delta VGj = \frac{Vref}{2(kf1 - ke - 1)} - \frac{CVref}{2(kf1 - ke + 1)} \qquad (262)$$

Expression (228) is partially differentiated about δkf1 to obtain the following expression.

Formula 172

$$\frac{\partial Ac}{\partial(\delta kf1)} = -\frac{(Kj1 + Kj2)Vref}{\{(Kj1 + Kj2)VGj + 2Vofop\}^2}\frac{\partial VGj}{\partial(\delta kf1)} - \qquad (263)$$

$$\frac{2Vref}{\{(Kj1 + Kj2)VGj + 2Vofop\}^2}\frac{\partial Vofop}{\partial(\delta kf1)}$$

$$= \frac{Vref}{\{(Kj1 + Kj2)VGj + 2Vofop\}^2}\left\{\frac{Kj1 + Kj2}{(Kf1 - Ke)^2} - \frac{2Ke}{(Kf1 - Ke)^2}\right\}$$

$$= \frac{Vref}{\{(Kj1 + Kj2)VGj + 2Vofop\}^2}\frac{Kj1 + Kj2 - 2Ke}{(Kf1 - Ke)^2} > 0$$

Expressions obtained by partially differentiating Expression (228) about δkj1 and δkj2 are Expression (243) and Expression (244). According to Expression (263), Expression (243), and Expression (244), Ae monotonously decreases with respect to δkj1 and δkj2 and monotonously increases with respect to kf1. Expression (251) and Expression (252) are substituted in Expression (228) to obtain the following expression. When an expression obtained by partially differentiating Expression (228) about δke is positive, a range of Ae is represented by Expression (264).

Formula 173

$$Ae = \frac{Vref}{(Kj1 + Kj2)VGj + 2Vofop} = \frac{1}{(Kj1 + Kj2)\frac{1}{Kf1-Ke} + 2\frac{-Ke}{Kf1-Ke}} = \frac{Kf1-Ke}{(Kj1-Kj2)-2Ke} \quad (264)$$

$$\frac{kf1-ke}{(kj1+kj2+2)-2ke} < Ae < \frac{kf1-ke}{(kj1+kj2)-2(ke+1)}$$

If a calibration value of Ae is set to Aec represented by Expression (265), which is the median of a range of Expression (264), the calibration value of Ae can be derived at accuracy lower than ΔAe represented by Expression (266).

Formula 174

$$Aec = \frac{1}{2}\frac{kf1-ke}{(kj1+kj2)-2(ke+1)} + \frac{1}{2}\frac{kf1-ke}{(kj1+kj2+2)-2ke} \quad (265)$$

$$\Delta Ae = \frac{1}{2}\frac{kf1-ke}{(kj1+kj2)-2(ke+1)} - \frac{1}{2}\frac{kf1-ke}{(kj1+kj2+2)-2ke} \quad (266)$$

When an expression obtained by partially differentiating Expression (228) about δke is negative, the range of Ae is represented by Expression (267).

Formula 175

$$\frac{kf1-ke-1}{(kj1+kj2+2)-2(ke+1)} < Ae < \frac{kf1-ke+1}{(kj1+kj2)-2ke} \quad (267)$$

If a calibration value of Ae is set to Aec represented by Expression (268), which is the median of a range of Expression (267), the calibration value of Ae can be derived at accuracy lower than ΔAe represented by Expression (269).

Formula 176

$$Aec = \frac{1}{2}\frac{kf1-ke}{(kj1+kj2)-2(ke+1)} + \frac{1}{2}\frac{kf1-ke}{(kj1+kj2+2)-2ke} \quad (268)$$

$$\Delta Ae = \frac{1}{2}\frac{kf1-ke}{(kj1+kj2)-2(ke+1)} - \frac{1}{2}\frac{kf1-ke}{(kj1+kj2+2)-2ke} \quad (269)$$

Consequently, even in the case of Vofop<0, in the calibration state, a measuring instrument serving as a reference for calibration is unnecessary on the outside of a sensor node even after sensor circuit setting. It is possible to derive, at predetermined accuracy, calibration values of the offset voltage Vofop, the integration unit voltage VGj, and the buffer gain Ae of the operational amplifier 92.

When the processing explained above is completed, the control unit 80 outputs the calibration values of the offset voltage Vofop, the integration unit voltage VGj, and the buffer gain Ae of the operational amplifier 92 as calibration data.

When the sensor circuit is calibrated, the variable reference voltage source 400 is set in an output state. A voltage set by setting data including the number of times of integration k is output. In the output state, after the setting data is acquired by the control unit 80, charges accumulated in Co are initialized by closing SW2. Subsequently, SW2 is opened and the accumulation step and the comparison step are repeatedly executed by the number of times of integration of k. When the accumulation step and the comparison step for the number of times of integration are completed, the control/processing unit outputs calibration data representing the completion.

A voltage output from the variable reference voltage source 400 can be treated as a known voltage because the voltage can be derived from Expression (222) using the calibration values of VGj, Vofopb, and Ae derived in the calibration state. Therefore, the known voltage output from the variable reference voltage source 400 is input to the amplifier and the AD converter of the sensor circuit. It is possible to calibrate an offset and a gain of the amplifier and an offset of the AD converter from a correlation with the output.

A measuring instrument serving as a reference for calibration is unnecessary on the outside of a sensor node even after sensor circuit setting. Calibration values of the offset and the integration unit voltage can be calculated at predetermined accuracy according to a calibration state of the variable reference voltage source 400 in this embodiment. Therefore, it is possible to perform calibration of the sensor circuit even if the offset and the integration unit voltage change because of a change with time.

In the derivation of the calibration value of Ae in the second embodiment explained above, the number of times of offset integration ke, the first number of times of integration kf1, and the second number of times of integration kf2 are substituted in Expression (246), Expression (265), or Expression (268). Besides this method, it is also possible to substitute derived VGjc and Vofopc respectively in VGj and Vofop of Expression (228) to derive Ae.

In this case, according to Expression (243) and Expression (244) partially differentiated about δkj1 and δkj2 of Expression (228), a range of Ae is Expression (270).

Formula 177

$$\frac{Vref}{(kj1+kj2+2)VGjc+2Vofopc} < Ae \le \frac{Vref}{(kj1+kj2)VGjc+2Vofopc} \quad (270)$$

If a calibration value of Ae is set to Aec represented by Expression (271), which is the median of a range of Expression (270), the calibration value of Ae can be derived at accuracy lower than ΔAe represented by Expression (272).

Formula 178

$$Aec = \frac{1}{2}\frac{Vref}{(kj1+kj2+2)VGjc+2Vofopc} + \quad (271)$$
$$\frac{1}{2}\frac{Vref}{(kj1+kj2+2)VGjc+2Vofopc}$$

$$\Delta Ae = \frac{1}{2}\frac{Vref}{(kj1+kj2+2)VGjc+2Vofopc} - \quad (272)$$
$$\frac{1}{2}\frac{Vref}{(kj1+kj2+2)VGjc+2Vofopc}$$

With this method, an expression for deriving the calibration value of Ae is only Expression (271) irrespective of a sign of Vofop. Derivation processing for Ae is simplified.

Second Configuration of the Second Embodiment

Figure 12:
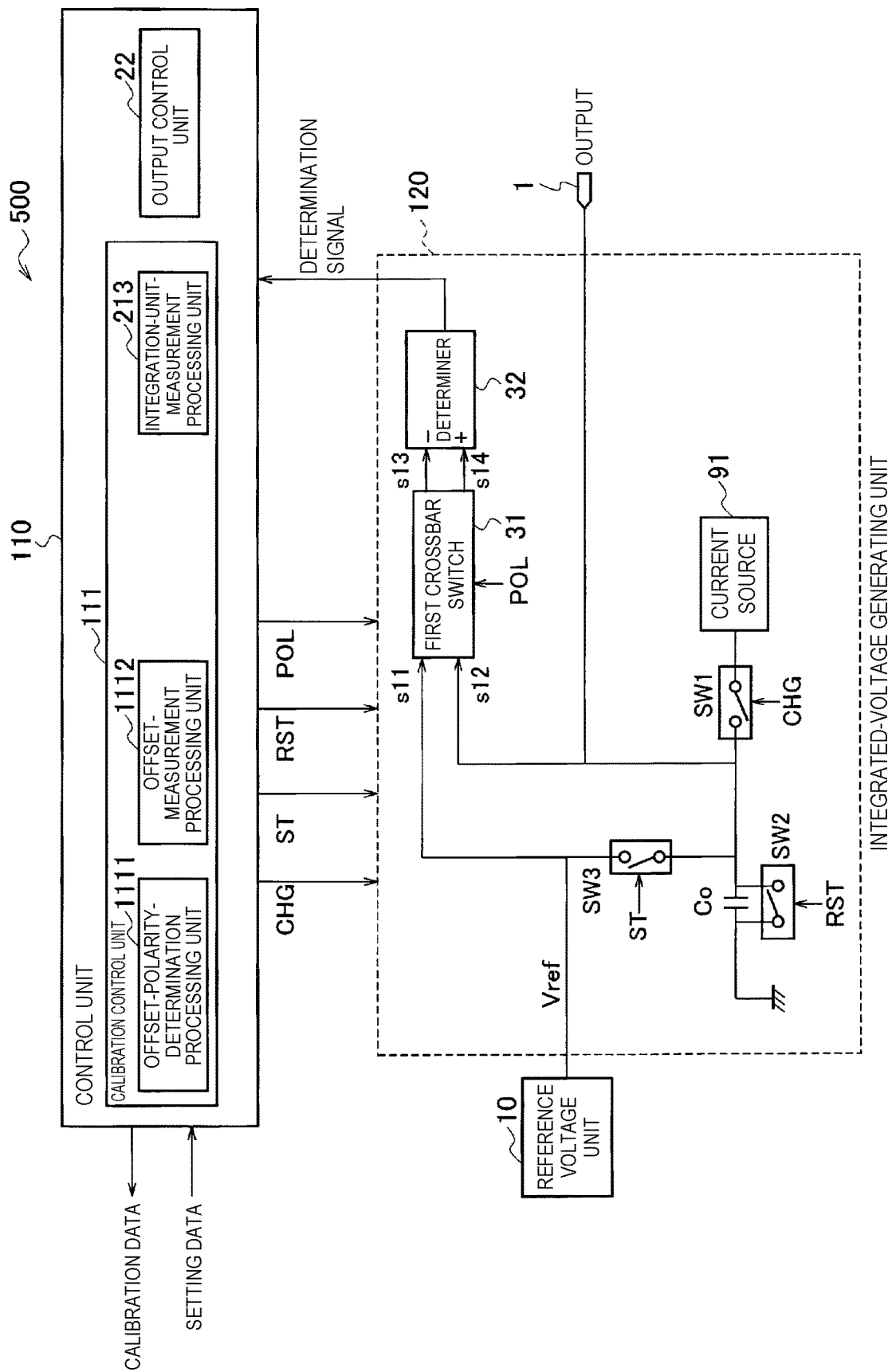
FIG. 12 is a functional block diagram showing another configuration example of an integrated-voltage generating unit shown in FIG. 8.

A second configuration of the integrated-voltage generating unit in the second embodiment according to the present invention is shown in FIG. 12. The integrated-voltage generating unit 90 shown in FIG. 12 is configured by the determiner 32 that has positive and negative inputs and determines that a positive input voltage exceeds a negative input voltage during a calibration state and outputs a determination signal, the first crossbar switch 31 used for measurement of an offset voltage of the determiner 32, the capacitor Co, the current source 91 that supplies charges to the capacitor Co, SW1 connected when the charges are supplied to the capacitor Co, SW2 that resets the charges accumulated in the capacitor Co, and SW3 connected when an offset of the determiner 32 is determined.

In the calibration state in this embodiment, processing is executed in the order of the offset polarity determination processing, the offset measurement processing, and the integration unit measurement processing to calibrate an offset voltage and an integration unit voltage of the determiner 32. An offset-polarity-determination processing unit 1110 of a calibration control unit 111 executes the offset polarity determination processing. An offset-measurement processing unit 1111 of the calibration control unit 111 executes the offset measurement processing. The integration-unit-measurement processing unit 213 of the calibration control unit 111 executes the integration unit measurement processing.

In the offset polarity determination processing, SW3 is set in the connected state and SW1 and SW2 are set in the disconnected state according to an operation control signal output from a control unit 110. Further, s11 and s13 of the crossbar switch 1 are connected and s12 and s14 of the crossbar switch 1 are connected.

When an offset voltage of the determiner 32 is represented as Vofc, Vref+Vofc is equivalently input to the positive input of the determiner 32 and Vref is input to the negative input of the determiner 32. Accordingly, in the case of Vofc>0, a high-output voltage, which is a maximum value of the output of the determiner 32, is output. In the case of Vofc<0, a low-output voltage, which is a minimum value of the output of the determiner 32, is output. Therefore, in the case of Vofc>0, the determination signal is the high-output voltage. In the case of Vofc<0, the determination signal is the low-output voltage. When the control unit 110 detects that the determination signal is the high-output voltage, s11 and s14 of the first crossbar switch 31 are connected and s12 and s13 of the first crossbar switch 31 are connected. When the control unit 110 detects the low-output voltage, the processing shifts to the offset measurement processing without changing the connection of the first crossbar switch 31.

In the offset measurement processing, after SW1 is set in the disconnected state, SW3 is set in the connected state and thereafter set in the disconnected state. Thereafter, the charge accumulation step and the comparison step are repeated until the output of the determiner 32 changes. In the following explanation, Vofc>0, that is, s11 and s14 of the first crossbar switch 31 are connected and s12 and s13 of the first crossbar switch 31 are connected.

Figure 9B:
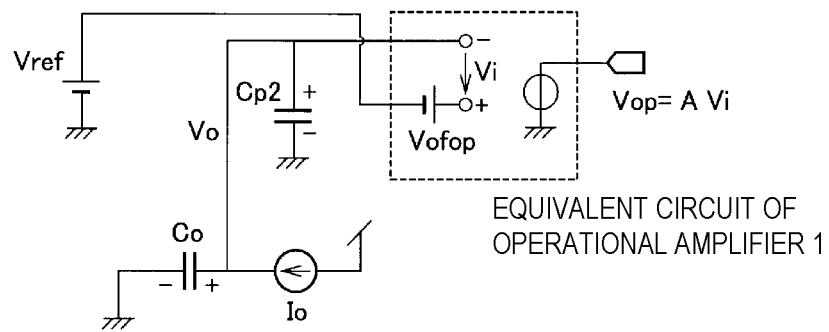

In this configuration example, the determiner 32 is represented by the same circuit model as the circuit model of the operational amplifier 92 in FIG. 9. The determiner 32 is an equivalent circuit in which Vofop of the operational amplifier 92 shown in FIG. 8 is replaced with Vofc. When s11 and s14 of the first crossbar switch 31 are connected and s12 and s13 of the first crossbar switch 31 are connected, the determiner 32 is an equivalent circuit in which the parasitic capacitance Cp2 is connected in parallel to Co as in FIG. 9(b). When s11 and s13 of the first crossbar switch 31 are connected and s12 and s14 of the first crossbar switch 31 are connected, the determiner 32 is an equivalent circuit in which the parasitic capacitance Cp1 is connected in parallel to Co as in FIG. 9(a).

In the charge accumulation step, SW1 is set in the connected state in the period of the predetermined time $\Delta t$ and, thereafter, SW1 is set in the disconnected state. When viewed from the current source 91, the capacitor Co and the parasitic capacitance Cp2 are connected in parallel. Therefore, charges supplied from the current source in the period of the predetermined time $\Delta t$ are accumulated such that voltages generated in Co and Cp2 are the same. When voltages of Co before and after SW1 is set in the connected state in the period of the predetermined time $\Delta t$ as in the embodiment shown in FIG. 8 are respectively represented as Vo,0 and Vo,1, the following expression is obtained from charges $\Delta t \cdot Io$ supplied from the current source in the period of the predetermined time $\Delta t$ and the charge conservation.

Formula 179

$$(Co + Cp2)Vo, 1 = (Co + Cp2)Vo, 0 + \Delta t\, Io \quad (273)$$
$$Vo, 1 = Vo, 0 + \frac{\Delta t\, Io}{Co + Cp2}$$

Subsequently, in the comparison step, the output of the determiner 32 is monitored by the control unit 110. The positive input of the determiner 32 is equivalently Vref+Vofc. If the negative input, which is the voltage of Co, is large, the output of the determiner 32 is the low-output voltage. If the negative input is small, the output of the determiner 32 is the high-output voltage. When the output of the determiner 32 is the high-output voltage, the processing shifts to the charge accumulation step.

In the case of Vofc>0, the charge accumulation step and the comparison step are repeated until the output of the determiner changes from the high-output voltage of the first output to the low-output voltage. Since the output of Co is represented by an arithmetical series according to Expression (273), a voltage Vo,k of Co at the time when the charge accumulation step and the comparison step are repeated k times is the following expression.

Formula 180

$$Vo,k = k\frac{\Delta t\ Io}{Co + Cp2} + Vo,0 = k\ VGi + Vo,0 \quad (274)$$

$$VGi = \frac{\Delta t\ Io}{Co + Cp2} \quad (275)$$

In the offset measurement processing, since SW3 is set in the connected state first, Vo,0 is Vref. Vo,k increases and approaches Vref+Vofc as the number of times of integration increases. When the number of times of integration in which the output of the determiner 32 changes from the high-output voltage of the first output to the low-output voltage is represented as ke+1, ke is defined as the number of times of offset integration. The following expression holds when the positive and negative inputs of the determine 32 are equal.

Formula 181

$$Vref - Vofc = (ke + \delta ke)VGi + Vref \quad (276)$$

In Expression (276), δke is a real number equal to or larger than 0 and smaller than 1. VGiδke represents a difference between Vref+Vofc and a voltage of Co at the time of number of times of integration ke.

In the integration unit measurement processing in the case of Vofc>0, SW3 is set in the disconnected state. First, a first number of times of integration is measured in the state in which the s11 and s14 of the first crossbar switch 31 are connected and s12 and s13 of the first crossbar switch 31 are connected. Subsequently, a second number of times of integration is measured in the state in which s11 and s13 of the first crossbar switch 31 are connected and s12 and s14 of the first crossbar switch 31 are connected. In the measurement of the first number of times of integration and the second number of times of integration, the charge accumulation step and the comparison step are repeatedly executed.

After SW1 is set in the disconnected state, SW2 is set in the connected state to reset the charges accumulated in Co. The operations in the charge accumulation step and the comparison step of the integration unit measurement processing in the case of Vofc>0 are the same as the operations of the offset measurement processing. Since the charges of Co are reset first, the voltage Vo,k of Co that repeats the charge accumulation step and the comparison step k times is represented by an expression Vo,0=0 in Expression (274).

Formula 182

$$Vo,k = k\frac{\Delta t\ Io}{Co + Cp2} \quad (27)$$

When the number of times of integration in which the output of the determiner 32 changes from the high-output voltage of the first output to the low-output voltage is represented as kf1+1, the kf1 is a first number of times of integration. The following equation holds about the first number of times of integration.

Formula 183

$$Vref + Vofop = kf1 + \delta kf1)VGi \quad (278)$$

In Expression (278), δkf1 is a real number equal to or larger than 0 and smaller than 1. VGiδkf1 represents a difference between Vref+Vofc and a voltage of Co at the time of the number of times of integration kf1.

After the first number of times of integration is obtained, s11 and s13 of the first crossbar switch 31 are connected and s12 and s14 of the first crossbar switch 31 are connected and, after, SW1 is set in the disconnected state, SW2 is set in the connected state to reset the charges accumulated in Co. Thereafter, the charge accumulation step and the comparison step are repeatedly executed until the second integration unit voltage is obtained. The output of the determiner 32 in this state is the low-output voltage at first.

In the charge accumulation step, SW1 is set in the connected state in the period of the predetermined time Δt. Thereafter, SW1 is set in the disconnected state. A relational expression between the voltages Vo,0 and Vo,1 before and after SW1 is set in the connected state in the period of the predetermined time Δt in the case in which the s11 and s13 of the first crossbar switch 31 are connected and s12 and s14 of the first crossbar switch 31 are connected is an expression in which Cp2 of Expression (273) is replaced with Cp1.

Formula 184

$$Vo,1 = Vo,0 + \frac{\Delta t\ Io}{Co + Cp1} \quad (279)$$

In the comparison step, the output of the determiner 32 is monitored by the control unit 110. The charge accumulation step and the comparison step are repeatedly executed until the output of the determiner 32 changes from the first low-output voltage to the high-output voltage. A voltage of Co at the time when the charge accumulation step and the comparison step are repeated k times is represented by the following expressions because Vo,0 is zero.

Formula 185

$$Vo,k = k\frac{\Delta t\ Io}{Co + Cp1} = k\ VGj \quad (280)$$

$$VGj = \frac{\Delta t\ Io}{Co + CP1} \quad (281)$$

When the number of times of integration in which, in the comparison step, the output of the determiner 32 changes from the low-output voltage of the first output to the high-output voltage is represented as kf2+1, kf2 is a second number of times of integration. The following equation holds about the second number of times of integration.

[Formula 186]

$$Vref = (kf2 + \delta kf2)VGj + Vofop \quad (282)$$

In Expression (282), δkf2 is a real number equal to or larger than 0 and smaller than 1. VGjδkf2 represents a difference between Vref and a sum of a voltage of Co at the time of the number of times of integration kf2 and Vofc.

Thereafter, calibration values of VGj and Vofc are determined. To simplify expression expansion, it is assumed that Ke=ke+δke, Kf1=kf1+δkf1, and Kf2=kf2+δkf2. The following expression is obtained from Expression (276).

Formula 187

$$Vgi = \frac{Vofc}{Ke} \quad (283)$$

Expression (283) is substituted in Expression (278) to obtain the following expression.

Formula 188

$$Vref + Vofc = Kf1 \frac{Vofc}{Ke} \quad (284)$$

$$Vofc = \frac{Ke}{Kf1 - Ke} Vref$$

The following expression is obtained from Expression (282).

Formula 189

$$Vref = Kf2 \, VGj + Vofc \quad (285)$$

$$VGj = \frac{Vref - Vofc}{Kf2}$$

A method of determining calibration values of VGj and Vofc is explained below. Expression (218) is partially differentiated about δke and δkf1 to obtain the following expression.

Formula 190

$$\frac{\partial Vofc}{\partial(\delta kc)} = \frac{1}{Kf1 \cdot Ke} Vref + \frac{Ke}{(Kf1 - Ke)^2} Vref = \frac{Kf1}{(Kf1 - Ke)^2} Vref > 0 \quad (286)$$

$$\frac{\partial Vofc}{\partial(\delta kf1)} = -\frac{Ke}{(Kf1 - Ke)^2} Vref < 0 \quad (287)$$

According to Expression (286) and Expression (287), Vofc monotonously decreases with respect to δkf1 and monotonously increases with respect to δke. Accordingly, a range of Vofc is represented by the following expression.

Formula 191

$$\frac{ke}{kf1 - ke + 1} Vref < Vofc < \frac{ke + 1}{kf1 - ke - 1} Vref \quad (28)$$

If a calibration value of Vofc is set to Vofcc represented by Expression (289), which is the median of a range of Expression (288), the calibration value of Vofc can be derived at accuracy lower than ΔVofc represented by Expression (290).

Formula 192

$$Vofcc = \frac{ke + 1}{1(kf1 - ke - 1)} Vref + \frac{ke}{2(kf1 - ke + 1)} Vref \quad (289)$$

$$\Delta Vofc = \frac{ke + 1}{1(kf1 - ke - 1)} Vref - \frac{ke}{2(kf1 - ke + 1)} Vref \quad (290)$$

Expression (285) is partially differentiated about δke, δkf1, and δkf2 to obtain the following expressions.

Formula 193

$$\frac{\partial VGj}{\partial(\delta ke)} = -\frac{\partial Vofop}{\partial(\delta ke)} < 0 \quad (291)$$

$$\frac{\partial VGj}{\partial(\delta kf1)} = -\frac{\partial Vofop}{\partial(\delta kf1)} > 0 \quad (292)$$

$$\frac{\partial VGj}{\partial(\delta kf2)} = -\frac{Vref - Vofop}{Kf2^2} < 0 \quad (293)$$

According to Expression (291), Expression (292), and Expression (293), VGj monotonously decreases with respect to δke and δkf2 and monotonously increases with respect to δkf1. Expression (284) is substituted in Expression (285) to obtain the following expression. A range of VGj is represented by Expression (294).

Formula 194

$$VGj = \frac{Vref - Vofc}{Kf2} = \frac{Vref}{Kf2}\left(1 - \frac{Ke}{Kf1 - Ke}\right) = \frac{Kf1 - 2Ke}{Kf2(Kf1 - Ke)} Vref \quad (294)$$

$$\frac{kf1 - 2ke - 2}{(kf2 + 1)(kf1 - ke - 1)} Vref < VGj < \frac{kf1 - 2ke + 1}{kf2(kf1 - ke + 1)} Vref$$

If a calibration value of VGj is set to VGjc represented by Expression (295), which is the median of a range of Expression (228), the calibration value of VGj can be derived at accuracy lower than ΔVGj represented by Expression (296).

Formula 195

$$VGjc = \frac{kf1 - 2ke + 1}{2kf2(kf1 - ke + 1)} Vref + \frac{kf1 - 2ke - 2}{2(kf2 + 1)(kf1 - ke - 1)} Vref \quad (295)$$

$$\Delta VGj = \frac{kf1 - 2ke + 1}{2kf2(kf1 - ke + 1)} Vref - \frac{kf1 - 2ke - 2}{2(kf2 + 1)(kf1 - ke - 1)} Vref \quad (296)$$

As explained above, even if the capacitance and the like forming the offset, the gain, and the integration unit voltage of the determiner 32 fluctuate because of a change with time, the calibration values of the offset Vofc and the integration unit voltage VGj of the determiner 32 can be derived at predetermined accuracy by the processing in the calibration state described above.

In the above explanation, Vofc>0. However, even when Vofc<0, calibration of VGj and Vofc is also possible.

When it is determined Vofc<0 in the offset polarity determination processing, the processing shifts to the offset measurement processing while the s11 and s13 of the first crossbar switch 31 are kept connected and s12 and s14 of the first crossbar switch 31 are kept connected.

In the offset measurement processing, connection of the switches other than the first crossbar switch 31 is the same as the connection in the case of Vofc>0. Therefore, explanation of the connection is omitted.

Parasitic capacitance is Cp1 in the state in which the s11 and s13 of the first crossbar switch 31 are connected and s12 and s14 of the first crossbar switch 31 are connected. The voltage Vo,k of Co at the time when the charge accumulation step and the comparison step are repeated k times is Expression (280).

In the offset measurement processing, since SW3 is set in the connected state first and thereafter set in the disconnected state, Vo,0=Vref. In the state in which the s11 and s13 of the first crossbar switch 31 are connected and s12 and s14 of the first crossbar switch 31 are connected, Vo,k is input to the positive input of the determiner 32. Vo,k+Vofop and the negative input Vref are equivalently compared. Vo,k increases and approaches Vref as the number of times of integration increases. When the number of times of integration in which the output of the determiner 32 changes from the low-output voltage of the first output to the high-output voltage is represented as ke+1, ke is defined as the number of times of offset integration. The following expression at the time when the positive and negative inputs of the determiner are equal holds.

Formula 196

$$Vref = (ke+\delta ke)VGj + Vref + Vofc \tag{297}$$

In Expression (297), $\delta ke$ is a real number equal to or larger than 0 and smaller than 1. $VGj\delta ke$ represents a difference between Vref and a voltage of Co at the time of the number of times of integration ke.

In the integration unit measurement processing in the case of Vofc<0, the charge accumulation step and the comparison step are repeatedly executed to measure the first number of times of integration in the state in which the s11 and s13 of the first crossbar switch 31 are connected and s12 and s14 of the first crossbar switch 31 are connected. Connection of SW3 is the same as the connection in the case of Vofc>0. Since the voltage of Co is input to the positive input of the determiner 32 and Vref is input to the negative input of the determiner 32, when the charges of Co are reset, the low-output voltage is output as the output of the determiner 32.

The operations of SW1 and SW2 are also the same as the operations in the case of Vofc>0. Therefore, detailed explanation of the operations is omitted. The voltage Vo,k of Co at the time when the charge accumulation step and the comparison step are repeated k times is Expression (280). When the number of times of integration in which the output of the determiner 32 changes from the low-output voltage of the first output to the high-output voltage is represented as kf1+1, kf1 is the first number of times of integration. The following equation holds about the first number of times of integration.

Formula 197

$$Vref = (kf1+\delta kf1)VGj + Vofc \tag{298}$$

In Expression (298), $\delta kf1$ is a real number equal to or larger than 0 and smaller than 1. $VGj\delta kf1$ represents a difference between Vref and an output of the determiner at the time of the number of times of integration kf1.

In order to simplify expression expansion, it is assumed that Ke=ke+δke, Kf1=kf1+δkf1, Kj1=kj1+δkj1, and Kj2=kj2+δkj2. A difference between Expression (298) and Expression (297) is calculated to obtain the following expression.

Formula 198

$$0 = (Kf1 - Ke)VGj - Vref \tag{299}$$
$$VGj = \frac{Vref}{Kf1 - Ke}$$

Expression (299) is substituted in Expression (298) to obtain the following expression.

Formula 199

$$0 = Ke\ VGj + Vofc \tag{300}$$
$$Vofc = \frac{-Ke}{Kf1 - Ke}Vref$$

Expression (300) is partially differentiated about δke and δkf1 to obtain the following expression.

Formula 200

$$\frac{\partial Vofc}{\partial (\delta ke)} = \tag{301}$$

$$\frac{-1}{Kf1 - KKe}Vref - \frac{Ke}{(Kf1 - Ke)^2}Vref = \frac{-Kf1}{(Kf1 - Ke)^2}Vref < 0$$

$$\frac{\partial Vofc}{\partial (\delta kf1)} = \frac{Ke}{(Kf1 - Ke)^2}Vref > 0 \tag{302}$$

According to Expression (301) and Expression (302), Vofc monotonously decreases with respect to δke and monotonously increases with respect to δkf1. Accordingly, a range of Vofc is represented by the following expression.

Formula 201

$$\frac{-ke-1}{kf1-ke-1}Vref < Vofc < \frac{-ke}{kf1-ke+1}Vref \tag{303}$$

If a calibration value of Vofc is set to Vofcc represented by Expression (304), which is the median of a range of Expression (303), the calibration value of Vofop can be derived at accuracy lower than ΔVofop represented by Expression (305).

Formula 202

$$Vofcc = \frac{-ke}{2(kf1-ke+1)}Vref + \frac{-ke-1}{2(kf1-ke-1)}Vref \tag{304}$$

$$\Delta Vofc = \frac{-ke}{2(kf1-ke+1)}Vref - \frac{-ke-1}{2(kf1-ke-1)}Vref \tag{305}$$

Expression (299) is partially differentiated about δke and δkf1 to obtain the following expression.

Formula 203

$$\frac{\partial VGj}{\partial (\delta ke)} = \frac{Vref}{(Kf1-Ke)^2} > 0 \tag{306}$$

$$\frac{\partial VGj}{\partial (\delta kf1)} = -\frac{Vref}{(Kf1-Ke)^2} < 0 \tag{307}$$

According to Expression (306) and Expression (307), VGj monotonously decreases with respect to δkf1 and monotonously increases with respect to δke. Accordingly, a range of VGj is represented by Expression (308).

Formula 204

$$\frac{Vref}{kf1-ke+1} < VGj < \frac{Vref}{kf1-ke-1} \quad (308)$$

If a calibration value of VGj is set to VGjc represented by Expression (309), which is the median of a range of Expression (308), the calibration value of VGj can be derived at accuracy lower than ΔVGj represented by Expression (310).

Formula 205

$$VGjc = \frac{Vref}{2(kf1-ke-1)} + \frac{Vref}{2(kf1-ke+1)} \quad (309)$$

$$\Delta VGj = \frac{Vref}{2(kf1-ke-1)} - \frac{Vref}{2(kf1-ke+1)} \quad (310)$$

Consequently, in the case of Vofc<0 as well, even if the capacitance and the like forming the offset, the gain, and the integration unit voltage of the determiner 32 fluctuate because of a change with time, the calibration values of the offset Vofc and the integration unit voltage VGr of the determiner 32 can be derived at predetermined accuracy by the processing in the calibration state described above.

When the sensor circuit is calibrated, a variable reference voltage source 500 according to this embodiment is set in an output state. A voltage set by setting data including the number of times of integration k is output. In the output state, after the setting data is acquired by the control unit 110, the charges accumulated in Co are initialized by closing SW2. Subsequently, SW2 is opened and the accumulation step and the comparison step are repeatedly executed by the number of times of integration of k. When the accumulation step and the comparison step for the number of times of integration are completed, the control unit 110 outputs calibration data representing the completion.

A voltage output from the variable reference voltage source 500 at this time can be treated as a known voltage because the voltage can be derived from Expression (214) using the calibration values of VGj and Vofc derived in the calibration state. Therefore, the known voltage output from the variable reference voltage source 500 is input to the amplifier and the AD converter of the sensor circuit. It is possible to calibrate an offset and a gain of the amplifier and an offset of the AD converter from a correlation with the output.

A measuring instrument serving as a reference for calibration is unnecessary on the outside of a sensor node even after sensor circuit setting. Calibration values of the offset and the integration unit voltage can be calculated at predetermined accuracy according to a calibration state of the variable reference voltage source 500 according to this embodiment. Therefore, it is possible to perform calibration of the sensor circuit even if the offset and the integration unit voltage change because of a change with time.

With the variable reference voltage sources 100 to 500 according to the embodiments explained above, it is possible to provide a variable reference voltage source for which a measuring instrument for calibration is unnecessary.

The variable reference voltage sources 100 to 500 according to the embodiments do not require a measuring instrument for calibration and can calibrate themselves with remote operation. Therefore, the variable reference voltage sources 100 to 500 of the present invention are suitably used in combination of a large number of sensor circuits present in remote locations.

That is, even if an operator does not visit sites where the large number of sensor circuits are disposed, it is possible to calibrate a variable reference voltage used by the respective sensors with remote operation.

Note that the present invention is not limited to the embodiments explained above and can be modified within the scope of the gist described in the scope of claims.

REFERENCE SIGNS LIST

10 reference voltage unit
20, 40, 60, 80, 110 control unit
21, 41, 61, 81, 111 calibration control unit
22, 62 output control unit
30, 50, 70, 90, 120 integrated-voltage generating unit
31 first crossbar switch
32 determiner
33 second crossbar switch
34, 54, 74 integrating unit
93 third crossbar switch
340, 92 operational amplifier

The invention claimed is:

1. A variable reference voltage source that generates a variable reference voltage corresponding to setting data set from outside, the variable reference voltage source comprising:
a control unit including a calibration control unit that controls operation for calibrating an offset and a predetermined unit voltage inside the variable reference voltage source and an output control unit that controls operation for outputting the variable reference voltage;
a reference voltage unit that outputs a reference voltage; and
an integrated-voltage generating unit that repeats, when the calibration control unit controls the operation, an integrating operation until an integrated voltage obtained by integrating the predetermined unit voltage becomes equal to the reference voltage and outputs, when the output control unit controls the operation, the variable reference voltage corresponding to the setting data,
wherein the integrated-voltage generating unit includes:
a fourth switch that changes magnitude of the unit voltage to a same voltage as the reference voltage or intermediate potential smaller than the reference voltage;
a second crossbar switch that determines polarity of the unit voltage;
an integrating unit that generate an integrated voltage obtained by integrating the unit voltage;
a determiner that determines which of the reference voltage and the integrated voltage is larger; and
a first crossbar switch that switches connection between when the reference voltage is input to one input of the determiner and the integrated voltage is input to another input of the determiner and when the integrated voltage is input to the one input of the determiner and the reference voltage is input to the other input of the determiner.

2. The variable reference voltage source according to claim 1, wherein the integrating unit includes:
an operational amplifier;
a first capacitor charged by the unit voltage;
a second capacitor that holds an integrated voltage obtained by integrating the unit voltage;

a first switch that switches a voltage of a positive input of the operational amplifier;

a second switch that, when one terminal of the first capacitor is connected to a negative input of the operational amplifier, connects another terminal of the first capacitor to ground potential; and a third switch that short-circuits both ends of the second capacitor.

3. The variable reference voltage source according to claim 2, wherein the calibration control unit includes:

an offset-polarity-determination processing unit that determines polarity of an offset voltage of the determiner;

an offset-measurement processing unit that calculates a number of times of integration of a unit voltage equivalent to a sum of offset voltages of the operational amplifier and the determiner;

an intermediate-potential-measurement processing unit that, when a bias voltage of the integrating unit is set to intermediate potential smaller than a reference voltage of the reference voltage unit, calculates a number of times of integration of the unit voltage until an output of the determiner is inverted; and an integration-unit-measurement processing unit that generates an offset integrated voltage obtained by causing the integrating unit to integrate a unit voltage including an offset voltage of the operational amplifier, causes the determiner to perform comparison of the offset integrated voltage and the reference voltage and acquires a number of times of integration.

4. A variable reference voltage source that generates a variable reference voltage corresponding to setting data set from outside, the variable reference voltage source comprising:

a control unit including a calibration control unit that controls operation for calibrating an offset and a predetermined unit voltage inside the variable reference voltage source and an output control unit that controls operation for outputting the variable reference voltage;

a reference voltage unit that outputs a reference voltage; and an integrated-voltage generating unit that repeats, when the calibration control unit controls the operation, an integrating operation until an integrated voltage obtained by integrating the predetermined unit voltage becomes equal to the reference voltage and outputs, when the output control unit controls the operation, the variable reference voltage corresponding to the setting data, wherein the integrated-voltage generating unit includes:

an integrating unit that generates an integrated voltage obtained by integrating the unit voltage;

a determiner that determines which of the reference voltage and the integrated voltage is larger; and a first crossbar switch that switches connection between when the reference voltage is input to one input of the determiner and the integrated voltage is input to another input of the determiner and when the integrated voltage is input to the one input of the determiner and the reference voltage is input to the other input of the determiner, the integrating unit includes:

an operational amplifier including positive and negative two kinds of inputs;

a first capacitor charged by the unit voltage;

a second capacitor that holds an integrated voltage obtained by integrating the unit voltage;

a fifth switch that connects the reference voltage and the first capacitor when the first capacitor is charged and connects the first capacitor and a positive input of the operational amplifier when the second capacitor is charged;

a fourth switch that causes the operational amplifier to operate as a unity gain buffer when one terminal of the first capacitor is connected to a negative input of the operational amplifier; and a third switch that short-circuits both ends of the second capacitor, and the calibration control unit includes:

an offset-cancel-integration-unit-measurement processing unit that generates an integrated voltage obtained by causing the integrating unit to integrate the unit voltage from which an offset voltage of the operational amplifier is removed, performs comparison of the integration voltage and the reference voltage by switching connection of the first crossbar switch, and acquires a first number of times of offset cancel integration and a second number of times of offset cancel integration; and an integration-unit-measurement processing unit that generates an offset integrated voltage obtained by causing the integrating unit to integrate the unit voltage including the offset voltage of the operational amplifier and causes the determiner to perform comparison of the offset integrated voltage and the reference voltage and acquires a number of times of integration.

5. The variable reference voltage source according to claim 4, wherein the integrated-voltage generating unit further includes:

a voltage generating unit that generates two kinds of intermediate potentials obtained by dividing the reference voltage; and a determination-voltage switching unit that, when the calibration control unit controls the operation, switches a voltage serving as a reference applied to the determiner via the first crossbar switch to the intermediate potential on a high-potential side or the reference voltage, the integrating unit further includes:

a sixth switch that connects one of the reference voltage or the intermediate potential on the high-potential side and a terminal of the first capacitor when the first capacitor is charged and connects another of the reference voltage or the intermediate potential on the high-potential side and the terminal of the first capacitor when the second capacitor is charged; and the output control unit includes:

a positive-offset-cancel-integration processing unit that, when a voltage higher than the intermediate potential on a low-potential side is output based on the setting data, executes processing for connecting the reference voltage and the terminal of the first capacitor when the first capacitor is charged and connecting the intermediate potential on the high-potential side and the terminal of the first capacitor when the second capacitor is charged; and a negative-offset-cancel-integration processing unit that, when a voltage lower than the intermediate potential on the low-potential side is output based on the setting data, executes processing for connecting the intermediate potential on the high-potential side and the terminal of the first capacitor when the first capacitor is charged and connecting the reference voltage and the terminal of the first capacitor when the second capacitor is charged.

6. A variable reference voltage source that generates a variable reference voltage corresponding to setting data set from outside, the variable reference voltage source comprising:
  a control unit including a calibration control unit that controls operation for calibrating an offset and a predetermined unit voltage inside the variable reference voltage source and an output control unit that controls operation for outputting the variable reference voltage;
  a reference voltage unit that outputs a reference voltage; and
  an integrated-voltage generating unit that repeats, when the calibration control unit controls the operation, an integrating operation until an integrated voltage obtained by integrating the predetermined unit voltage becomes equal to the reference voltage and outputs, when the output control unit controls the operation, the variable reference voltage corresponding to the setting data, wherein the integrated-voltage generating unit includes:
  an integrating unit that generates an integrated voltage obtained by integrating the unit voltage;
  a determiner that determines which of the reference voltage and the integrated voltage is larger; and
  a first crossbar switch that switches connection between when the reference voltage is input to one input of the determiner and the integrated voltage is input to another input of the determiner and when the integrated voltage is input to the one input of the determiner and the reference voltage is input to the other input of the determiner, and
the integrating unit includes:
  a current source;
  a sixth switch that connects both ends of a unit capacitor;
  a fifth switch that repeatedly connects the current source and the unit capacitor; and
  a seventh switch that connects the reference voltage to one terminal of the unit capacitor connected to the fifth switch.

* * * * *